(12) United States Patent
Matsumoto et al.

(10) Patent No.: US 6,721,223 B2
(45) Date of Patent: Apr. 13, 2004

(54) SEMICONDUCTOR MEMORY DEVICE

(75) Inventors: Junko Matsumoto, Hyogo (JP); Tadaaki Yamauchi, Hyogo (JP); Takeo Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/145,191

(22) Filed: May 15, 2002

(65) Prior Publication Data

US 2002/0191467 A1 Dec. 19, 2002

(30) Foreign Application Priority Data

Jun. 15, 2001 (JP) ........................................ 2001-181147

(51) Int. Cl.$^7$ ................................................ G11C 8/00
(52) U.S. Cl. ........................................ 365/222; 365/236
(58) Field of Search ................................ 365/222, 236, 365/230.03

(56) References Cited

U.S. PATENT DOCUMENTS 6,215,714 B1 * 4/2001 Takemae et al. ............ 365/222

FOREIGN PATENT DOCUMENTS

| JP | 61-212116 | 9/1986 |
|---|---|---|
| JP | 5-167425 | 7/1993 |
| JP | 6-104725 | 4/1994 |
| JP | 8-340020 | 12/1996 |
| JP | 10-255468 | 9/1998 |
| JP | 11-213665 | 8/1999 |

* cited by examiner

Primary Examiner—Michael Tran
(74) Attorney, Agent, or Firm—McDermott, Will & Emery

(57) ABSTRACT

Data specifying details of refresh to be executed in the self-refresh mode is stored in a register circuit in a mode register. A refresh period and refresh region are determined according to data stored in register circuit and a refresh control circuit generates a control signal and a refresh address that are required for refresh. Stored data can be stably held in the self-refresh mode in which data holding is performed with reduced current consumption.

19 Claims, 27 Drawing Sheets

FIG. 2
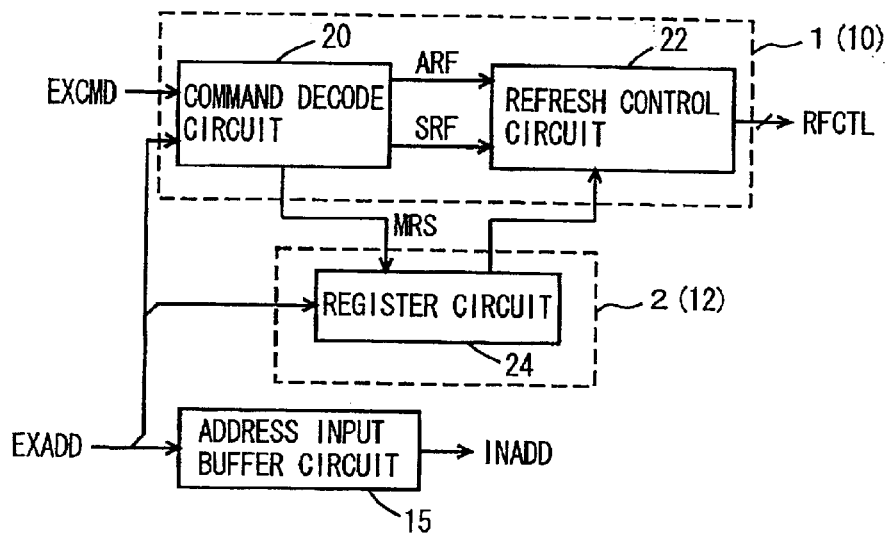
FIG. 3
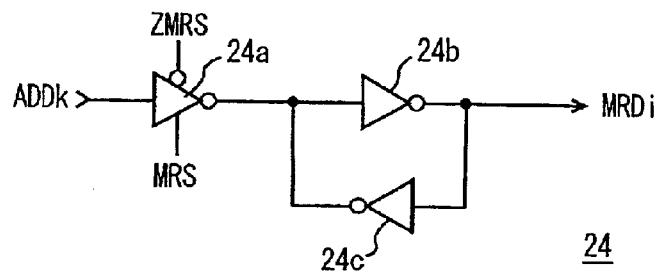
FIG. 4
| ADD | | | SET MODE |
|---|---|---|---|
| i | j | k | |
| 0 | 0 | 0 | 4 BANK SELF-REFRESH |
| 0 | 0 | 1 | 2 BANK SELF-REFRESH |
| 0 | 1 | 0 | 1 BANK SELF-REFRESH |
| 0 | 1 | 1 | MSB SELF-REFRESH |
| 1 | 0 | 0 | 2 MSB SELF-REFRESH |
| 1 | 0 | 1 | RESERVED |
| 1 | 1 | 0 | RESEREVED |
| 1 | 1 | 1 | DEEP POWER DOWN |

FIG. 9
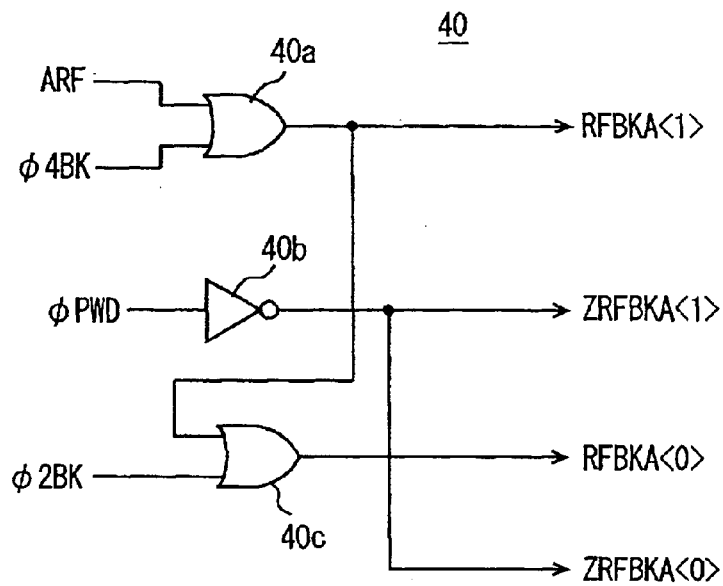
FIG. 10
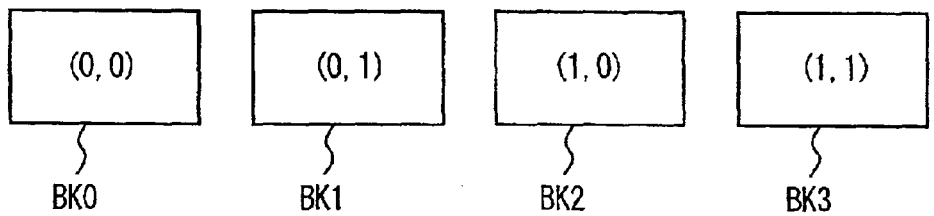
FIG. 11
| SET MODE | RFBKA<1> | ZRFBKA<1> | RFBKA<0> | ZRFBKA<0> |
|---|---|---|---|---|
| ARF, φ4BK | H | H | H | H |
| φ2BK | L | H | H | H |
| φ1BK, φ1MB φ2MB | L | H | L | H |
| φPWD | L | L | L | L |

(FROM WORD LINE ADDRESS GENERATION CIRCUIT 42)

FIG. 22
|  |  | 4 BANK | 2 BANK | 1 BANK | 1MSB | 2MSB |
|---|---|---|---|---|---|---|
| 4K REFRESH | 85°C | 1/2 | 1/2 | 1/2 | 1 | 2 |
|  | 70°C | 1 | 1 | 1 | 2 | 4 |
|  | 45°C | 2 | 2 | 2 | 4 | - |
|  | 15°C | 4 | 4 | 4 | - | - |
| 8K REFRESH | 85°C | - | 1/2 | 1/2 | 1 | 2 |
|  | 70°C | 1/2 | 1 | 1 | 2 | 4 |
|  | 45°C | 1 | 2 | 2 | 4 | - |
|  | 15°C | 2 | 4 | 4 | - | - |
FIG. 23
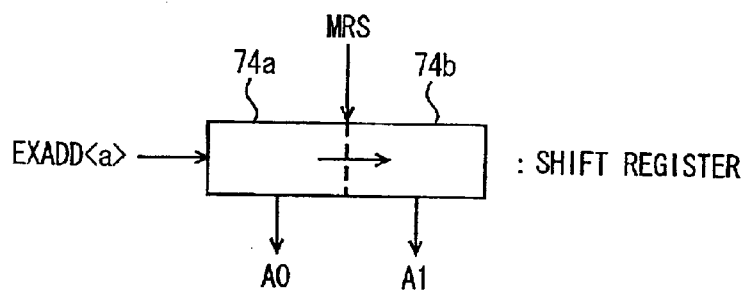
FIG. 24
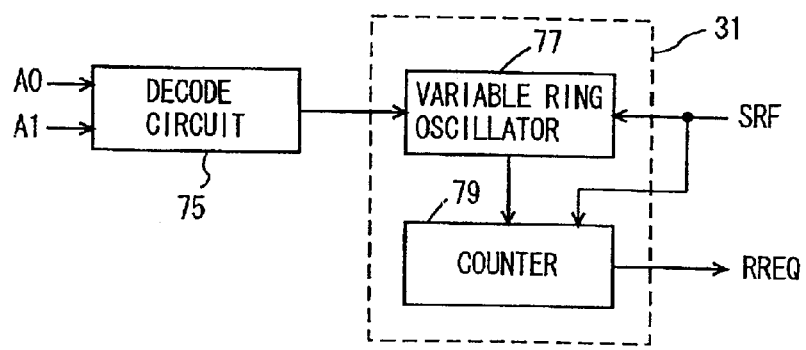

FIG. 27
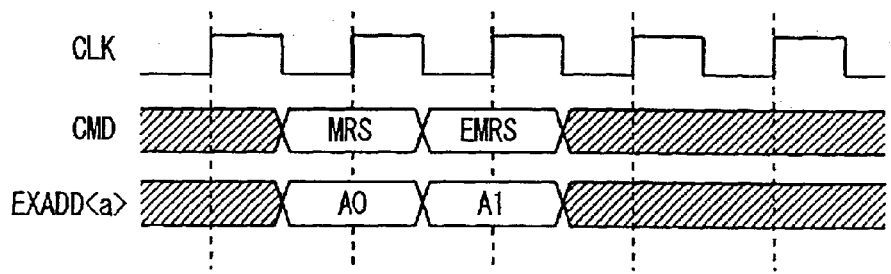
FIG. 28
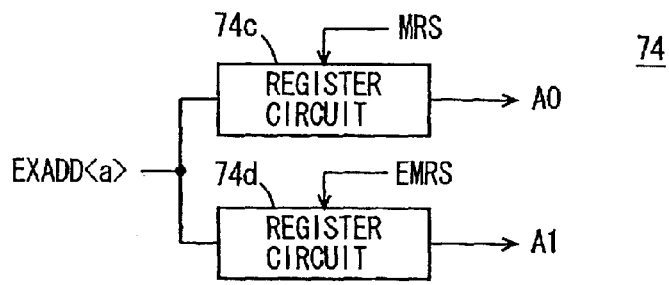
FIG. 29
| A | |
|---|---|
| 0 | 1/2 TIMES |
| 1 | TWICE |
FIG. 30
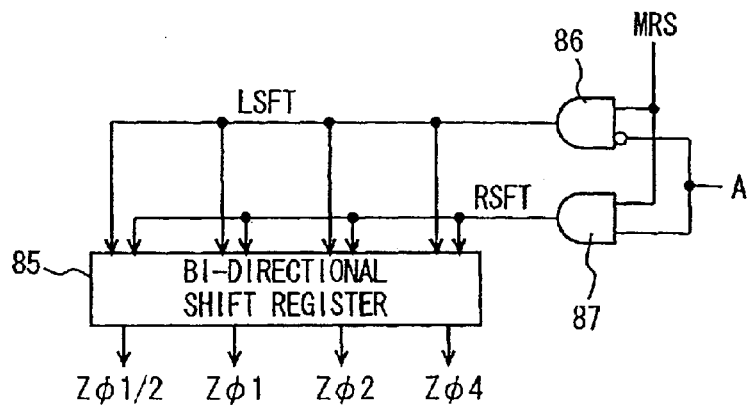

(SEE FIGS. 25 AND 26)

(4K REFRESH DEFAULT)

SEMICONDUCTOR MEMORY DEVICE

BACKGROUND OF THE INVENTION

1. Field of the Invention

The present invention relates to a semiconductor memory device, and particularly, to a semiconductor memory device requiring refresh of storage data. More particularly, the present invention relates to a configuration for reducing a current consumption in a low power consumption mode such as a sleep mode.

2. Description of the Background Art

As one of semiconductor memory devices, there is a DRAM (dynamic random access memory). In DRAM, a memory cell is usually constituted of one capacitor and one MIS transistor (an insulated gate field effect transistor). This memory cell is smaller in occupancy area of a memory cell and lower in cost per bit, as compared with a memory cell of an SRAM (static random access memory) in which a memory cell of one bit is constituted of 4 transistors and two load elements. For the reasons, DRAMs have been widely used as memory devices with a large storage capacity.

DRAM stores data in a capacitor in the form of an electric charge, and therefore, there is a possibility that stored data is lost by a leakage current and others. Therefore, refreshing operations of restoring the storage data regularly is needed.

An operating mode of performing refresh usually includes an auto-refresh mode and a self-refresh mode. In the auto-refresh mode employed in a normal operation mode, that is, in an operating mode in which data access is made to DRAM, and the external access is ceased for externally applying a refresh instruction (an auto-refresh command). Inside DRAM, a refresh address and a refresh control signal are generated according to the auto-refresh command for executing refresh of stored data.

The self-refresh mode is set by a self-refresh instruction (a self-refresh command) applied externally in a low power consumption mode such as a sleep mode, in which no access to DRAM continues for a long period of time. In the self-refresh mode, DRAM generates a refresh timing and a refresh address internally to execute refresh of memory cell data at prescribed intervals. The self-refresh mode is set in the low power consumption mode and a current consumption in the self-refresh mode is required to be as low as possible.

In a conventional DRAM, in the self-refresh mode, refresh is also performed in the same control manner as in the refresh executed in the auto-refresh mode. For example, in a 4 bank configuration, the 4 banks are refreshed in any of the auto-refresh mode and the self-refresh mode, and the number of rows of memory cells refreshed is set to two in any bank in both refresh modes.

The auto-refresh mode is a refresh mode to be executed in the normal operation mode in which data processing is performed and a low current consumption is not so required, dissimilarly to the low power consumption mode such as the sleep mode. On the other hand, in the low power consumption mode, the current consumption is required to be as low as possible. Therefore, in a conventional configuration, a problem arose that in the low power consumption mode, a required condition for a current consumption cannot be met. Especially, in applications for battery-powered portable equipment and such, only data holding is required in such a low power consumption mode and the current consumption is further required to be as low as possible from the view point of a longer battery lifetime. Accordingly, in the conventional refresh scheme, there arose a problem that such a requirement for a low current consumption could not be met.

Furthermore, a refresh cycle (the number of times of refresh performed for refreshing all memory cells once) is, for example, a 4 K refresh cycle, an 8 K refresh cycle or the like, and the refresh cycle is fixedly set by a bonding option of setting a specific pad at a prescribed voltage level with a bonding wire. Therefore, if an operating environment changes, or a data holding characteristic of a memory cell is deteriorated due to rise in operating temperature or other reasons, a possibility arises that storage data could not be stably held within a set refresh cycle.

SUMMARY OF THE INVENTION

It is an object of the present invention to provide a semiconductor memory device capable of reducing a current consumption in a low power consumption mode.

It is another object of the present invention to provide a semiconductor memory device capable of reducing a current consumption in execution of self-refresh in a self-refresh mode It is still another object of the present invention to provide a semiconductor memory device capable of reducing a current consumption in refresh without deteriorating a data holding characteristic.

It is a further object of the present invention to provide a semiconductor memory device capable of changing a refresh execution fashion with ease according to an operation environment.

A semiconductor memory device according to a first aspect of the present invention includes: a memory array having a plurality of memory cells; a refresh circuit for refreshing storage data of a memory cell in the memory array; and a register circuit for storing data setting at least one of a refresh cycle and a refresh region of the memory array. The register circuit stores externally applied refresh specifying data in response to an externally applied register set instruction signal.

The semiconductor memory device according to the first aspect of the present invention further includes: a refresh execution control circuit for generating a refresh address specifying a memory cell to be refreshed in the memory array for applying the generated refresh address to the refresh circuit and to activate the refresh circuit according to data stored in the register circuit.

The refresh specifying data preferably includes data specifying a region of a refresh target in the memory array.

A semiconductor memory device according to a second aspect of the present invention includes: a plurality of banks each having a plurality of memory cells arranged in rows and columns, and each driven to a selected state independently from the other (s); and a refresh address generation circuit for generating a refresh address for refreshing memory cells in the plurality of banks in a refresh operation. The refresh address generation circuit includes a circuit for generating a refresh bank address specifying a bank in the plurality of banks. The refresh bank address specifies some of the plurality of banks in a low power consumption mode, while specifying all of the plurality of banks in a mode different from the low power consumption mode.

The semiconductor memory device according to the second aspect of the present invention further includes: a refresh execution control circuit for executing refresh of a memory cell in a bank specified by the refresh address from the refresh address generation circuit in the refresh operation.

By setting contents of a refresh operation executed in the low power consumption mode according to stored data in the mode register, a current consumed in refreshing in the low power consumption mode can be reduced, as compared with that in a refresh operation executed in the normal operation mode. Furthermore, by setting contents of a refresh operation using the mode register, the contents of a refresh operation can be set according to an application to enable a changing/setting of the contents of execution of refresh adaptably to an operation environment flexibly.

Furthermore, in a multi-bank configuration, by reducing the number of banks simultaneously activated in refresh, further reduction can be ensured in current consumption for refresh executed in the low power consumption mode in which data holding is performed, as compared with refresh executed in the normal operation mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram schematically showing a configuration of a central control circuit and a mode register shown in FIGS. 1A and 1B;

FIG. 3 is a diagram showing an example of a configuration of the register shown in FIG. 2;

FIG. 4 is a table representing a correspondence between self-refresh modes and refresh mode set data in a first embodiment of the present invention;

FIG. 9 is a block diagram schematically showing a configuration of a bank address generation circuit shown in FIG. 8;

FIG. 10 is a diagram showing an example of an assignment of a bank address;

FIG. 11 is a truth table representing operations of the bank address generation circuit shown in FIG. 9;

FIG. 22 is a table representing a correspondence between temperature and a refresh cycle according to refresh set data;

FIG. 23 is a diagram showing an example of a configuration of a register circuit in the third embodiment of the present invention;

FIG. 24 is a block diagram schematically showing a configuration of a refresh timer in the third embodiment of the present invention;

FIG. 27 is a timing chart showing a sequence of setting refresh cycle specifying data in a first modification of the third embodiment of the present invention;

FIG. 28 is a diagram schematically showing a configuration of a register circuit in the first modification of the third embodiment of the present invention;

FIG. 29 is a table showing specifying contents of refresh cycle specifying data of a second modification of the third embodiment of the present invention;

FIG. 30 is a diagram schematically showing a configuration of a register circuit in the second modification of the third embodiment of the present invention;

DESCRIPTION OF THE PREFERRED EMBODIMENTS

[First Embodiment]

Figure 1A:
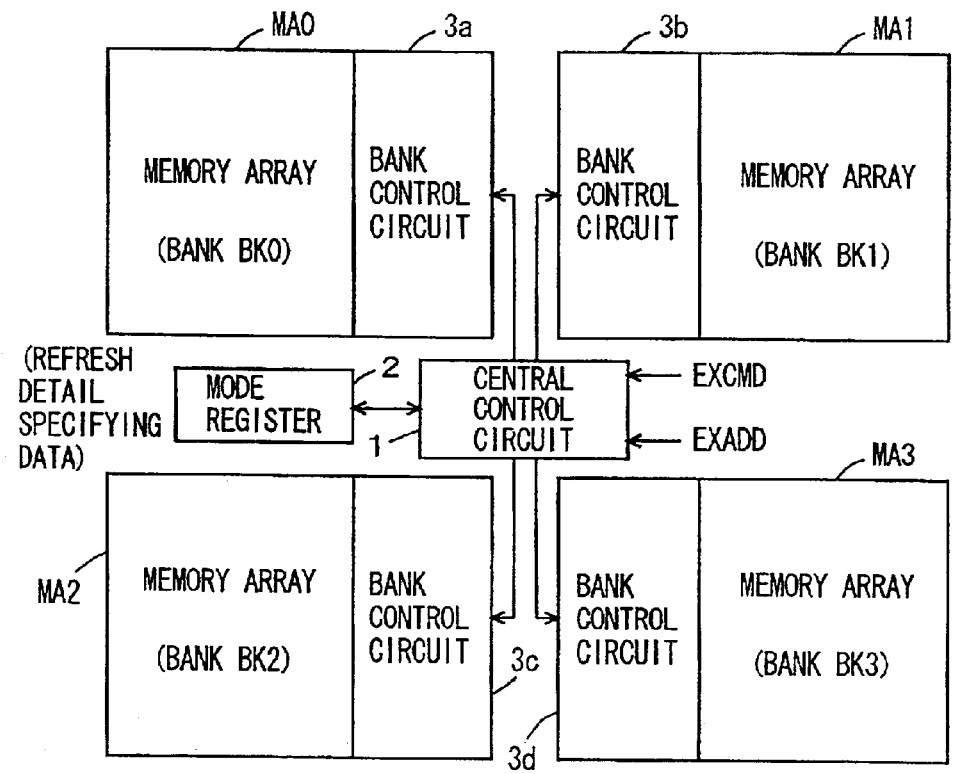
FIGS. 1A and 1B are diagrams each schematically showing an entire configuration of a semiconductor memory device according to the present invention.

FIG. 1A is a diagram schematically showing an example of an entire configuration of a semiconductor memory device according to a first embodiment of the present invention. In FIG. 1A, memory arrays MA0 to MA3 constituting respective banks BK0 to BK3 are arranged dispersedly on a chip. Bank control circuits 3a to 3d for performing row selection, column selection and others are provided corresponding to respective memory arrays MA0 to MA3. For bank control circuits 3a to 3d, there is provided, in the central region among bank control circuits 3a to 3d, a central control circuit 1 for generating internal address signals and internal control signals according to an external command EXCMD and an external address signal EXADD.

The central control circuit 1 activates a bank control circuit provided for a bank specified according to a bank address signal specifying the bank included in external address signal EXADD. Therefore, in the configuration shown in FIG. 1A, central control circuit 1 disposed in the central region transmits bank control signals and internal address signals to bank control circuits 3a to 3d.

A mode register 2 is provided adjacent to central control circuit 1. Mode register 2 stores a specific bit of external address signal EXADD as operation content specifying data when external command EXCMD is a mode register set command, under control of central control circuit 1.

In memory arrays MA0 to MA3, memory cells are arranged in rows and columns and the memory cells are DRAM cells, stored data of which are required to be refreshed periodically. Mode register 2 stores a refresh construction specifying data specifying refresh details such as a refresh region to be refreshed and an execution period of refresh in a refresh mode.

By storing a refresh construction specifying data in mode register 2, contents of refresh executed internally in a self-refresh mode can be made different from contents of auto-refresh in a normal operation mode, thereby enabling further reduction in current consumption in the self-refresh mode requiring low power consumption. A circuit performing control of refresh is provided in central control circuit 1, as detailed later.

Figure 1B:
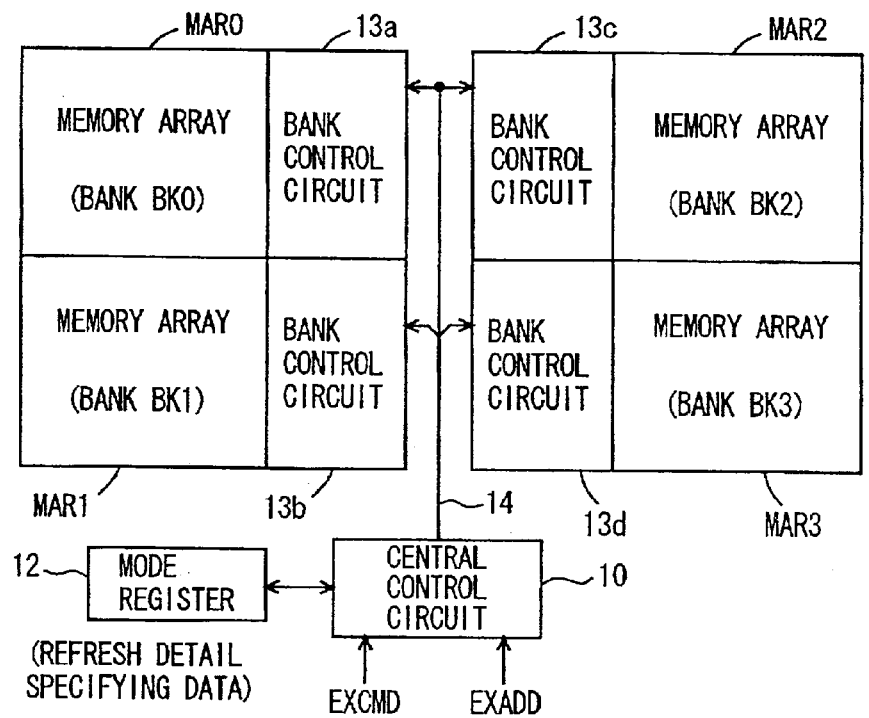

FIG. 1B is a diagram schematically showing another configuration of a semiconductor memory device according to the first embodiment of the present invention. In FIG. 1B, memory arrays MAR0 and MAR1 are disposed in the same memory mat and memory arrays MAR2 and MAR3 are disposed in the same memory mat. Memory arrays MAR0 to MAR3 constitute respective banks BK0 to BK3. Bank control circuits 13a to 13d are provided corresponding to the respective memory arrays MAR0 to MAR3.

A central control circuit 10 is provided, at one side of the memory mats, commonly to bank control circuits 13a to 13d. Central control circuit 10 transmits internal control signals and internal address signals to bank control circuits 13a to 13d through internal bus 14 according to an external command EXCMD and an external address signal EXADD. A configuration of central control circuit 10 is the same as the configuration of central control circuit 1 disposed in the central portion as shown in FIG. 1A. Alternatively, central control circuit 10 may be configured so as to transmit only bank activation signals individually to respective bank control circuits 13a to 13d and the other internal control signals and internal address signals are transmitted commonly to bank control circuits 13a to 13d.

A mode register 12 is provided corresponding to central control circuit 10. Mode register 12 stores refresh construction specifying data, and sets contents of refresh to be executed in the self-refresh mode similarly to mode register 2 shown in FIG. 1. A refresh control circuit included in central control circuit 10 sets the contents (a cycle, a period, a region and others) of refresh to be executed in the self-refresh mode according to a refresh construction specifying data stored in mode register 12.

Therefore, access control and refresh control can be performed with each bank being a unit, in the configuration where central control circuit 10 is disposed at one side of a memory mats of the memory arrays as well, as shown in FIG. 1B, dissimilar to the configuration having central control circuit 10 disposed in the central region among the memory arrays. In the following description, a semiconductor memory device according to the present invention can employ any of the memory array arrangements as described above.

FIG. 2 is a block diagram schematically showing a configuration of a portion related to the mode register included in central control circuits 1 and 10 shown in FIGS. 1A and 1B. In FIG. 2, central control circuit 1 (10) includes: a command decode circuit 20 receiving prescribed bits of external command EXCMD and external address signal EXADD to generate an operating mode instructing signal activating a specified operating mode; and a refresh control circuit 22 generating a group of various control signals RFCTL and a refresh address necessary for a refresh operation according to an auto-refresh mode instructing signal ARF and a self-refresh mode instructing signal SRF received from command decode circuit 20.

Auto-refresh mode instructing ARF is applied from an external memory controller when refresh is performed in the normal access mode. Self-refresh mode instructing signal SRF is activated by a self-refresh command applied from an external controller when the system is set in a state where processing is continuously stopped over a long period of time, such as in a sleep mode. Command decode circuit 20 activates a mode register set mode instructing signal MRS when a mode register set command to store specific data into mode register 2 (12) is received.

Refresh control circuit 22, whose configuration will be detailed later, includes: a refresh timer determining a refresh interval; a refresh address counter generating a refresh address; and a circuit generating a refresh row activation signal determining a refresh activation period (a refresh cycle).

Mode register 2 (12) includes a register circuit 24 storing a prescribed bit of external address signal EXADD when mode register set mode instructing signal MRS from command decoder 20 is active. Operation details of refresh control circuit 22 are determined according to data stored in register circuit 24. That is, a refresh address region in which a refresh address can be changed, a refresh period and the execution/non-execution of refresh (deep power down mode) and others are set in accordance with the data stored in the mode register.

External address signal EXADD is applied to an address input buffer circuit 15 and address input buffer circuit 15 applies an internal address signal INADD according to external address signal EXADD. External address signal EXADD includes a bank address signal specifying a bank.

FIG. 3 is a diagram showing an example of a configuration of register 24 shown in FIG. 2. In FIG. 3, a configuration is shown for an external address signal ADDk of 1 bit. In FIG. 3, register circuit 24 includes: a tristate inverter buffer 24a enabled, when mode register set mode instructing signal MRS and complementary mode register set mode instructing signal ZMRS are activated, to transmit external address signal bit ADDk; an inverter 24b inverting a signal received through tristate inverter buffer 24a to generate a mode data bit MRDi; and an inverter 24c inverting mode data bit MRDi from inverter 24b for transmission to the input of tristate inverter buffer 24a.

Tristate inverter buffer 24a enters a high output impedance state while mode register set mode instructing signals MRS and ZMRS are inactive and register circuit 24 latches mode data bit MRDi with inverters 24a and 24c. On the other hand, when mode register set mode instructing signals MRS and ZMRS are activated, tristate inverter buffer 24a turns conductive to set mode data bit MRDi according to external address signal bit ADDk.

It should be noted that, in the configuration of register circuit 24 shown in FIG. 3, inverter 24c may be constituted of a tristate inverter buffer activated complementarily to tristate inverter buffer 24a. Furthermore, there may be provided a reset transistor for an initial setting of mode data bit MRDi to a prescribed logic level.

FIG. 4 is a table representing a correspondence between a mode data bit stored in mode register 2 (12) and refresh that is specified. The mode data of 3 bits (address signal bits ADDi, ADDj and ADDk) is used as refresh construction specifying data.

Figure 5A:
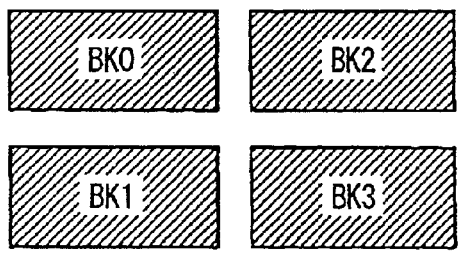
FIGS. 5A to 5D are diagrams schematically showing a refresh region when the region is specified on a bank basis in a self-refresh mode shown in FIG. 4.

When address signal bits ADDi, ADDj and ADDk are all set to "0", a 4 self-refresh mode is set. When the 4 self-refresh mode is set, refresh is simultaneously executed in each of banks BK0 to BK3 as shown in FIG. 5A. The 4 self-refresh mode is the same as a refresh mode executed in the auto-refresh and therefore, is set as a normal mode.

Figure 5B:
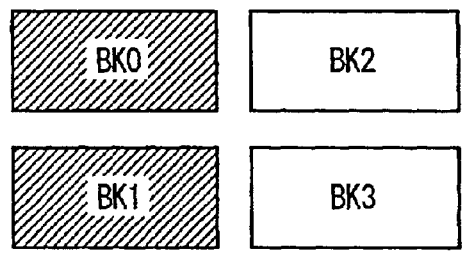

When address signal bits ADDi, ADDj and ADDk are set to (0, 0, 1), a 2 bank self-refresh mode is set. In the 2 bank self-refresh mode, as shown in FIG. 5B, refresh is executed on banks BK0 and BK1. No refresh is executed on any of banks BK2 and BK3 and therefore, any data held in banks BK2 and BK3 is not guaranteed in the low power consumption mode.

By using only banks BK0 and BK1 as a data holding region and simultaneously executing refresh only on banks BK0 and BK1, the number of circuits to be operated can be reduced and therefore, a current consumption is reduced, as compared with a case where all of banks BK0 to BK3 are simultaneously refreshed as in the normal mode.

Figure 5C:
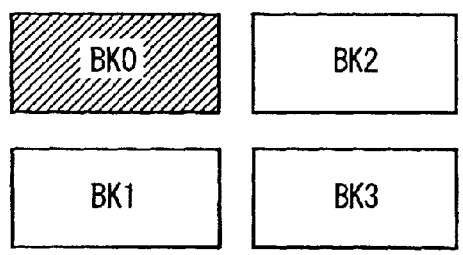

When address signal bits ADDi, ADDj and ADDk are set to (0, 1, 0), a 1 bank self-refresh mode is set. When the 1 bank self-refresh mode is set, as shown in FIG. 5C, refresh is executed only on bank BK0. No refresh is executed on the other banks BK1 to BK3 and therefore, any data held therein is not guaranteed in the self-refresh mode (in the low power consumption mode). By executing refresh only on bank BK0, the number of circuits to be operated in the refresh can be further reduced to decrease current consumption more.

Figure 5D:
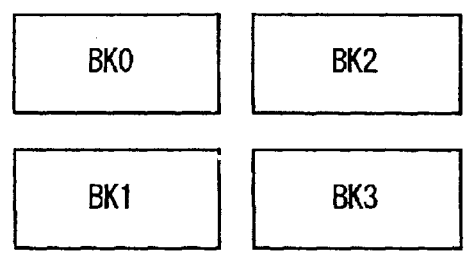

When address signal bits ADDi, ADDj and ADDk are all set to "1", the deep power down mode is set. In the deep power down mode, a power supply to internal circuits are ceased as shown in FIG. 5D and therefore, no refresh is executed on any of banks BK0 to BK3. That is, holding of stored data is not performed.

Figure 6A:
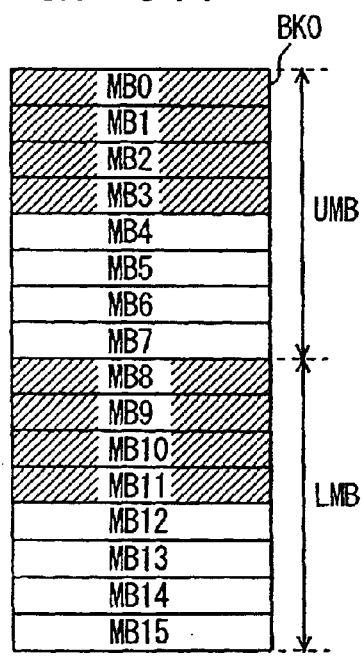
FIGS. 6A and 6B are diagrams schematically showing a refresh region when a refresh is executed on a block basis.

When address signal bits ADDi, ADDj and ADDk are set to (0, 1, 1), an MSB self-refresh mode is set. In the MSB self-refresh mode, as shown on FIG. 6A, refresh is executed only on a half of memory blocks in bank BK0. That is, as shown in FIG. 6A, banks Bk0 to BK3 each are divided into a plurality of memory clocks MB0 to MB15. Memory cells are arranged in rows and columns in each of memory blocks MB0 to MB15.

In a normal access mode, a row select operation is performed on an addressed memory block, with non-selected memory blocks other than the addressed memory block maintained in a precharged state. With such an operation, a current consumption is reduced in the normal access mode. In the MSB refresh mode, as shown in FIG. 6A, refresh is executed on 4 memory blocks MB0 to MB3 in an upper side memory block UMB and on 4 memory blocks MB8 to MB11 in a lower side memory block LMB in bank BK0. Since no refresh is executed on any of the other banks BK1 to BK3, no storage data is guaranteed therein.

To perform refresh only on bank BK0 is equivalent to the 1 bank self-refresh mode. Since refresh is performed only on a half of the memory blocks in bank BK0, however, the number of times of refresh can be reduced, thereby enabling a refresh interval to be longer. With such an operation, an average consumed DC current in the self-refresh mode can be further reduced, as compared with the 1 bank self-refresh mode. Refresh may be executed such that in the self-refresh mode, two memory blocks are selected in the upper side memory block UMB and the lower side memory block LMB, respectively, and refresh is simultaneously performed on the two memory blocks. Alternatively, refresh may be executed only on one side of the upper side memory block UMB and the lower side memory block LMB, that is, only on one memory block. In the one memory block refreshing scheme, although the number of times of refresh is the same as is in the 1 bank refresh mode, the number of circuits to be operated can be reduced, thereby enabling a current consumption to be reduced. In any of the cases, a current consumption in the self-refresh mode can be reduced, as compared with a case where an entire of bank BK0 is refreshed.

Figure 6B:
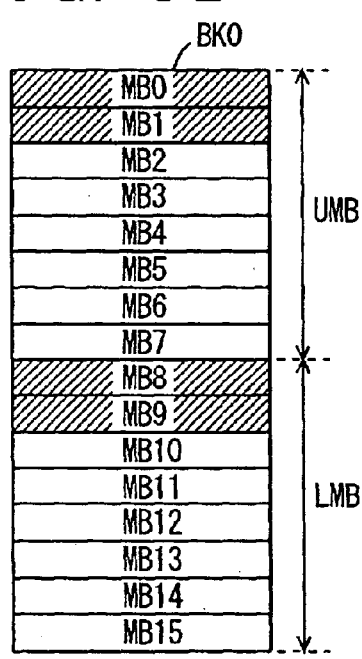

When address signal bits ADDi, ADDj and ADDk are set to (1, 0, 0), a 2 MSB bank self-refresh mode is set. When the 2 MSB bank self-refresh mode is set, as shown in FIG. 6B, in bank BK0, refresh is executed on two memory blocks MB0 and MB1 in upper side memory block UMB and two memory blocks MB8 and MB9 in lower side memory block LMB. No refresh is executed on any of the other memory blocks. No refresh is executed on any of the other banks BK1 to BK4 either.

Therefore, when the 2 MSB self-refresh mode is set, the number of times of refresh can be further reduced to increase a refresh interval, thereby enabling a current amount consumed in refresh to be reduced.

The other combinations (1, 0, 1) and (1,1, 0) of address signal bits ADDi, ADDj and ADDk are reserved for mode extension in the future.

Therefore, by storing refresh construction specifying data setting refresh details in the self-refresh mode in mode register 2 (12) and setting contents of refresh to be performed according to the refresh construction specifying data in the self-refresh mode, an optimum self-refresh mode adapted to a use environment can be set, which enables a current consumption to be reduced in the self-refresh mode.

Figure 7:
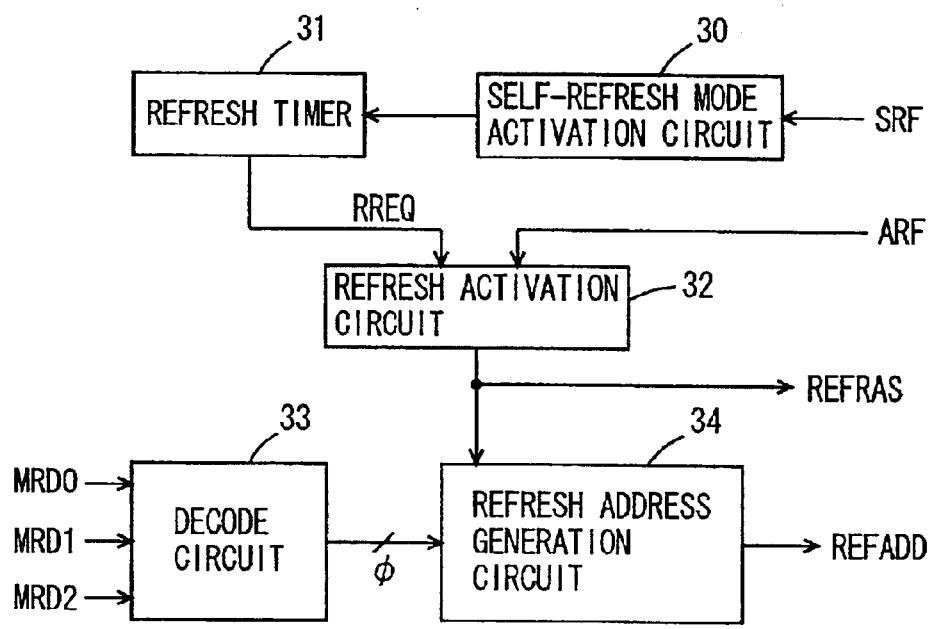
FIG. 7 is a block diagram schematically showing a refresh control circuit in the first embodiment of the present invention.

FIG. 7 is a block diagram schematically showing refresh control circuit 22 shown in FIG. 2. In FIG. 7, refresh control circuit 22 includes: a self-refresh activation circuit 30 for generating a self-refresh mode activation signal according to self-refresh mode instructing signal SRF; a refresh timer 31 activated, according to the self-refresh mode activation signal from self-refresh mode activation circuit 30, to generate refresh requests RREQ at prescribed intervals; a refresh activation circuit 32 for generating a refresh activation signal REFRAS activating a refresh operation in the form of a one-shot pulse according to refresh request RREQ from refresh timer 31 and auto-refresh mode specifying signal ARF; a decode circuit 33 for decoding refresh construction specifying data MRD <2:0> from a mode register to generate a decode signal $\phi$ specifying a designated self-refresh mode; and a refresh address generation circuit 34 updating a current refresh address according to refresh activation signal REFRAS from refresh activation circuit 32 to generate a refresh address RFADD according to refresh construction decode signal $\phi$ from decode circuit 33.

Refresh activation signal REFRAS from refresh activation circuit 32 determines a word line select time period (a refresh time period). An address region of refresh address generation circuit 34 is determined according to the decode signal $\phi$ outputted from decode circuit 33 and refresh address RFADD is updated in the determined refresh address region.

While in FIG. 7, no signal path for the deep power down mode is shown, when the deep power down mode is set, refresh timer 31 is deactivated and self-refresh mode activation circuit 30 is also deactivated.

Figure 8:
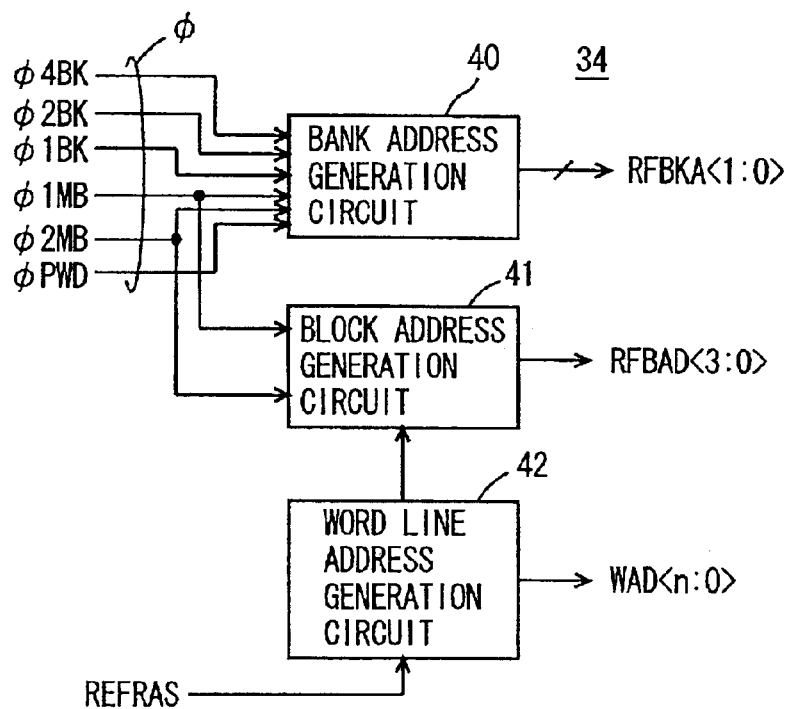
FIG. 8 is a block diagram schematically showing a configuration of a refresh address generation circuit shown in FIG. 7.

FIG. 8 is a block diagram schematically showing a configuration of a refresh address generation circuit 34 shown in FIG. 7. In FIG. 8, refresh address generation circuit 34 includes: a bank specifying signal generation circuit 40 generating bank specifying signals BKS0 to BKS3 specifying respective banks BK0 to BK3 according to decode signal $\phi$ from decode circuit 33; a block address generation circuit 41 generating a refresh block address RFBAD <3:0> specifying a memory block in each bank according to MSB self-refresh mode specifying signal $\phi$ 1 MB and 2 MSB self-refresh mode specifying signal $\phi$ 2 MB from decode circuit 33; and a word line address generation circuit 42 including a counter updating a count value thereof in response to activation of refresh activation signal REFRAS and generating a word line address WAD <n:o> specifying a word line in a memory block according to the count value of the counter.

Block address generation circuit 41 updates refresh block address RFBAD <3:0> according to a count-up signal of an address counter included in word line address generation circuit 42. Therefore, after refresh is completed on all memory cells in one memory block, refresh is executed on a next memory block.

FIG. 9 is a block diagram schematically showing an example of a configuration of bank address generation circuit 40 shown in FIG. 8. In FIG. 9, bank address generation circuit 40 includes: an OR circuit 40a receiving auto-refresh mode instructing signal ARF and a 4 bank self-refresh mode instructing signal φ 4BK to generate a refresh bank address bit RFBKA <1>; an inverter 40b inverting a power down mode instructing signal φPWD to generate a complementary bank address signal bit ZRFBKA <1>; and an OR circuit 40c receiving an output signal of OR circuit 40a and 2 bank self-refresh mode instructing signal φ 2BK to generate refresh bank address bit <0>. Refresh bank address signal bit ZRFBK<0> is further generated from inverter 40b.

FIG. 10 shows a correspondence between banks BK0 to BK3 and bank addresses. Bank addresses (0, 0), (0, 1), (1, 0) and (1, 1) are assigned to respective banks BK0 to BK3. When a higher order bank address bit RFBKA <1> is "0", banks BK0 and BK1 are specified and when a higher order bank address bit RFBKA <1> is "1", banks BK2 and BK3 are specified.

FIG. 11 is a table representing self-refresh modes set in bank address generation circuit 40 shown in FIG. 9 and corresponding logic levels of bank address signal bits.

When the auto-refresh mode or the 4 bank self-refresh mode is specified, address signal bits RFBKA <1:0> and ZRFBKA <1:0> are all set to H level (logical high level). Therefore, in this state, a higher order bank address bit and a lower order bank address bit are both in a selected state to specify all of banks BK0 to BK3 simultaneously. That is, output signals of OR circuits 40a and 40c assume H level and in this mode, power down mode instructing signal φ PWD is at L level, thereby enabling all of banks BK0 to BK3 to be driven into a selected state in the auto-refresh mode and the 4 bank self-refresh mode.

When the 2 bank self-refresh mode is specified, 2 bank self-refresh mode instructing signal φ 2BK goes to H level and the other self-refresh mode instructing signals are all at L level. Therefore, in this state, refresh bank address signal RFBKA <1> goes L level, and the other refresh address signal bits RFBKA <0> and ZRFBKA <1:0> go to H level. Therefore, higher order bank address bit RFBKA <1> is "0" and lower order bank address bits RFBKA <0> is also in a both selected state or arbitrary state and therefore, banks BK0 and BK1 are specified.

When the one bank self-refresh mode, the MSB self-refresh mode and the 2 self-refresh mode are specified, self refresh mode instructing signal φ 4BK and φ 2BK are at L level and power down mode instructing signal φ PWD is also at L level. In addition, auto-refresh mode instructing signal ARF is also at L level. Therefore, in this state, complementary refresh bank address bits ZRFBK <1:0> go both H level and refresh bank address signal bits RFBKA <1:0> go both L level. Therefore, in this state, a bank address (0 , 0) is specified to specify bank BK0.

When the power down mode is set, power down mode instructing signal φ PWD goes to H level and complementary refresh address signal bits ZRFBKA <1:0> both go L level and the other self-refresh mode instructing signals are also at L level and therefore, refresh bank address signal bits RFBKA <1:0> also go to L level. Hence, in this state, no bank is specified. In the power down mode, since supply of an internal power supply is cut off to perform no refresh, no problem arises even if no bank is specified.

A configuration may be further used, in which a bank address generated by bank address generation circuit 40 is set to an arbitrary address when the power down mode is specified. Likewise, no problem arises since no refresh is performed in the power down mode.

Figure 12:
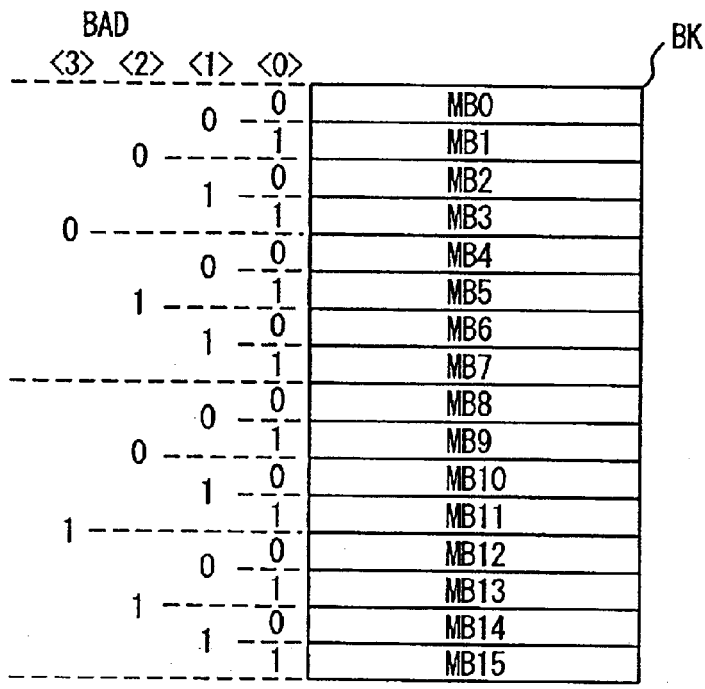
FIG. 12 is a diagram showing an example of a block address assignment for memory blocks.

FIG. 12 is a representation showing an example of block address assignment for memory blocks in one bank. In FIG. 12, bank BK (memory array) includes 16 memory blocks MB0 to MB 15. Upper side memory blocks or lower side memory blocks are specified by the most significant bank address signal bit BAD <3>. When the most significant bank address signal bit BAD <3> is "0", memory blocks MB0 to MB7 in the upper side memory blocks are specified, while when the most significant block address signal bit BAD <3> is "1", memory blocks MB8 to MB15 in the lower side memory blocks are specified.

Four memory blocks are specified in each of the upper side memory blocks and the lower side memory blocks by bank address signal bit BAD <2>. When bank address signal bit BAD <2> is "0", memory blocks MB0 to MB3 and MB8 to MB11 are specified, while when ban address signal bit BAD <2> is "1" (at H level), memory blocks MB4 to MB7 and MB12 to MB15 are specified.

Bank address signal bit BAD <1> specifies two memory blocks in each of the memory block regions specified by bank address signal bit BAD <2>. When bank address signal bit <1> is "0", memory blocks MB0, MB1, MB4 and MB5 in the upper side memory blocks and MB8, MB9, MB 12 and MB 13 in the lower side memory blocks are specified. When bank address signal bit <1> is "1", memory blocks MB2, MB3, MB6 are and MB7 are specified and MB10, MB11, MB14 and MB15 are specified as well.

Even numbered memory blocks or odd numbered memory blocks are specified by the least significant bank address signal bit BAD <0>.

Figure 13:
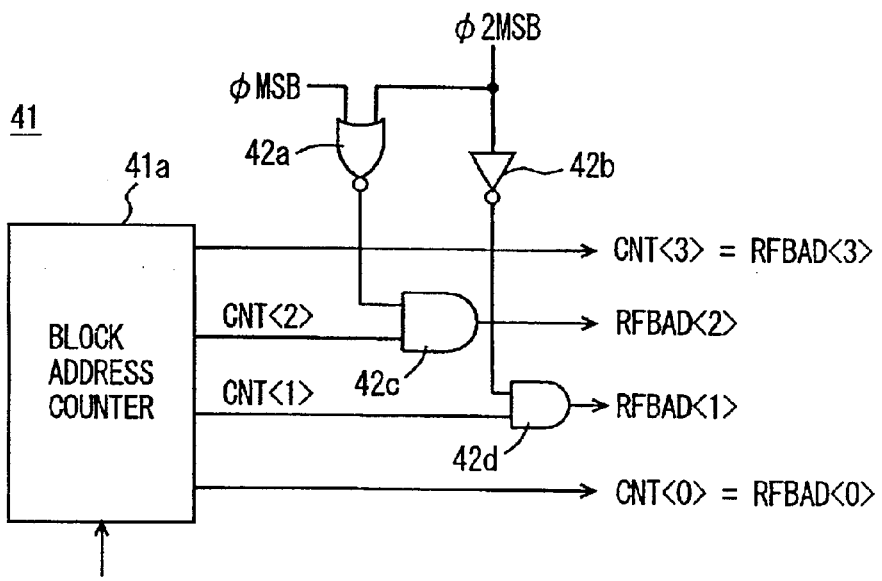
FIG. 13 is a diagram showing an example of configuration of a refresh block address generation circuit for the block address assignment shown in FIG. 12.

FIG. 13 is a diagram showing an example of a configuration of block address generation circuit 41 shown in FIG. 8. In FIG. 13, block address generation circuit 41 includes: a block address counter 41a counting count-up indicating signal CUP from word line address generation circuit 42 to generate a count value CNT <3:0>; a NOR circuit 42a receiving MSB self-refresh mode instructing signal φ MSB and 2 MSB self-refresh mode instructing signal φ 2MSB; an inverter 42b receiving 2 bank self-refresh mode instructing signal φ 2MSB; an AND circuit 42c receiving count value CNT <2> of block address counter 41a and an output signal of NOR circuit 42a to generate refresh block address signal bit RFBAD <2>; and an AND circuit 42d receiving count CNT <1> and an output signal of inverter 42c to generate refresh block address signal bit RFBAD <1>. Counts CNT <3> and CNT <0> are used as refresh block address signal bits RFBAD <3>and RFBAD <0>, respectively.

When the self-refresh mode on a bank basis is specified, MSB self-refresh mode instructing signal φ MSB and 2 MSB self-refresh mode instructing signal φ 2 MSB are both at L level. Therefore, output signals of NOR circuit 42a and inverter 42b go to H level, AND circuits 42c and 42d operate as buffer circuits and count CNT <3:0> of block address counter 41a is used as refresh block address signal bits RFBAD <3:0>.

On the other hand, when the MSB self-refresh mode is specified, MSB self-refresh mode instructing signal φ MSB goes to H level and an output signal of NOR circuit 42a goes to L level. Responsively, refresh block address bit RFBAD <2> is fixed at L level (="0"). 2 MSB self-refresh mode instructing signal φ 2MSB is at L level and AND circuit 42b operates as a buffer circuit. Therefore, since block address signal bit BAD <2> is fixed at "0", refresh is executed on memory blocks MB0 to MB3 and MB8 to MB11 according to a count of block address counter 41a.

When the 2 MSB self-refresh mode is set, 2 MSB self-refresh mode instructing signal φ2 MSB goes to H level, output signals of NOR circuit 42a and inverter 42b are both at L level and refresh block address bits RFBAD <2> and RFBAD <1> outputted from AND circuits 42c and 42d are both set to L level ("0"). Therefore, in this state, refresh is executed on memory blocks MB0, MB1, MB8 and MB9.

It should be noted that when the most significant block address signal bit BAD <0> is degenerated and two memory blocks are simultaneously driven to a selected state in the upper side memory blocks and the lower side memory blocks, respectively, no necessity arises for using count CNT <0> from block address counter 41a. It is only required that in a block decoder, a block select signal specifying a memory block is regularly generated according to a bank address BAD <2:0> of 3 bit s. In this case, in the normal operation mode, two memory blocks are simultaneously selected in one bank and furthermore, in the refresh mode, refresh is performed on the two memory blocks simultaneously.

Block address counter 41a shown in FIG. 13 generates refresh block address signal bit RFBAD <3> according to count CNT <3> and, in bank BK, one or two memory blocks in a specified memory block region are driven to a selected state to be refreshed.

Figure 14:
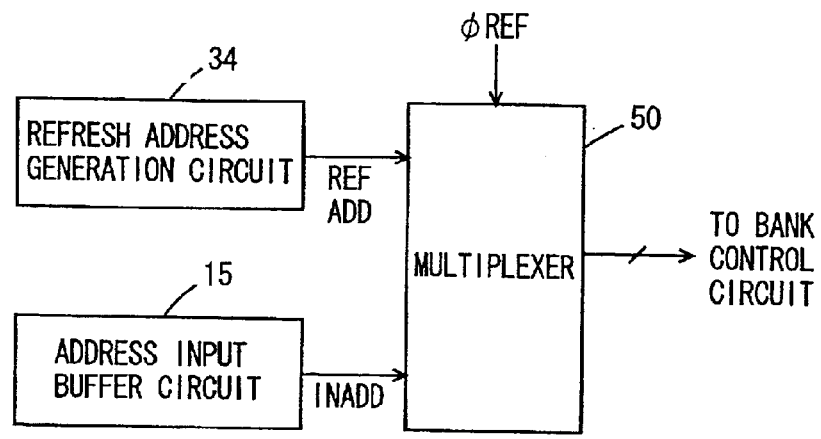
FIG. 14 is a block diagram schematically showing a configuration of an internal address generation circuit.

FIG. 14 is a block diagram schematically showing a configuration of a section generating an internal refresh address. In FIG. 14, the internal address generation section includes: a multiplexer 50 for selecting one of refresh address signal RFADD from a refresh address generation circuit 34 and internal address INADD from an address input buffer circuit 15 to apply the selected to a bank control circuit according to refresh mode instructing signal φREF. Refresh mode instructing signal φREF is activated in the self-refresh mode and the auto-refresh mode and multiplexer 50 selects refresh address REFADD from refresh address generation circuit 34 in the refresh mode.

A configuration may be employed in which a bank address and a block address from multiplexer 50 is decoded in the central control circuit to apply a bank instructing signal and a block instructing signal, commonly to bank control circuits provided corresponding to respective banks BK0 to BK3, and the other word line address is also applied commonly to the bank control circuits to be decoded in a selected memory block of a selected bank. Furthermore, another configuration may also be employed in which a bank instructing signal and a block address are transmitted to a bank control circuit to decode a block address in a selected bank.

With respect to a word line address, a word line address is predecoded in the central control circuit for transmission to bank control circuits provided corresponding to respective banks BQ0 to BQ3. Furthermore, a circuit for predecording a word line address may be incorporated in a bank control circuit.

Figure 15:
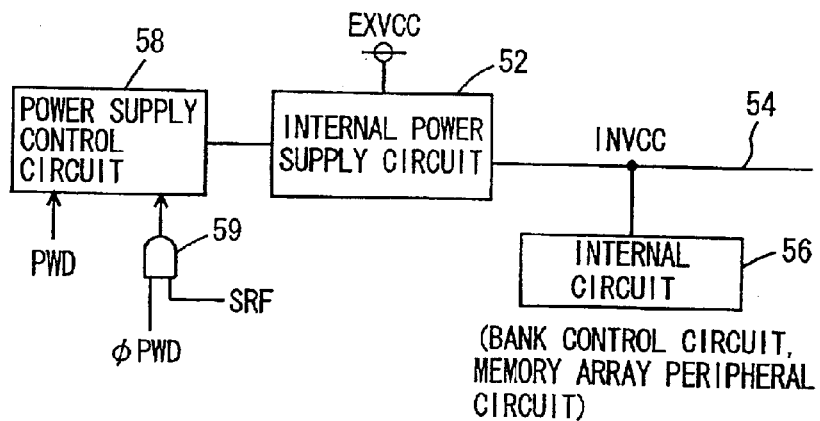
FIG. 15 is a block diagram schematically showing a configuration of a power supply control section in the first embodiment of the present invention.

FIG. 15 is a block diagram schematically showing a configuration of a power supply control circuit. In FIG. 15, the power supply circuit includes: an internal power supply circuit 52 for generating an internal power supply voltage INVCC from an external power supply voltage EXVCC; and a power supply control circuit 58 for deactivating internal power supply circuit 52 according to a power down mode instructing signal PWD and a refresh power down mode instructing signal φPWD. An output signal of an AND circuit 59 receiving refresh power down mode instructing signal φPWD and a self-refresh instructing signal SRF is applied as a refresh power down mode instruction to internal power supply control circuit 58. With this arrangement, the refresh power down instruction is discriminated from power down instructing signal PWD activated according to a normal external power down command. When one of an output signal of AND circuit 59 and power down mode instructing signal PWD is activated, power supply control circuit 58 deactivates internal power supply circuit 52.

Internal power supply voltage INVCC supplied onto an internal power supply line 54 from internal power supply circuit 52 is consumed by internal circuitry 56. Internal circuitry 56 includes a bank control circuit, a memory array peripheral circuit (sense amplifiers and row decoders) and others. A power supply is supplied to a command decoder and an input buffer circuit. This is because when a command such as a power down mode exit is applied, the internal power supply is required to recover and therefore, a command has to be monitored all the times. In the power down mode, therefore, power supply to a refresh control circuit may be cut off. No refresh is executed on storage data in the power down mode.

Power down mode instructing signal PWD is activated when a power down command is externally applied. Power down mode instructing signal φPWD is set in a mode register by refresh construction specifying data. Therefore, when self-refresh mode instructing signal SRF is activated by AND circuit 59, power supply control circuit 58 is activated, according to refresh power down mode instructing signal φPWD stored in the mode register, to deactivate internal power supply circuit 52.

Power control circuit 58 is constituted of, for example, an OR circuit receiving power down mode instructing signal PWD and an output signal of AND circuit 59. When an output signal of the OR circuit goes to H level. the supply of external power supply voltage EXVCC to internal power supply circuit 52 is ceased, or alternatively, an operation of generating an internal power supply voltage is ceased. When the internal power supply circuit 52 is configured to compare a reference voltage with the internal power supply voltage for supplying a current to internal power supply line 54 from the external power supply voltage EXVCC according to a result of the comparison, the comparison circuit in the internal power supply circuit 52 is deactivated in the power down mode.

By ceasing supply of power supply voltage to internal circuitry 56, no current consumption occurs in internal power supply circuit 52 and internal circuitry 56, thereby enabling reduction in current consumption.

As described above, according to the first embodiment of the present invention, contents of operation executed in the self-refresh mode are specified according to refresh construction specifying data set in a mode register, and in the self-refresh mode requiring a low power consumption, details of the refresh are made different from an operation manner in the auto-refresh mode, thereby enabling reduction in current consumption.

[Second Embodiment]

Figure 16:
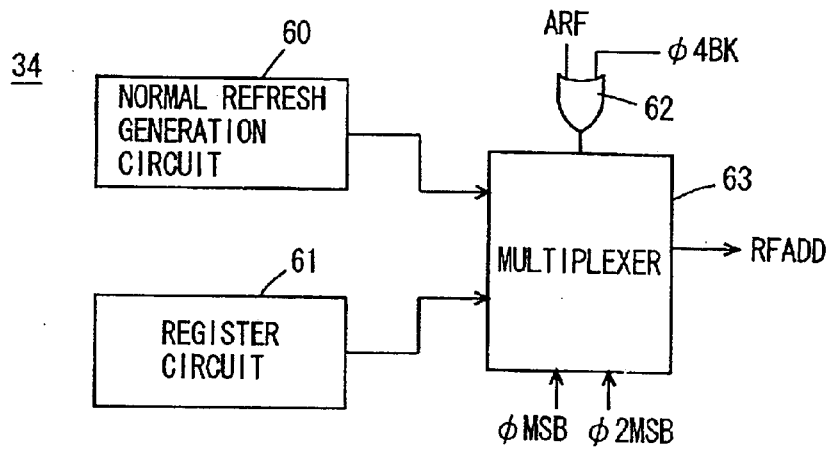
FIG. 16 is a block diagram schematically showing a configuration of a refresh address generation circuit according to a second embodiment of the present invention.

FIG. 16 is a block diagram schematically showing a configuration of a refresh address generation circuit 34 according to a second embodiment of the present invention. In FIG. 16, refresh address generation circuit 34 includes: a normal refresh generation circuit 60 for generating a refresh address in the normal mode; a register circuit 61 for outputting data stored therein as a refresh address; an OR circuit 62 receiving auto-refresh mode instructing signal ARF and 4 bank self-refresh mode instructing signal φ4BK; and a multiplexer 63 for selecting one of output address signals of normal refresh generation circuit 60 and register circuit 61 to generate refresh address RFADD.

Normal refresh generation circuit 60 specifies all of the banks in the auto-refresh mode and the 4 bank self-refresh mode and further sequentially specifies a prescribed number of memory blocks in a selected bank. On the other hand, register circuit 61 stores addresses specifying a bank and a memory block to be refreshed in each of the 2 bank self-refresh mode, the 1 bank self-refresh mode, the MSB self-refresh mode and the 2 MSB self-refresh mode.

In operation in the auto-refresh mode or the 4 bank self-refresh mode, where an output signal of OR circuit 62 is at H level, multiplexer 63 selects an address signal from normal refresh generation circuit 60. On the other hand, in the other self-refresh modes, with respect to refresh address, multiplexer 63 selects data stored in register circuit 61 to generate refresh address RADD. MSB self-refresh mode instructing signals φMSB and 2φMSB are further applied to multiplexer 63. When a memory block region is specified, selection of block address bits are further performed according to the instructing signals φMSB and 2φMSB.

Figure 17:
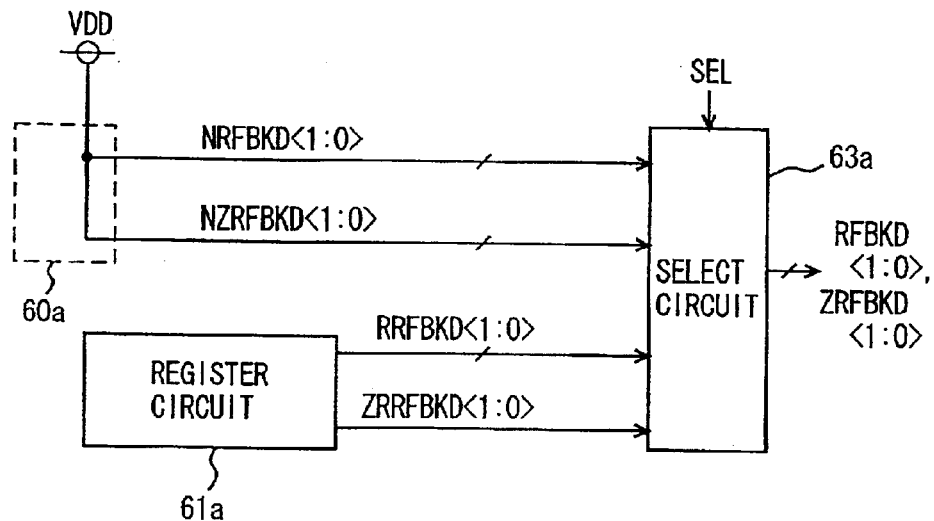
FIG. 17 is a block diagram schematically showing a configuration of a refresh bank address generation section in the second embodiment of the present invention.

FIG. 17 is a block diagram schematically showing a configuration of a section related to a bank address of refresh address generation circuit 34 shown in FIG. 16. Normal refresh generation circuit 60 includes a normal refresh bank address generation circuit 60a generating normal refresh bank address signal bits NRFBAD <1:0> and complementary normal refresh bank address signal bits NZRFBAD <1:0> according to power supply voltage VDD. Normal refresh bank address generation circuit 60a may be simply constituted of interconnection lines, or may include a buffer circuit receiving power supply voltage VDD as an input signal to generate normal refresh bank address bits NRFBAD <1:0> and NZRFBAD <1:0>.

Register circuit 61 includes a register circuit 61a generating complementary register refresh bank address signal bits RRFBAD <1:0> and ZRRFBAD <1:0> according to storage data therein. Register circuit 61a is, for example, a register circuit included in a mode register, and stores data specifying a refresh bank using a specific address or data bit externally applied when a mode register set mode is specified. The register circuit is a 2 bit register circuit, wherein each 1 bit register circuit generates complementary data.

Select circuitry 63 includes a select circuit 63a selecting one of the two refresh bank address signal bits according to a select signal SEL from OR circuit 63 shown in FIG. 16 to generate refresh bank address signal bits RFBAD <1:0> and ZRFBAD <1:0>.

Therefore, by setting a bank address in register circuit 6la using address signal bits and data bits as well when setting the MSB self-refresh mode, the 2MSB self-refresh mode, the 2 bank self-refresh mode and the 1 bank self-refresh mode, an address region to be refreshed can be set in a desired bank.

Figure 18:
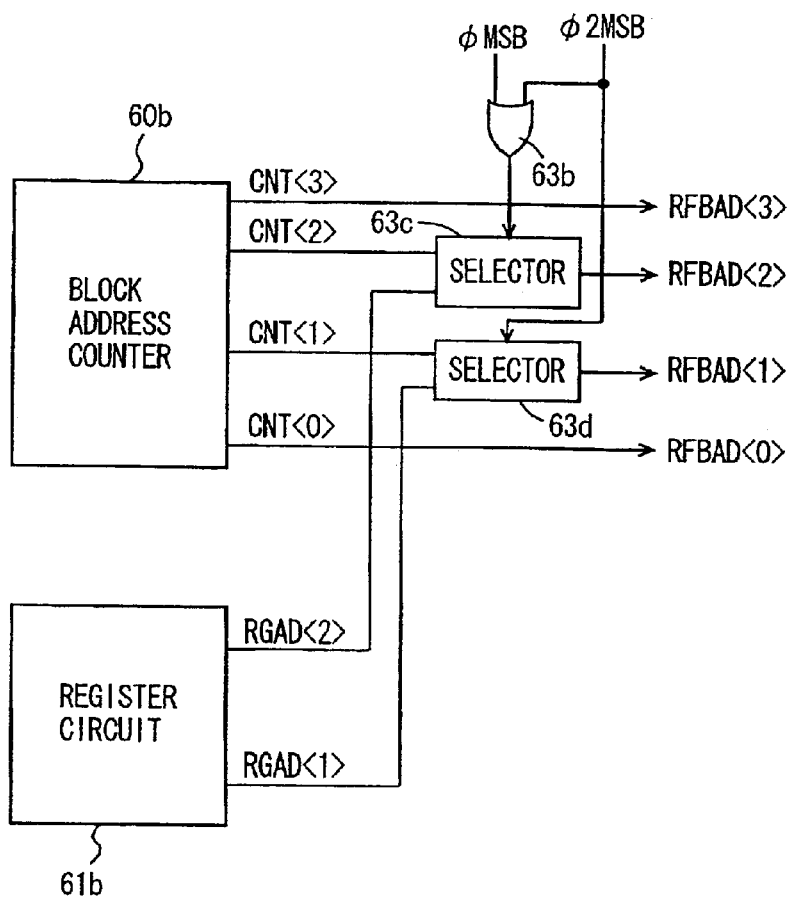
FIG. 18 is a block diagram schematically showing a configuration of a refresh block address generation section in the second embodiment of the present invention.

FIG. 18 is a block diagram schematically showing a configuration of a block address generation section for specifying a memory block in refresh address generation circuit 34 shown in FIG. 16. In FIG. 18, normal refresh generation circuit 60 includes a block address counter 60b of a configuration similar to that of block address counter 41a shown in FIG. 13. Count CNT <3:0> of 4 bit s is generated from block address counter 60b. Counts CNT <3> and CNT <0> are used as respective refresh block address signal bits RFBAD <3> and RFBAD <0>.

Resister circuit 61 includes 2 bit register circuit 61b generating a register block address signal bits RGAD <2> and RGAD <1>. Multiplexer 63 includes: an OR circuit 63b receiving MSB self-refresh mode instructing signal φMSB and 2MSB self-refresh mode instructing signal φ2MSB; a selector 63c for selecting one of count CNT <2> and register block address signal bit RGAD <2> according to an output signal of OR circuit 63b to generate memory block address signal bit RFBAD <2>; and a selector 63d selecting one of count value CNT <1> and register block address signal bit RGAD <1> according to 2MSB self-refresh mode instructing signal φ2MSB to generate refresh block address signal bit RFBAD <1>.

When self-refresh mode instructing signals φMSB and φ2MSB are both at L level and a refresh region is specified on a bank basis, selectors 63c and 63d select counts CNT <2> and CNT <1> from block address counter 60b to generate refresh block address signal bits RFBAD <2> and RFBAD <1>. Therefore, in this state, memory blocks are sequentially specified according to a count from block address counter 60b.

When the MSB self-refresh mode is set, selector 63c selects register block address signal bit RGAD <2> from register circuit 61b to generate refresh block address signal bit RFBAD <2>. In this state, selector 63b selects count CNT <1> to generate refresh block address signal bit RFBAD <1>. Therefore, in the MSB self-refresh mode, memory block address signal bit RFBAD <2> becomes a fixed value according to data stored in register circuit 61b to specify 4 memory blocks in each of the upper side memory block and the lower side memory block in address assignment shown in FIG. 12.

When the 2MSB self-refresh mode is specified, selectors 63c and 63d select register block address signal bits RGAD <2:1> from register circuit 61b to generate memory block address signal bits RFBAD <2:1>. Therefore, in this state, two adjacent memory blocks can be specified in each of the upper side memory block and the lower side memory block in the address assignment as shown in FIG. 12.

It should be noted that in the configuration shown in FIG. 18 as well, count CNT <3> from block address counter 60b may be used. When count CNT <3> is made valid, one of the upper side memory block and the lower side memory block are specified. When count value <3> is in a degenerated state, memory blocks are simultaneously selected in the upper side memory block and the lower side memory block, respectively, and refresh is executed on two memory blocks simultaneously.

Furthermore, such a configuration may be employed that refresh block address signal bit RFBAD <2> is set to an invalid state or a valid state according to refresh construction specifying data, for setting selectively a state for selecting one of the upper side memory block and the lower side memory block, and a state for selecting both upper side memory block and the lower side memory block simultaneously. Such configuration can be readily achieved if a selector according to refresh construction data is further provided to count value CNT <3>.

As described above, according to the second embodiment of the present invention, a region on which refresh is executed in the self-refresh mode can be set according to storage data in the register circuit of the mode register. Therefore, a desired address region can be used for a data holding region, and by storing data to be held in a specific bank depending on an application, necessary data can be held reliably.

[Third Embodiment]

Figure 19:
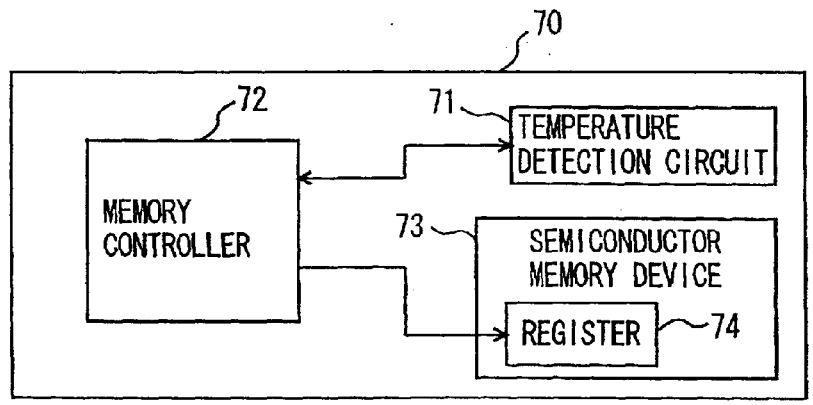
FIG. 19 is a block diagram schematically showing an entire configuration of a processing system according to a third embodiment of the present invention.

FIG. 19 is a block diagram schematically showing a configuration of a processing system according to a third embodiment of the present invention. In FIG. 19, processing system 70 includes a temperature detection circuit 71 for detecting an operating temperature of the system, and a memory controller 72 for setting a refresh cycle in the self-refresh mode of a semiconductor memory device 73 according to a detecting temperature of temperature detection circuit 71.

Memory controller 72 further controls an access operation and an auto-refresh operation on semiconductor memory device 73 in the normal operation mode, too.

Semiconductor memory device 73 stores data representing a refresh period in the self-refresh mode, compensated for based on a detected temperature by temperature detection circuit 71, for example, in a register 74 included in a mode register provided internally.

Figure 20:
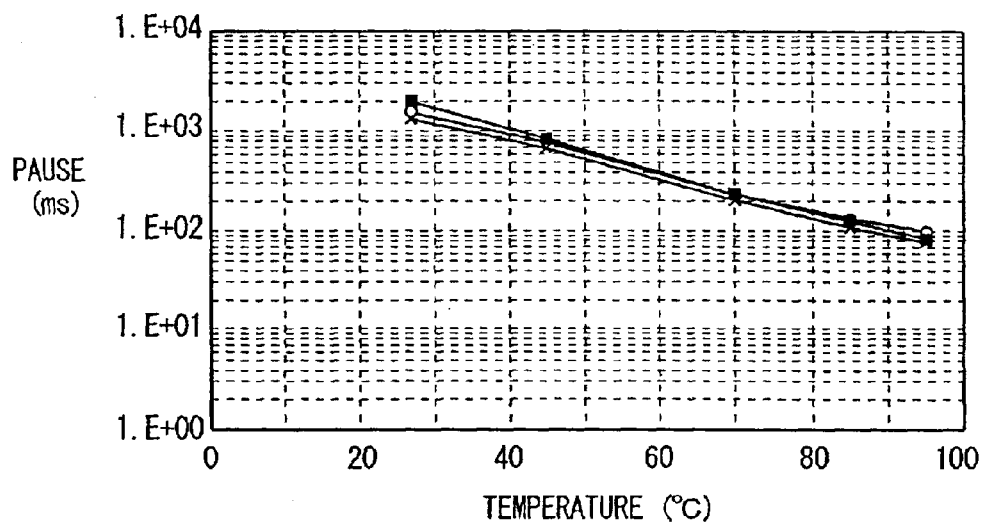
FIG. 20 is a graph showing a temperature dependency of a data holding characteristic of a memory cell.

FIG. 20 is a graph showing a relationship between a data holding time of a memory cell and a peripheral temperature thereof. FIG. 20 shows data holding time of semiconductor memory devices with different memory cell capacitances. In FIG. 20, the vertical axis indicates a data holding time and the horizontal axis indicates a temperature. As shown in FIG. 20, as the peripheral temperature rises, the data holding time decreases in any of the semiconductor memory devices of different memory cell capacitances due to increase in leakage current caused by hot electrons. At room temperature (25° C.), a data holding time (a pause time) is on the order of about 1E+03 ms, while when the peripheral temperature reaches 85° C. or so, a pause time is about 1E+02 ms. Here, E expresses a power of 10 and, for example, 1E+03 represents 10 raised to the third power.

Therefore, as the peripheral temperature rises, the data holding time decreases. Therefore, a refresh period is required to be reduced in order to hold data correctly. Detection of the peripheral temperature is done by temperature detection circuits 71. A memory controller 72 stores, in a table form, a correspondence between a detection temperature and a refresh period. Memory controller 72 stores data specifying a refresh period in the register 74 of semiconductor memory device 73 as refresh construction specifying data according to the correspondence table.

Figure 21:
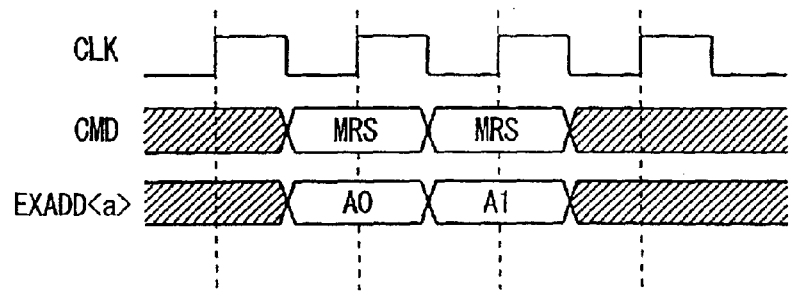
FIG. 21 is a timing chart showing a sequence of setting refresh cycle specifying data in the third embodiment of the present invention.

FIG. 21 is a timing chart representing setting refresh period data in the self-refresh mode. In FIG. 21, a specific address signal EXADD <a> of 1 bit is used as refresh period specifying data in the self-refresh mode.

Semiconductor memory device 73 is a clock synchronous semiconductor memory device operating in synchronization with a clock signal CLK. A mode register set command MRS is applied to the memory device 73 as a command CMD at a rising edge of clock signal CLK and at the same time, external address signal EXADD <a> is set to a specific logical level A0 and applied to the memory device 73. Mode register set command MRS is successively applied twice to generate refresh period specifying data using address signal bits A0 and A1.

FIG. 22 is a table representing a correspondence between the peripheral temperature and a refresh period in the self-refresh mode. In FIG. 22, a refresh period under a condition of the peripheral temperature being 70° C. in the auto-refresh mode of the 4K refresh cycle scheme is used as a reference value. The 4K refresh cycle scheme requires execution of refresh operation by 4 K times in order to refresh stored data on all of the memory cells and the 8 K refresh cycle scheme requires execution of refresh operations by 8 K times in order to refresh stored data on all of the memory cells, where K is 1024 or 2 raised to the second power.

As shown in FIG. 22, in the 4 K refresh cycle scheme, the same refresh period is set for the 4 bank self-refresh mode, the 2 bank self-refresh mode and the 1 bank refresh mode. As operating temperature changes to 85° C., 70° C., 45° C. and 15° C., the refresh period is set to ½ times, 1 times, 2 times and 4 times the reference value, respectively.

As for the 1 MSB self-refresh mode in which refresh is performed on a half of the memory blocks in one bank, for the 4K refresh cycle scheme, the refresh period is set to a base refresh period at an operating temperature of 85° C. As temperature falls to 70° C. and 45° C., the refresh period is set to 2 times and 4 times the base refresh cycle, respectively. At 15° C., no updating is especially performed on the refresh period (set to 4 times the base refresh period). The maximum refresh period of the memory device is set to 4 times the base refresh period.

In the 1 MSB self-refresh mode, refresh is performed on only a half of the memory blocks of one bank and the number of times of refresh is halved. Therefore, a refresh period can be set to twice the base period set at 70° C. Since a refresh period of a memory cell itself does not change from that in the self-refresh mode in a bank basis, stored data of a memory cell can be refreshed reliably.

In the 2 MSB self-refresh mode in which the number of memory blocks to be refreshed in one bank is further halved, the refresh period in operating temperatures of 85° C. and 70° C. is set twice and 4 times the basic refresh period, respectively. This is because only ¼ times the number of memory blocks of one bank are refreshed and therefore, the number of times of refresh is further halved.

On the other hand, in the 8 K refresh cycle scheme, a refresh period of half a refresh period in the 4 K refresh cycle scheme is set in the 4 bank configuration and the auto-refresh mode. In the 8K refresh cycle scheme, the number of times of refresh is twice that of the 4 K refresh cycle scheme, and therefore, a refresh period thereof is halved.

A refresh period of each of the 2 bank self-refresh mode, the 1 bank self-refresh mode, the 1 MSB self-refresh mode and the 2 MSB self-refresh mode is set to the same refresh period as that of a corresponding self-refresh mode in the 4 k refresh cycle scheme. This is because when the 8 k refresh cycle scheme is set, a refresh period is doubled to reduce a current consumption. Details of refresh in the self-refresh mode of the 8 K refresh cycle scheme setting will be detailed later.

In FIG. 22, refresh period is set ½ times, 1 times, twice and 4 times the base refresh period. As described below, a refresh period is set using 2 bit data A1 and A0.

FIG. 23 is a diagram schematically showing a configuration of a circuit for refresh period set data. As shown in FIG. 23, a register circuit 74, as an example, includes: register circuits 74a and 74b sequentially taking in external address signal bits EXADD <a> when a mode register command is applied thereto. Register circuits 74a and 74b constitute a shift register to sequentially take in and transfer data applied externally. A refresh period is set according to the 2 bit data (A0, A1).

Register circuit 74 may be configured to take in address signal bit EXADD <a> each time a mode register set command and an extended mode register set command are applied, for producing data bits A0 and A1 in parallel. In this configuration, two register circuits in register circuit 74 are so arranged as to receive the common address bit.

FIG. 24 is a block diagram schematically showing a configuration of a refresh control circuit. In FIG. 24, the refresh control circuit includes a decode circuit 75 decoding refresh period specifying data bits A0 and A1, and a refresh timer 31 having a period of generating refresh requests RREQ changed according to an output signal of decode circuit 75. Refresh timer 31 corresponds to the refresh timer 31 shown in FIG. 7.

Refresh timer 31 includes; a variable ring oscillator 77 activated when refresh mode instructing signal SRF is activated and having an oscillation frequency set according to an output signal of decode circuit 75; and a counter 79 counting an output signal of variable ring oscillator 7 to issue refresh request RREQ at each prescribed count. By setting an oscillation frequency to 1 times, twice, 4 times or ½ times the base frequency, refresh requests can be generated in a refresh period corresponding to a temperature as shown in FIG. 22.

Figure 25:
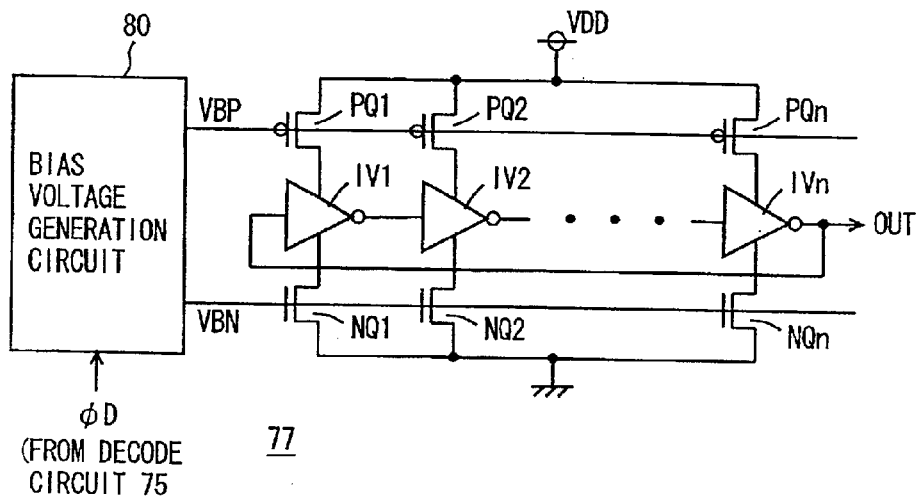
FIG. 25 is a diagram schematically showing an example of a configuration of a variable ring oscillator shown in FIG. 24.

FIG. 25 is a circuit schematically showing an example of a configuration of variable ring oscillator 77 shown in FIG. 24. In FIG. 25, variable ring oscillator 77 includes: a bias voltage generation circuit 80 for generating bias voltages VBP and VBN according to a decode signal ϕD from decode circuit 75; inverters IV1 to IVn of an odd number of stages connected in a ring form; P channel MOS transistors PQ1 to PQn, provided corresponding to the respective inverters IV1 to IVn of the odd number of stages, for supplying operating currents to corresponding inverters IV1 to IVn according to bias voltage VBP from bias voltage generation circuit 80; and N channel MOS transistors NQ1 to NQn, provided corresponding to the respective inverters IV1 to IVn, for discharging currents of corresponding inverters IV1 to IVn according to bias voltage VBN from bias voltage generation circuit 80.

Bias voltage generation circuit 80 adjusts a voltage level of bias voltages VBP and VBN according to decode signal ϕD. Current drive capabilities of current sources MOS transistors PQ1 to PQn and NQ1 to NQn are controlled by respective bias voltages VBP and VBN. When operating currents of inverters IV1 to IVn are each doubled, an oscillation period is halved, resulting in an increased operating speed, while contrary to this, when the operating currents are each halved, the oscillation period is longer by a factor of two. Therefore, by adjusting bias voltages VBP and VBN, an oscillation period of variable ring oscillator 77 can be changed.

Variable ring oscillator 77 is activated when self-refresh mode instructing signal SRF is activated. In this case, a NAND circuit receiving self-refresh mode instructing signal SRF and an output signal of inverter IVn is provided as inverter IV1 at the first stage (when self-refresh mode instructing signal SRF is active at H level).

Figure 26:
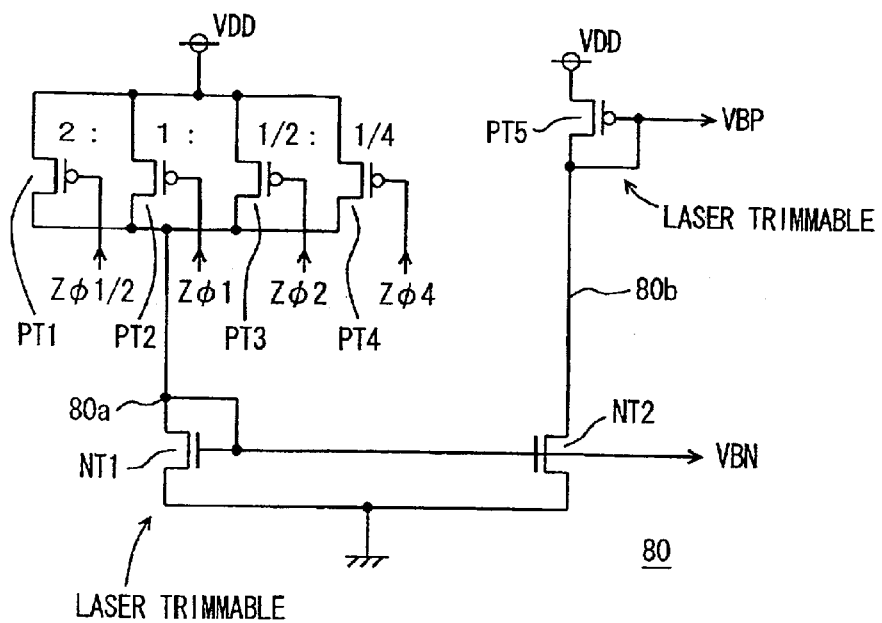
FIG. 26 is a diagram schematically showing a configuration of a bias voltage generation circuit shown in FIG. 25.

FIG. 26 is a circuit schematically showing an example of a configuration of bias voltage generation circuit 80 shown in FIG. 25. In FIG. 26, bias voltage generation circuit 80 includes: P channel MOS transistors PT1 to PT4 connected in parallel between a power supply node and an internal node 80a; an N channel MOS transistor NT1, connected between node 80a and a ground node, having a gate connected to node 80a; an N channel MOS transistor NT2, connected between a node 80b and the ground node, having a gate connected to node 80a; and a P channel MOS transistor PT5 connected between node 80b and the power supply node, and having a gate connected to node 80b.

Rates in size (a ratio of a channel width W to a channel length L, WL) of MOS transistors PT1, PT2, PT3 and PT4 are set to 2:1:½:¼. Accordingly, current drive capabilities of MOS transistors PT1, PT2, PT3 and PT4 are set in ratio to 2:1:½:¼. Control signals Zϕ½, Zϕ1, Zϕ2 and Zϕ4 are applied as decode signal ϕD to the respective gates of MOS transistors PT1, PT2, PT3 and PT4. When a refresh period is set to ½ times the base refresh period, control signal Zϕ½ is activated. When a refresh cycle is set to the base refresh period, control signal Zϕ1 is activated. When a refresh period is set to twice the base refresh period, control signal Zϕ2 is activated. When a refresh period is set to 4 times the base refresh period, control signal Zϕ4 is activated.

Accordingly, a current from one of MOS transistors PT1 to PT4 is supplied to node 80a. MOS transistors NT1 and NT2 constitute a current mirror circuit and a mirror current of a current supplied by one of MOS transistors PT1 to PT4 flows through MOS transistor NT2. A current of the same magnitude as that of a current flowing through MOS transistor NT2 is supplied through P channel MOS transistor PT5 when the mirror ratio is unity.

A voltage of the gate of MOS transistor NT2, that is, a voltage of node 80a, is applied as bias voltage VBN to the gates of MOS transistors NQ1 to NQn shown in FIG. 25. On the other hand, a voltage VBP of the gate of P channel MOS transistor PT5 shown in FIG. 25 is applied to P channel MOS transistors PQ1 to PQn shown in FIG. 25. Therefore, MOS transistors PQ1 to PQn each constitute a current mirror circuit with MOS transistor PT5, and MOS transistors NQ1 to NQn each constitute a current mirror circuit with MOS transistor NT1. Hence, current source transistors PQ1 to PQn and NQ1 to NQn each drive a current determined by MOS transistors PT1 to PT4. With such a configuration, operating currents of inverters IV1 to IVn constituting oscillation circuit 77 can be adjusted by bias voltages VBP and VBN and an oscillation period of ring oscillator 77 can be changed.

It should be noted that in FIG. 26, the size or a ratio of a channel width to a channel length of each of MOS transistors PT1 to PT4 is changed from the size of other. Alternatively, such a configuration may be employed that 8 P channel MOS transistors with the same size are connected in parallel to each other and 8, 4, 2 or one transistor is selectively set to a conductive state according to respective control signals Zϕ½, Zϕ1, Zϕ2 and Zϕ4. By using an OR circuit to generate control signals Zϕ½, Zϕ1, Zϕ2 and Zϕ4, corresponding current source transistors could be simultaneously set to a conductive state. In such a configuration, the base refresh period is set by two P channel MOS transistors.

It should be noted that by allowing the sizes of MOS transistors NT1 and PT5 to be laser-trimmable, a relationship between a current flowing through MOS transistors NT1 and PT5 and bias voltages VBN and VBP generated can be controlled. Therefore, an oscillation period of the oscillation circuit can be finely adjusted, thereby enabling setting of a refresh period with data bits A0 and A1 correctly, in accordance with actual performance of an individual semiconductor memory device.

MOS transistors PT5 and NT2 shown in FIG. 26 have current drive capabilities trimmable with a laser beam. Specifically, a plurality of unit transistors are connected in parallel to nodes 80a and 80b through fuse elements and sizes of MOS transistors PT5 and NT1 are adjusted through fuse program, to change bias voltages VBP and VBN. When a current drive capability of MOS transistor NT1 is increased, a voltage of node 80a, or a voltage level of bias voltage VBN generated in accordance with a supply current from any of MOS transistors PT1 to PY4 can be lowered, and thus, a bias voltage level can be adjusted according to a size of MOS transistor NT1. Similarly, by adjusting a current drive capability of MOS transistor PT5 through trimming, a voltage level of bias voltage VBP generated in accordance with a drive current of MOS transistor NT2 can be finely adjusted.

[First Modification]

FIG. 27 is a timing chart showing a sequence of operation in a first modification of the third embodiment of the present invention. In FIG. 27, as described above, in order to input data for setting a refresh period in the self-refresh mode, mode register set command MRS and extended mode register set command EMRS are used. Extended mode register set command EXRS is used in order to store necessary data in a register circuit different from a mode register originally provided. Mode register set command MRS and extended mode register set command EMRS have a duplicate portion in contents to be specified. That is, data can be set using mode register set command MRS and extended mode register set command EMRS in the same register circuit.

In the first modification of the third embodiment, by applying mode register set command MRS, refresh period specifying data A0 of the lower order bit is set according to external address signal bit EXADD <a> and the upper order bit A1 of refresh period specifying data in the self-refresh mode is set according to extended mode register set command EMRS.

FIG. 28 is a diagram schematically showing an example of a configuration of register circuit 70 in the first modification. In FIG. 28, register circuit 74 includes: a register circuit 74c taking in external address signal bit EXADD <a> when mode register set command MRS is applied, to generate refresh period specifying data bit A0; and a register circuit 74d taking in external address signal bit EXADD <a> when extended mode register set command EMRS is applied, to generate refresh period specifying data bit A1.

By use of external address signals EXADD<a> of 1 bit, refresh period specifying data bits A0 and A1 can be correctly generated with ease. In this configuration as well, variable ring oscillator 77 and a corresponding decode circuit can be formed using the configurations as shown in FIGS. 24 to 26.

[Second Modification]

FIG. 29 is a table showing contents of refresh period instructing data according to a second modification of the third embodiment of the present invention. In the contents shown in FIG. 29, a sequence for setting refresh period specifying data is the same as the operation sequence shown in FIG. 27. When bit A is "0", it is specified to set a refresh period at ½ times the base refresh period and when bit A is "1", it is specified to set a refresh period at twice the base refresh period. External address bit EXADD <a> is applied twice together with a mode register set command. If the address signal bit values show "0" in the two times, it is designated that the refresh period is set to ¼ times the base refresh period. When the mode register set command or extended mode register set, command is applied twice together with the external address signal bit, and the external address signal bit EXADD <a> is set to "1" in the two times, it is designated that the refresh period is set to 4 times the base refresh period.

Accordingly, when changing the refresh period from ½ the base refresh period to 4 times the base refresh period according to operating temperature, by setting refresh period specifying data A to "1" in three consecutive times, the refresh period can be increased to 8 times the base refresh period, thereby enabling a desired refresh period to be set. The desired refresh period can be achieved by applying the bit A by a desired number of times.

FIG. 30 is a diagram showing a configuration of a decode circuit in the second modification of the third embodiment of the present invention. In FIG. 30, the decode circuit includes: a gate circuit 86 receiving mode register set command MRS and address bit A; a gate circuit 87 receiving mode register set command MRS and address bit A to generate shift instructing signal RSFT; and a bi-directional shift register 85 performing a shifting operation according to shift instructing signals LSFT and RSET from gate circuits 86 and 87. Control signals $Z\phi½$, $Z\phi1$, $Z\phi2$ and $Z\phi4$ outputted by bi-directional shift register 85 are applied to bias voltage generation circuit 80 shown in FIG. 25.

When address signal bit A is "0", a left shift instructing signal LSFT from gate circuit 86 goes to H level and bi-directional shift register 85 performs a shifting operation in the left direction once to set an oscillation cycle of the ring oscillator to ½ times for shortening the refresh interval. On the other hand, when address signal bit A is "1", a right shift instructing signal RSFT from gate circuit 87 goes to H level and bi-directional shift register 85 performs a shifting operation in the right direction to set an oscillation cycle of the ring oscillator to the twice for doubling the refresh interval.

Therefore, by applying address signal bit A a plurality of times according to mode register set command MRS, shifting operation is performed in bi-directional shift register 85 to set a desired control signal into an active state. Bi-directional shift register 85 is initialized to activate control signal $Z\phi1$.

It should be noted that the mode register set mode instructing signal may be activated when the extended mode register set command is applied.

Figure 31:
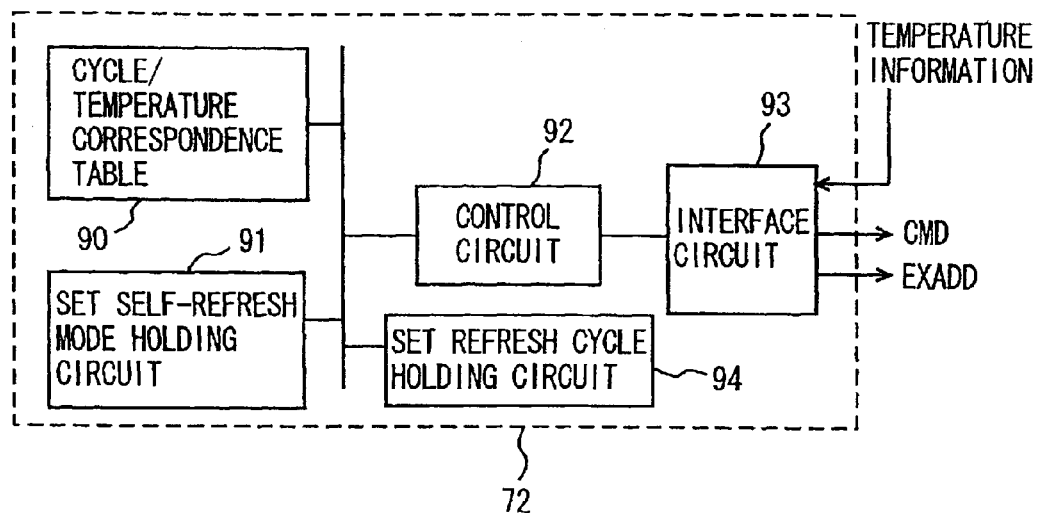
FIG. 31 is a block diagram schematically showing an example of a configuration of a memory controller in the third embodiment of the present invention.

FIG. 31 is a block diagram schematically showing an example of a configuration of a memory controller 72 externally provided. In FIG. 31, memory controller 72 includes: a cycle/temperature correspondence table 90 indicating a correspondence between a refresh cycle and temperature and constituted of a table ROM, for example; a set self-refresh mode holding circuit 91 storing data indicating a self-refresh mode set in the semiconductor memory device; and a control circuit 92, referring to cycle/temperature correspondence table 90 and set self-refresh mode holding circuit 91 in accordance with temperature information externally applied through an interface circuit 93, to generate a mode register set command and further generate data setting a self-refresh cycle according to external address signal bit EXADD.

When temperature information is applied to control circuit 92 through interface circuit 93, control circuit 92 refers to set self-refresh mode holding circuit 91 to detect a self-refresh mode currently set and further detect a self-refresh cycle to be set at a corresponding temperature in the self-refresh mode with reference to the cycle/temperature correspondence table 90. When the detected refresh cycle is different from a current refresh cycle held in set refresh cycle holding circuit 94, control circuit 92 generates a mode register set command and an address signal bit in order to newly set the detected refresh cycle. Thereby, a refresh cycle of the semiconductor memory device can be set according to a peripheral temperature of an operating environment, and a refresh cycle can be changed according to the operating environment as well.

Control circuit 92 may generates address bits A0 and A1 of 2 bit s, or alternatively, may be configured such that an address of 1 bit is set to a state of "0" or "1" to output data multiplying the refresh cycle set in set refresh cycle holding circuit 94 by a factor of 2 or ½. Control circuit 92 is configured appropriately according to a configuration of decoder decoding the refresh period specifying data.

As described above, according to the third embodiment of the present invention, the self-refresh cycle is adapted to be changed according to an operating temperature, thereby enabling implementation of a semiconductor memory device capable of stably holding data regardless of an operating temperature.

[Fourth Embodiment]

Figure 32:
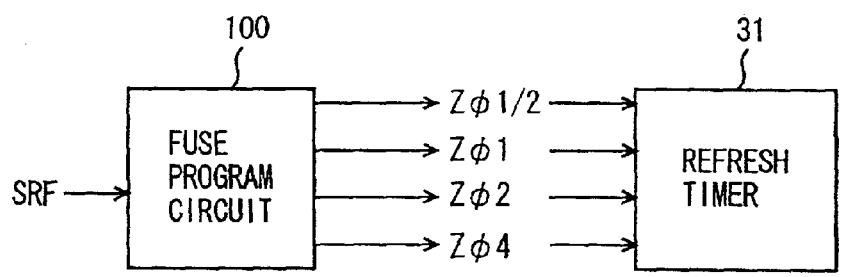
FIG. 32 is a diagram schematically showing a configuration of a refresh cycle set section of a fourth embodiment of the present invention.

FIG. 32 is a diagram schematically showing a configuration of a main part of a refresh control circuit of a semiconductor memory device according to a fourth embodiment of the present invention. In the configuration shown in FIG. 32, there is provided a fuse program circuit 100 for setting a refresh cycle of 4 K refresh cycle scheme as a refresh cycle. Therefore, in the configuration shown in FIG. 32, an oscillation period of a variable ring oscillator included in a refresh timer 31 is fixedly set. Fuse program circuit 100 sets control signals Zϕ½, Zϕ1, Zϕ2 and Zϕ4 to a programmed state only while self-refresh mode instructing signal SRF is active.

When self-refresh mode instructing signal SRF is in an inactive state indicating a normal operation mode, fuse program circuit 100 is in a reset state and control signals Zϕ½, Zϕ1, Zϕ2 and Zϕ4 are all set to an inactive state at H level. Refresh timer 31 has the configuration in the third embodiment (see FIGS. 25 and 26) and therefore, a bias voltage activating operation is ceased and the ring oscillator also ceases its operation in the normal operation mode.

By using fuse program circuit 100, a refresh cycle can be set according to data holding characteristics of a memory cell of an individual semiconductor memory device. Furthermore, by putting fuse program circuit 100 into an operating state only in the self-refresh mode, a current consumption can be reduced in the standby state in the normal operation mode.

Figure 33:
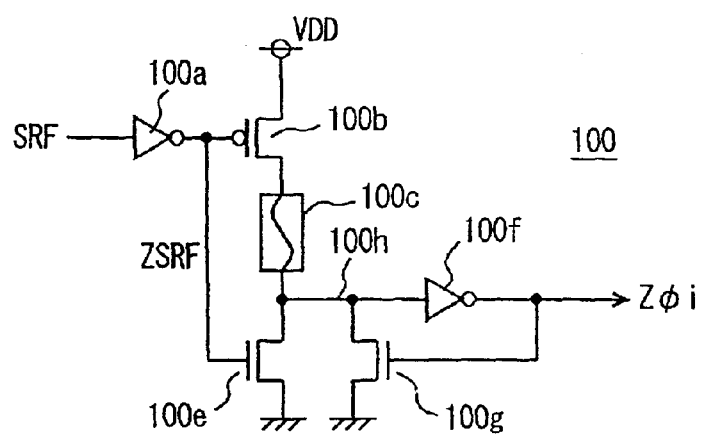
FIG. 33 is a diagram showing an example of a configuration of a fuse program circuit shown in FIG. 32.

FIG. 33 is a diagram showing an example of a configuration of a section related to one control signal Zϕi of fuse program circuit 100. In FIG. 33, fuse program circuit 100 includes: an inverter 100a inverting self-refresh mode instructing signal SRF to generate a complementary self-refresh mode instructing signal ZSRF; a P channel MOS transistor 100b having a source coupled to a power supply node and receiving complementary self-refresh mode instructing signal ZSRF outputted by inverter 100a at a gate thereof; a fusible link element (a fuse element) 100c connected between MOS transistor 100b and a node 100h; an N channel MOS transistor 100e connected between node 100h and a ground node, and receiving complementary self-refresh mode instructing signal ZSRF from inverter 100a at a gate thereof; an inverter 100f inverting a signal potential on node 100h to generate control signal Zϕi; and an N channel MOS transistor 100g selectively coupling node 100h to the ground node according to control signal Zϕi.

In the normal operation mode, self-refresh mode instructing signal SRF is at L level and complementary self-refresh mode instructing signal ZSRF from inverter 100a is at H level. MOS transistors 100b and 100e are in an off state and an on state, respectively and node 100h is held at the ground voltage level.

Control signal Zϕi outputted from inverter 100f is held in an inactive state at H level.

When self-refresh mode instructing signal SRF goes to H level, complementary self-refresh mode instructing signal ZSRF goes to L level, MOS transistor 100e enters an off state while MOS transistor 100b enters an on state, and link element 100c is connected to the power supply node. When link element 100c is in the blown-off state, then node 100h maintains an L level of the reset state and control signal Zϕi maintains an H level. At this time, node 100h is connected to the ground node by MOS transistor 100g to prevent node 100h from turning floating state.

When link element 100c is in a conductive state, node 100h is charged through MOS transistor 100b and link element 100c, and control signal Zϕi from inverter 100f goes to L level and responsively, MOS transistor 100g is driven into an off state. Accordingly, when link element 100c is blown off, control signal Zϕi is driven into an active state in the self-refresh mode to set a refresh period. Only by blowing a link element corresponding to a refresh cycle, an oscillation period of the ring oscillator of refresh timer 31 can be programmed.

Furthermore, for example, only an actual refresh cycle is set with a refresh cycle of the 4 K refresh cycle scheme being the reference refresh cycle, thereby enabling setting of a refresh cycle adapted to an actual data holding capability of a semiconductor memory device with ease.

It should be noted that control signal outputted by fuse program circuit 100 has only to be issued such that a cycle of the refresh request outputted by refresh timer 31 is set on the basis of the refresh cycle of the 4 K refresh cycle scheme, and there is no necessity to set the refresh cycle to ½ times, 1 times, twice or 4 times the reference as described above. For example, intermediate values such as 1.5, 2.5 or others can be employed as the multiplying factors for the refresh cycle. In this case, by also setting a size of a current source transistor to 1.5 times or other times accordingly, a necessary fresh cycle can be achieved.

[Fifth Embodiment]

Figure 34:
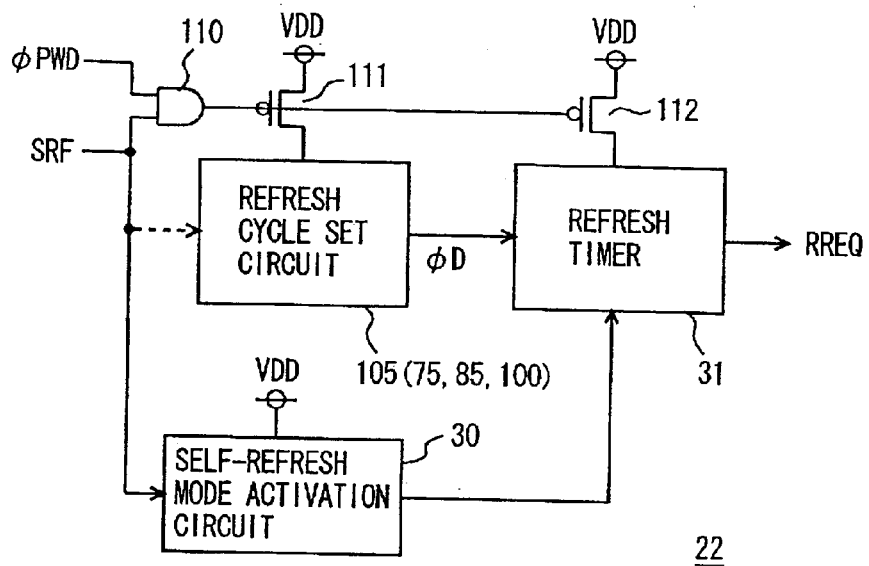
FIG. 34 is a block diagram schematically showing a configuration of a refresh control circuit of a fifth embodiment of the present invention.

FIG. 34 is a block diagram schematically showing a configuration of a refresh control circuit according to a fifth embodiment of the present invention. In FIG. 34, a refresh control circuit 22 includes: an AND circuit 110 receiving a self-refresh power down mode instructing signal ϕPWD and a self-refresh instructing signal SRF; a power supply transistor 111 rendered conductive when an output signal of AND circuit 110 is at L level, to supply power supply voltage VDD to refresh cycle set circuit 105; and a power supply transistor 112 rendered conductive when the output signal of AND circuit 110 is at L level, to supply power supply voltage VDD to refresh timer 31. Power supply transistors 111 and 112 are each constituted of a P channel MOS transistor.

Refresh cycle setting circuit 105 is any of decode circuit 75 shown in FIG. 24, a bi-directional shift register shown in FIG. 30 and fuse program circuit 100 shown in FIG. 32, all described previously, and generates decode signal ϕD for setting a refresh cycle in the self-refresh mode.

Refresh timer 31 includes a variable ring oscillator, and a counter counting an output signal of the variable ring oscillator, similarly to the configuration shown in FIG. 34 described previously. When a count of the counter reaches a prescribed value, the counter generates a refresh request.

Refresh control circuit 22 further includes a self-refresh mode activation circuit 30 supplied with power supply voltage VDD from a power supply node at all times and activating refresh timer 31 when self-refresh mode instructing signal SRF is activated. Self-refresh mode activation circuit 30 receives power supply voltage VDD normally to monitor self-refresh mode instructing signal SRF to reliably maintain the refresh timer 31 in the inactive state upon completion of the self-refresh mode, in order to prevent a malfunction of refresh timer 31 when the self-refresh mode completes and the self-refresh mode instructing signal SRF is rendered inactive and the semiconductor memory device returns to the normal mode.

As shown in FIG. 34, when the power down mode is specified in the register circuit (see the first embodiment) in the self-refresh mode, the output signal of AND circuit 10 goes to H level to cease supply of power supply voltage to refresh cycle set circuit 105 and refresh timer 31. In this deep power down mode, no refresh is performed internally and therefore, issuing a refresh request is not required, thereby enabling reduction in current consumption.

When a mode for refreshing memory cell data is specified in the self-refresh mode, self-refresh deep power down mode instructing signal φPWD is at L level, power supply transistors 111 and 112 maintains a conductive state thereof, refresh cycle set circuit 105 and fresh timer 31 operate, a ring oscillator in refresh timer 31 is activated according to a set refresh cycle and refresh request PREQ is issued at set intervals.

In the configuration shown in FIG. 34, such a configuration may be employed that self-refresh mode instructing signal SRF is further applied to refresh cycle set circuit 105 as shown with a broken line and when self-refresh mode instructing signal SRF is inactive in the normal operation mode, refresh cycle set circuit 105 is reset to inactivate the decode signal φD.

Further configuration may be additionally employed, in which when power down mode instructing signal PWD to be activated when a power down command is applied externally is activated, power supply transistors 111 and 112 are caused to be non-conductive.

As described above, according to the fifth embodiment of the present invention, when the deep power down mode is set in the internal register circuit when the self-refresh mode is specified, power supply to a circuit determining a refresh cycle is ceased. Thus, current consumption in the deep power down mode can be further reduced.

[Sixth Embodiment]

Figure 35:
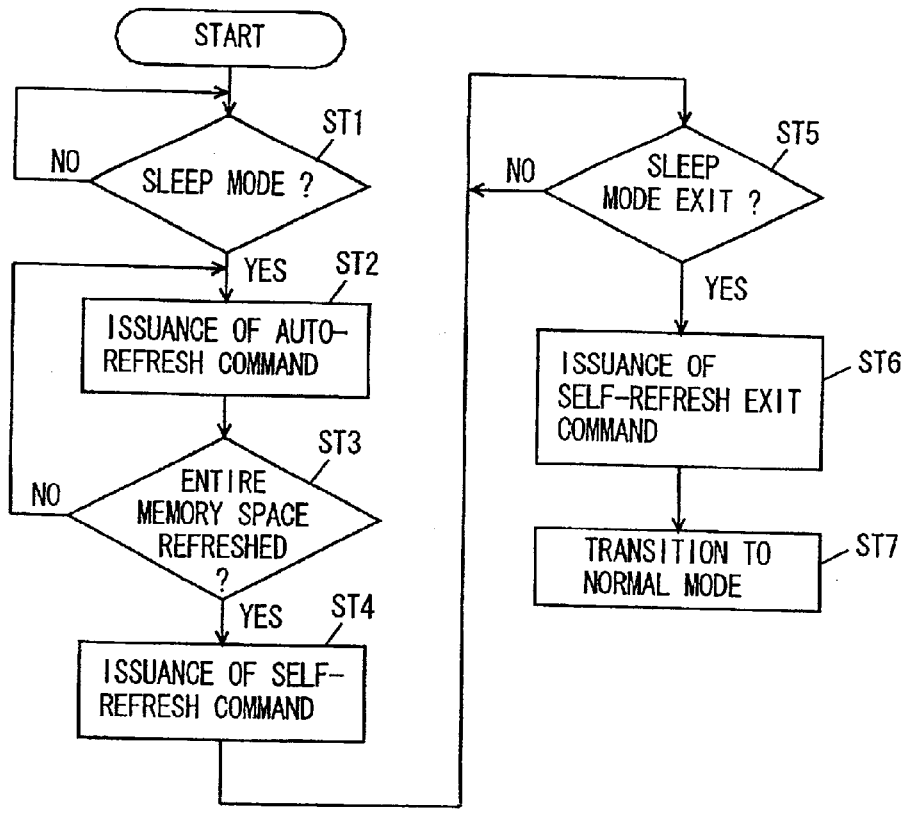
FIG. 35 is a flow chart showing operation in transition to a self-refresh mode according to a sixth embodiment of the present invention.

FIG. 35 is a flow chart representing operation in transition to the self-refresh mode of a semiconductor memory device according to a sixth embodiment of the present invention. The operation flow shown in FIG. 35 is executed by a memory controller. First, the memory controller monitors whether or not the sleep mode is to be set (step ST1). Whether or not the sleep mode is to be set is determined according to, for example, whether or not a processor is placed in a state of not processing over a prescribed time. The memory controller issues an auto-refresh command to a semiconductor memory device when the sleep mode is set (step ST2). Refresh is executed on stored data of memory cells in the semiconductor memory device using a refresh address counter internally provided according to the auto-refresh command. When the auto-refresh command is applied to the semiconductor memory device with a 4 bank configuration, refresh is executed simultaneously on stored data of memory cells in all of the 4 banks.

Then, the memory controller determines whether or not refresh has been executed over all of the memory space of the semiconductor memory device (step ST3). Determination on completion of refresh over a whole of the memory space is performed such that the number of refresh cycles required for refreshing all of the memory cells once is predetermined, for example, as in 4 K refresh cycles or 8 K refresh cycles, and the number of auto-refresh commands issued is counted according to the refresh cycle scheme employed.

Issuance of an auto-refresh command in step ST2 is repeated till refresh over a whole of the memory space once is completed.

When refresh on stored data of memory cells in a whole of the memory space is completed, the memory controller issues a self-refresh command (step ST4). The semiconductor memory device enters the self-refresh mode according to the self-refresh command and execute refresh in a set self-refresh mode or is set to the deep power down mode.

Then, the memory controller monitors whether or not the sleep mode is to be exited after the issuance of the self-refresh command (step ST5). The determination on exit of the sleep mode is made by monitoring whether or not a processor or the like starts the processing.

When the sleep mode is to be exited, the memory controller issues a self-refresh exit command to cause the self-refresh mode in the semiconductor memory device to be completed.

After a prescribed time period elapses from the issuance of the self-refresh exit command, the processing mode of the semiconductor memory device transitions from the sleep mode to the normal mode (step ST7) and data access is made to the semiconductor memory device. The setting of the prescribed time period between the issuance of the self-refresh exit command and the transition to the normal mode is made for the following reason. There is a possibility that a refresh operation is being under execution in the self-refresh mode in the semiconductor memory device on the issuance of the exit command. Therefore, the process is waited for the completion of transition of the standby state of the internal circuitry in the semiconductor memory device upon exit of the self-refresh mode.

As shown in FIG. 35, by refreshing a whole of the memory space concentrately prior to transition to the self-refresh mode, all of stored data of the memory cells in the memory space are refreshed prior to the transition to the self-refresh mode. Thus, the stored data can be held reliably even if a refresh cycle is changed internally. Hence, a current consumption can be reduced while holding the stored data of memory cells reliably in the low current consumption mode (the self-refresh mode) requiring a low current consumption. As a configuration for reducing a internal current consumption, any of the configurations used in the first to fifth embodiments can be used.

As described above, according to the sixth embodiment of the present invention, refresh is executed on stored data of memory cells of a whole of a memory space prior to transition to the self-refresh mode and in the following self-refresh mode, holding of stored data can be ensured even in execution of a self-refresh mode in the low current consumption mode such as a mode of increasing the refresh cycle.

[Seventh Embodiment]

Figure 36:
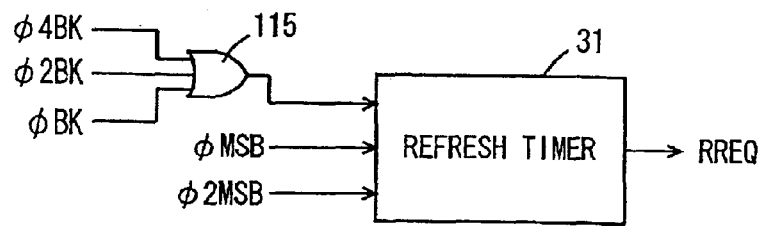
FIG. 36 is a diagram showing an example of a configuration of a refresh control circuit according to a seventh embodiment of the present invention.

FIG. 36 is a diagram schematically showing a configuration of a main portion of a refresh control circuit according to a seventh embodiment of the present invention. The refresh control circuit shown in FIG. 36 includes: an OR circuit 115 receiving 4 bank self-refresh mode instructing signal φ4BK, 2 bank self-refresh mode instructing signal φ2BK and 1 self-refresh mode instructing signal φBK; and a refresh timer 31 receiving an output signal of OR circuit 115, MSB self-refresh mode instructing signal φMSB and 2MSB self-refresh mode instructing signal φ2MSB.

The configuration of refresh timer 31 is similar to the configuration shown in FIG. 25 or 26 and an oscillation period of a ring oscillator included in refresh timer 31 is changed according to the output signal of OR circuit 115, MSB self-refresh mode instructing signal φMSB and 2MSB self-refresh mode instructing signal φ2MSB. That is, when a bank basis refresh is specified, a self-refresh cycle is set to a first refresh cycle (for example, a base refresh cycle). On the other hand, when the MSB self-refresh mode is specified, a cycle twice the base refresh cycle is set.

When the 2MSB self-refresh mode is set, a refresh cycle 4 times the base refresh cycle is set. Therefore, as shown in FIGS. 6A and 6B described previously, even when the refresh cycle is made longer as a refresh region is halved, in the MSB self-refresh mode and the 2MSB self-refresh mode, refresh for the necessary memory cell data can be performed by ½ times and ¼ times the number of refresh times to be required in a configuration in which refresh is performed on a whole of a bank.

Therefore, even when the refresh cycle is longer twice or 4 times, an actual period at which refresh is performed on a memory cell to be refreshed is the same for all the refresh modes, to reliably hold stored data. By changing a refresh cycle according to a scheme of the self-refresh mode, a current consumption can be further reduced in the MSB self-refresh mode and the 2MSB self-refresh mode.

[Eighth Embodiment]

Figure 37:
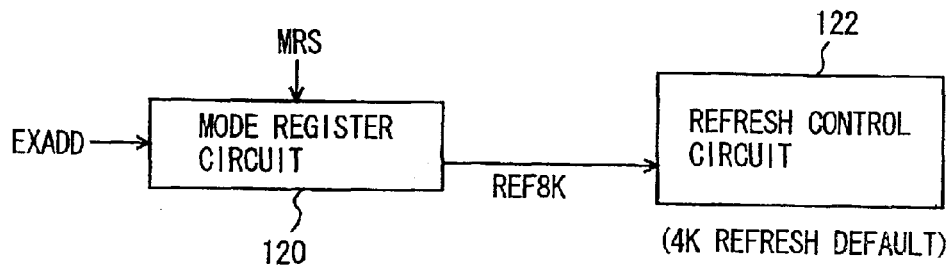
FIG. 37 is a diagram schematically showing a configuration of a main part of a semiconductor memory device according to an eighth embodiment of the present invention.

FIG. 37 is a diagram schematically showing a configuration of a main section of a semiconductor memory device according to an eighth embodiment of the present invention. In FIG. 37, 8 K self-refresh instructing signal REF8K specifying 8 K refresh cycle scheme is set in a mode register circuit 120 according to a specific bit of external address signal EXEVD. Mode register circuit 120 sets 8 K self-refresh cycle scheme according to a specific bit of external address signal EXADD when mode register set command MRS is applied.

8 K self-refresh cycle instructing signal REF8K from mode register circuit 120 is applied to refresh control circuit 122. In refresh control circuit 122, 4 K refresh cycle scheme is set as default. Refresh is executed 4 K times in order to refresh stored data of all the memory cells in a memory cell array once.

On the other hand, when 8 K refresh cycle scheme is set in mode register circuit 120 and 8 K self-refresh cycle instructing signal REF8K is activated, refresh control circuit 122 executes refresh in the self-refresh mode set under 8 K refresh cycle scheme without changing a current refresh cycle. Therefore, while the refresh period is not changed in the self-refresh mode, refresh under 8 K refresh scheme is executed and therefore, the number of memory cell rows driven in one refresh cycle is halved, thereby enabling reduction in current consumption in execution of refreshing.

Figure 38:
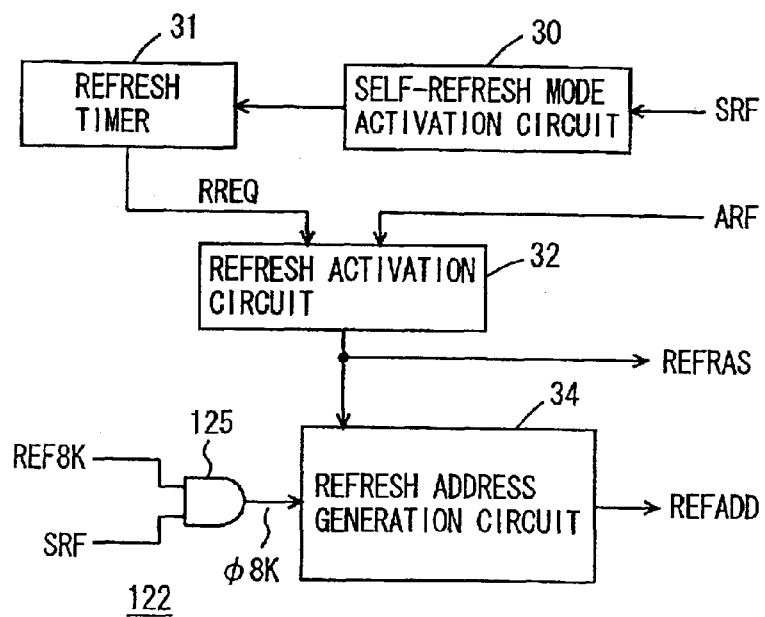
FIG. 38 is a block diagram schematically showing a configuration of a refresh control circuit shown in FIG. 37.

FIG. 38 is a block diagram schematically showing a configuration of refresh control circuit 122 shown in FIG. 37. Refresh control circuit 122 shown in FIG. 38 is different from refresh control circuit 22 shown in FIG. 7 in the point described in the following. That is, an output signal of AND circuit 125 receiving 8 K self-refresh cycle instructing signal REF8K and self-refresh mode instructing signal SRF is applied to refresh address generation circuit 34 generating refresh address REFADD as well. Refresh address generation circuit 34 makes a manner of generating refresh address REFADD different from that in the normal auto-refresh mode when 8 K self-refresh mode instructing signal REF8K is active in the self-refresh mode. Specifically, as will be described later in detail, a refresh address signal bit in the degenerated state is made valid while 8 K self-refresh mode instructing signal REF8K is active and two blocks/rows (word lines) simultaneously specified in the normal auto-refresh mode are individually specified according to refresh address bits.

[Configuration of Selected Memory Block]

Figure 39A:
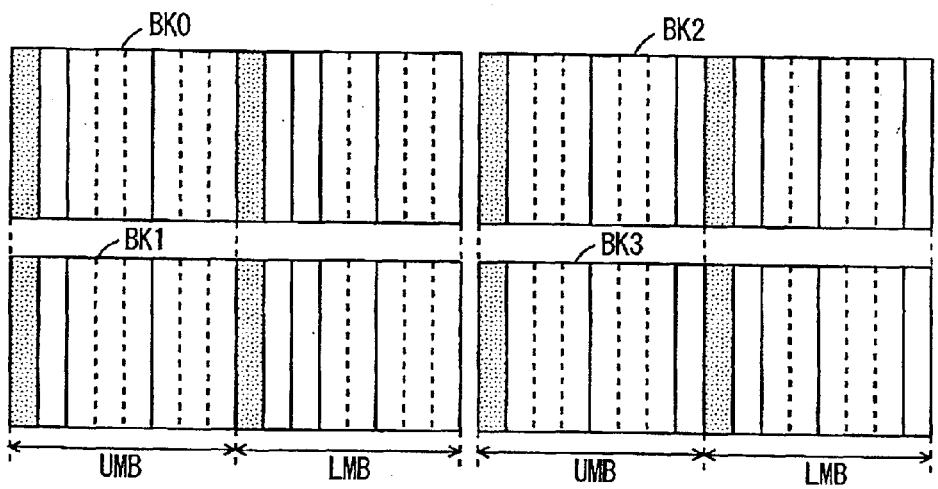
FIGS. 39A and 39B are diagrams schematically showing configurations of refresh execution blocks in one refresh cycle in the eighth embodiment of the present invention.

FIG. 39A is a diagram schematically showing locations of selected memory blocks in the normal mode according to the seventh embodiment of the present invention. The normal mode herein indicates a refresh mode in which the auto-refresh is executed and the refresh mode in which 8 K self-refresh mode instructing signal REF8K is inactive.

In FIG. 39A, banks BK0 to BK3 are simultaneously refreshed. In refresh in the normal mode, one memory block is specified fin the upper side memory block UMB of each of banks BK0 to BK3 for refresh and one memory block is specified in the lower side memory block LMB of each of banks BK0 to BK3 for refresh. Therefore, two memory blocks are simultaneously refreshed in one bank and refresh is simultaneously executed on a total of 8 memory blocks.

Figure 39B:
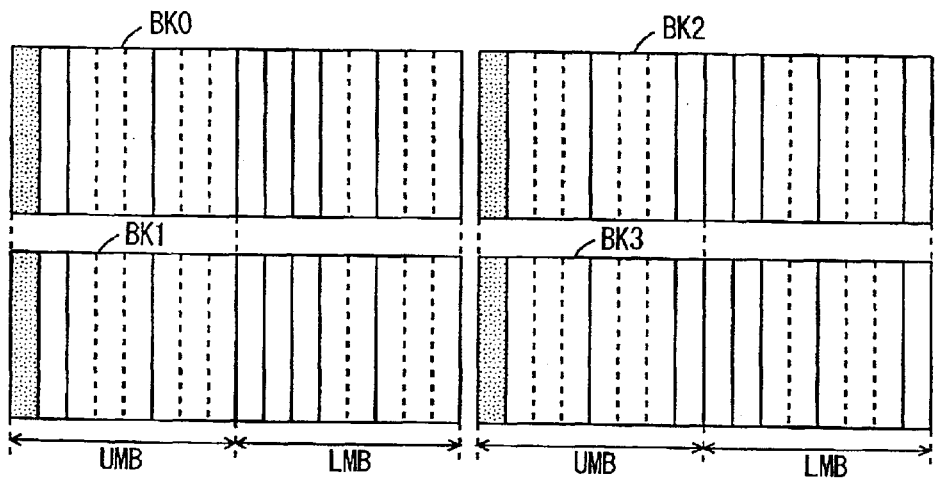

FIG. 39B is a diagram schematically showing locations of selected memory blocks when 8 K refresh mode is set. In FIG. 39 as well, refresh is executed simultaneously on banks BK0 to BK3. While 8 K self-refresh mode instructing signal REF8K is active, one memory block is selected in each of banks BK0 to BK3 to refresh. FIG. 39B shows a state where refresh is executed on one memory block in the upper side memory block UMB of each of banks BK0 to BK3. A case also exists where one memory block is selected in the lower side memory block LMB of each of banks BK0 to BK3 and refresh is executed on each of banks BK0 to BK3.

Therefore, when the 8 K refresh mode is set, one memory block is specified in each of banks BK0 to BK3 to refresh. Therefore, the number of memory blocks simultaneously selected can be reduced and the number of refresh-related circuits such as sense amplifier circuits (not shown) simultaneously operated can also be halved, as compared with that in the normal mode, thereby enabling reduction in current consumption in refreshing operation.

Even when the 8 K refresh mode is set, the refresh cycle is similar to that in the 4 K cycle scheme and therefore, a refresh cycle in the self-refresh mode is the same as that in the 4 K refresh cycle scheme. Therefore, the number of times of refresh executed in the self-refresh mode is the same as that in the 4 K refresh cycle scheme, and current consumption in the self-refresh mode can be reduced, as compared with that in the normal mode.

Figure 40:
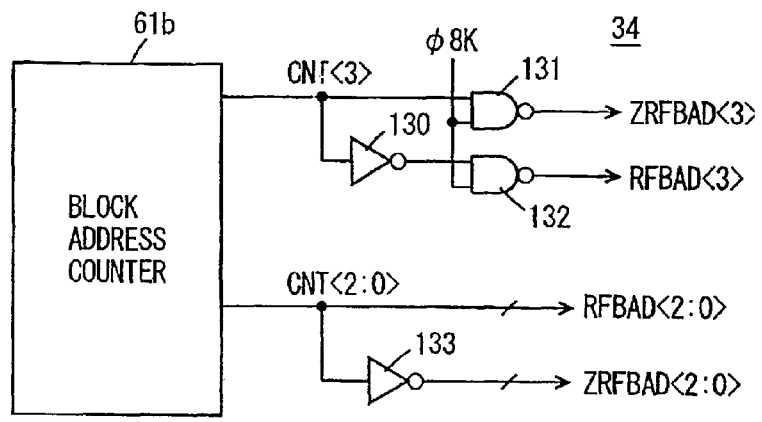
FIG. 40 is a diagram schematically showing a refresh block address generation section in the eighth embodiment of the present invention.

FIG. 40 is a diagram schematically showing an example of a configuration of refresh address generation circuit 34. A correspondence between refresh block address RFBAD <3:0> and a memory block is the same as that in address assignment shown in FIG. 12. In FIG. 40, refresh generation circuit 34 includes: a block address counter 61b counting an output count-up signal of a word line address counter; an inverter 130 receiving the most significant count value CNT <3> of block address counter 61b; an OR circuit 131 receiving count value <3> and an output signal φ8K of AND circuit 125 shown in FIG. 38; an OR circuit 132 receiving an output signal of inverter 130 and refresh control signal φ8K; and inverter circuit 133 inverting the lower order bits CNT <2:0> received from block address counter 61b.

Refresh block address signal bit RFBAD <3> is outputted from OR circuit 131 and complementary refresh block address signal bit ZRFBAD <3> is outputted form OR circuit 132.

Count value CNT <2:0> is used as refresh block address signal bits <2:0> and an output signal of inverter circuit 133 is used as complementary refresh block address signal bits ZRFBAD <2:0>.

Therefore, in the configuration shown in FIG. 40, when the 8 K refresh cycle scheme is set, refresh control signal φ8K goes to H level in the self-refresh mode, NAND circuits 131 and 132 operate as inverter circuits and refresh address signal bits ZRFBAD <3> and RFBAD <3> are changed according to count value CNT <3> from block address counter 61b. In this case, as shown in FIG. 39B, one of the upper side memory block UMB and the lower side memory block LMB is specified and further one memory block is specified in the specified upper side or lower side memory block.

On the other hand, in the normal mode, refresh control signal φ8K is at L level, output signals of NAND circuits 131 and 132 go to H level, accordingly, refresh block address signals RFBAD <3> and ZRFBAD <3> both go to H level in a selected state and the upper side memory block UMB and the lower side memory block LMB are both specified. In this case, refresh is executed on two memory blocks specified by lower order refresh block address signal bits RFBAD <2:0> and ZRFBAD <2:0>.

[Second Arrangement of Selected Memory Blocks in the 8 K Refresh Cycle Scheme]

Figure 41:
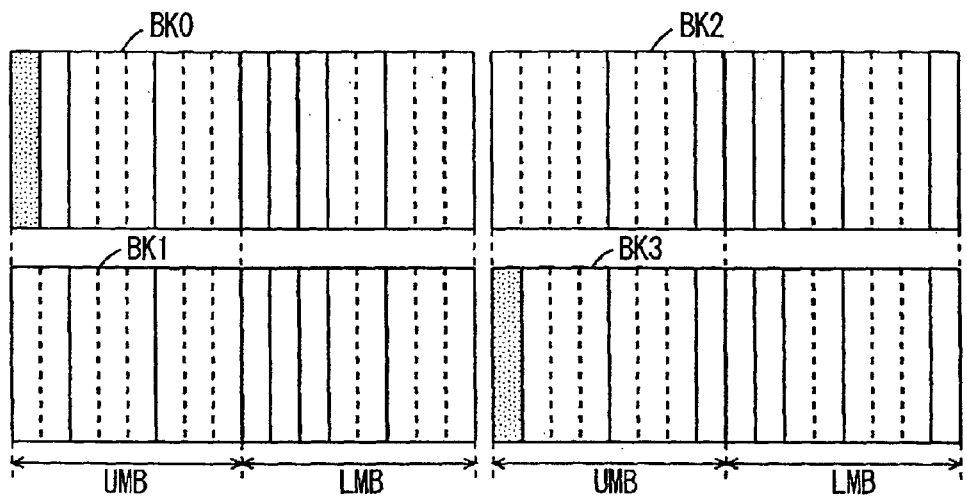
FIG. 41 is a diagram schematically showing a configuration of refresh memory blocks in the eighth embodiment of the present invention.

FIG. 41 is a diagram schematically showing locations of selected memory blocks when the 8 K refresh cycle scheme is set. As shown in FIG. 41, banks BK0 and BK3 located at diagonal positions are simultaneously specified in banks BK0 to BK3, one memory block is selected in each of selected banks BK0 and BK3 and refresh is executed thereon. Furthermore, in a refresh cycle, banks BK1 and BK2 located at diagonal positions are simultaneously selected, one memory block is selected in each of selected banks BK1 and BK2 and refresh is executed thereon. Accordingly, it can be prevented that a current consumption is localized on one side of a chip, and circuits consuming a current are dispersed over the chip. Thus, it can be prevented that power consumption on the power supply voltage is locally concentrated, enabling stable power supply (the configuration of power source will be described later). Moreover, heat generation caused through circuit operation can be dispersed over the chip, thereby enabling prevention of malfunction of circuitry due to rise in operating temperature caused by localized concentration of the heat generation.

In this configuration, in the normal mode, two memory blocks are selected in each of banks BK0 to BK3 as shown in FIG. 39A.

Figure 42:
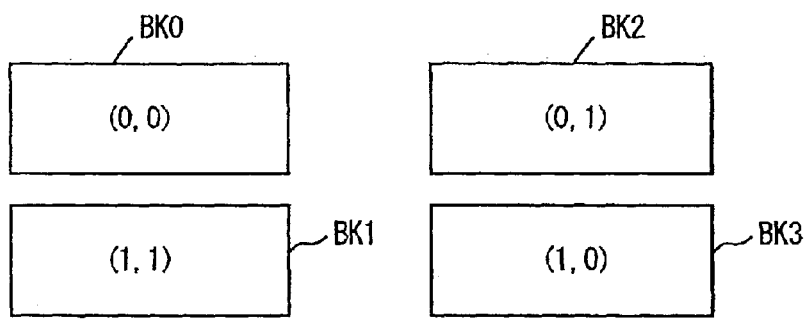
FIG. 42 is a diagram showing of an example of assignment of bank addresses in the eighth embodiment of the present invention.

FIG. 42 is a diagram showing of an example of assignment of bank addresses in the second configuration of selected memory blocks. In FIG. 42, a bank address (0, 0) is assigned to bank BK0 and a bank address (1, 1) is assigned to bank BK1. A bank address (0, 1) is assigned to bank BK2 and a bank address (1, 0) is assigned to bank BK3. Therefore, by degenerating a bank address bit at the upper order, banks BK0 and BK3, or banks BK2 and BK1 can be simultaneously selected for refreshing.

Figure 43:
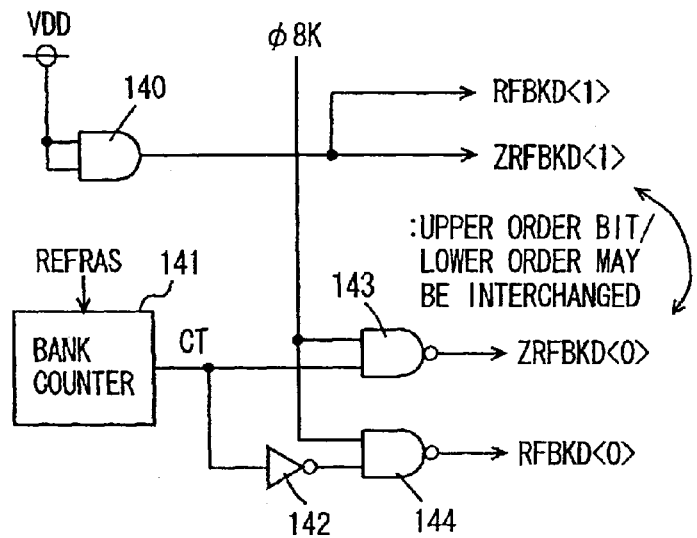
FIG. 43 is a diagram schematically showing a configuration of a bank address generation section in the eighth embodiment of the present invention.

FIG. 43 is a diagram schematically showing a configuration of a refresh bank address generation section in accordance with assignment of bank addresses shown in FIG. 42. In FIG. 43, the refresh bank address generation section includes: an AND circuit 140 receiving power supply voltage VDD at both inputs to generate upper order refresh bank address signal bits RFBKD <1> and ZRFBKD <1>; a bank counter 141 performing a count operation in response to a fall of refresh activation signal RFRAS; an inverter 142 inverting count CT of bank counter 141; an NAND circuit 143 receiving an output count CT of counter 141 and refresh control signal φ8K to generate a complementary lower order refresh bank address signal bit ZRFBKD <0>; and an NAND circuit 144 receiving an output signal of inverter 142 and refresh control signal φ8K to generate lower order refresh bank address signal bit RFBKD <0>.

Refresh control signal φ8K is at L level in the normal mode. Therefore, bits RFBK2 <1:0> and ZRFBKD <1:0> from the refresh bank address generation section are both at H level to specify all of banks BK0 to BK3.

On the other hand, when refresh control signal φ8K attains H level, NAND circuits 143 and 144 operate as inverters to change lower order bank address signal its ZRFBKD <0> and RFBKD <0> according to count CT of bank counter 141. The upper order bank address bits are in a selected state all the times. Hence, when lower order bank address signal bit RFBKD <0> is "0", banks BK0 and BK3 are specified, and when lower order bank address signal bit RFBKD <0> is "1", banks BK1 and BK2 are specified. Thus, banks at diagonal positions can be simultaneously specified.

The configuration of the refresh block address generation section shown in FIG. 40 can be used for a configuration of the refresh block address generation section specifying a memory block in a selected bank.

[Modification of Assignment of Bank Addresses]

Figure 44:
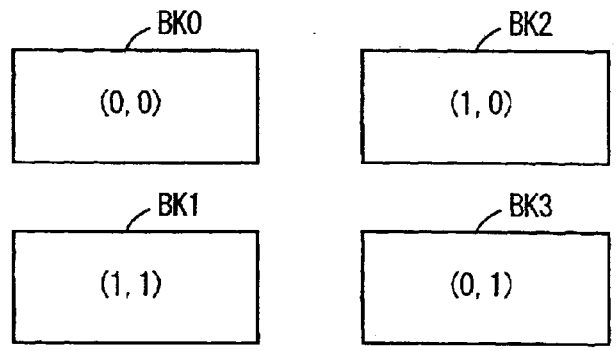
FIG. 44 is a diagram showing another configuration of bank addresses of the eighth embodiment of the present invention.

FIG. 44 is a diagram showing a modification of assignment of bank addresses. In FIG. 44, bank address (0, 0) is assigned to bank BK0, bank address (1, 1) is assigned to bank BK1, bank address (1, 0) is assigned to bank BK2, and bank address (0, 1) is assigned to bank BK3. In the case of bank address assignment shown in FIG. 44, by degenerating the lower bank address bit, banks located at diagonal position can be simultaneously driven to a selected state. For example, when bank address is (0, X), banks BK0 and BK3 are specified, while when bank address is (1, X), banks BK1 and BK2 are simultaneously specified, wherein "X" indicates an arbitrary state (a degenerated state).

In the case of bank address assignment shown in FIG. 44, by interchanging an upper order bank address bit and a low order bank address with each other in the configuration of the bank address generation section shown in FIG. 43, banks located at diagonal positions in the bank address assignment shown in FIG. 44 can be simultaneously specified.

[Third Modification]

Figure 45:
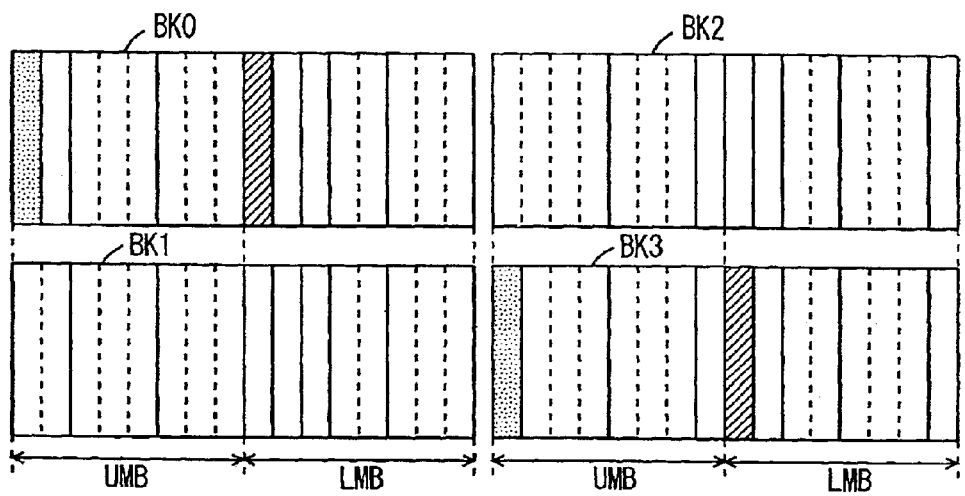
FIG. 45 is a diagram schematically showing a configuration of refresh memory blocks in the eighth embodiment of the present invention.

FIG. 45 is a diagram schematically showing a configuration of selected memory blocks in setting of the 8 K refresh cycle scheme in the third modification of the eighth embodiment of the present invention. In FIG. 45, two banks located at diagonal positions are simultaneously selected. In the selected banks, one memory block is selected in each of the upper side memory block UMB and the lower side memory block LMB for refreshing. FIG. 45 shows an example of selected memory blocks when banks BK0 and BK3 are refreshed.

In the normal mode, as shown in FIG. 39A, banks BK0 to BK3 are all selected and one memory block is selected in each of the upper side memory block UMB and the lower side memory block LMB of each of selected banks for refreshing.

When the 8 K self-refresh cycle scheme is set, since the number of selected banks is halved, a current consumption in refresh can be reduced. As a configuration for bank selection shown in FIG. 45, the bank address generation circuit shown in FIG. 43 has only to be used. A refresh block address generation circuit and a refresh word line generation circuit are each constituted using a normal refresh address counter. The upper order 3 bit s of the refresh address counter are used as a memory block specifying address and the lower order count bits of the refresh address counter are used as a word line address.

As described above, according to the eighth embodiment of the present invention, the 8 K refresh cycle scheme can be set in a mode register and when the 8 K self-refresh cycle scheme is set, the number of selected banks is halved, dissimilarly to the case of the normal mode. Thereby, the number of circuits operated in execution of refresh is halved, resulting in reduction in current consumption.

Furthermore, by selecting memory banks locating at diagonal positions in the self-refresh mode, current consumption regions are dispersed, which enables prevention of malfunctions of circuits due to local concentration of current consumption.

[Ninth Embodiment]

Figure 46:
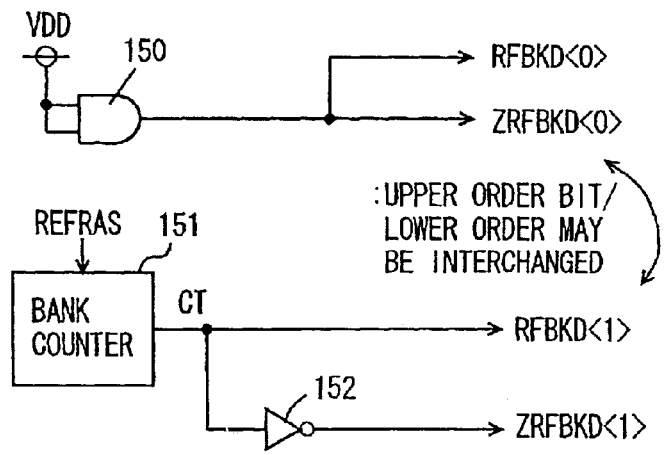
FIG. 46 is a diagram schematically showing a refresh bank address generation section in a ninth embodiment of the present invention.

FIG. 46 is a diagram schematically showing a bank address generation section according to a ninth embodiment of the present invention. In FIG. 46, the refresh bank address generation section includes: an AND circuit 150 receiving power supply voltage VDD as input signals to generate complementary refresh bank addresses RFBKD <0> and ZRFBKD <0>; a bank counter 151 performing a count operation in response to deactivation of refresh activation signal RFIS; and an inverter 152 inverting output count CT of bank counter 151 to generate complementary refresh bank address signal bit ZRFBKD <1>. Count CT of bank counter 151 is used as refresh bank address signal bit RFBKD <1>

In a case of a configuration of the bank address generation section shown in FIG. 46, as shown in FIG. 45, banks located at diagonal positions are simultaneously selected in any of the self-refresh mode and the auto-refresh mode. Two memory blocks are selected in a selected bank for refreshing. Therefore, in any of the auto-refresh mode and the self-refresh mode, the same number of memory blocks are selected for refreshing, no necessity arises for changing an operation manner in refresh between the self-refresh mode and the auto-refresh mode, simplifying a configuration for refresh control.

It should be noted that in the configuration of the refresh bank address generation section shown in FIG. 46, bank address assignment to banks BK0 to BK3 is made using the bank address assignment shown in FIG. 44. When the bank address assignment shown in FIG. 42 is used, it is only required that in the configuration of the bank address generation section shown in FIG. 46, the upper order bit and the lower order bit are interchanged in position with each other.

As described above, according to the ninth embodiment of the present invention, in the auto-refresh mode and the self-refresh mode, the number of banks to be refreshed can be half the total, thereby enabling reduction in current consumption. Furthermore, no necessity arises for changing a manner of operation between the self-refresh mode and the auto-refresh mode, simplifying a configuration for refresh control.

[Tenth Embodiment]

Figure 47:
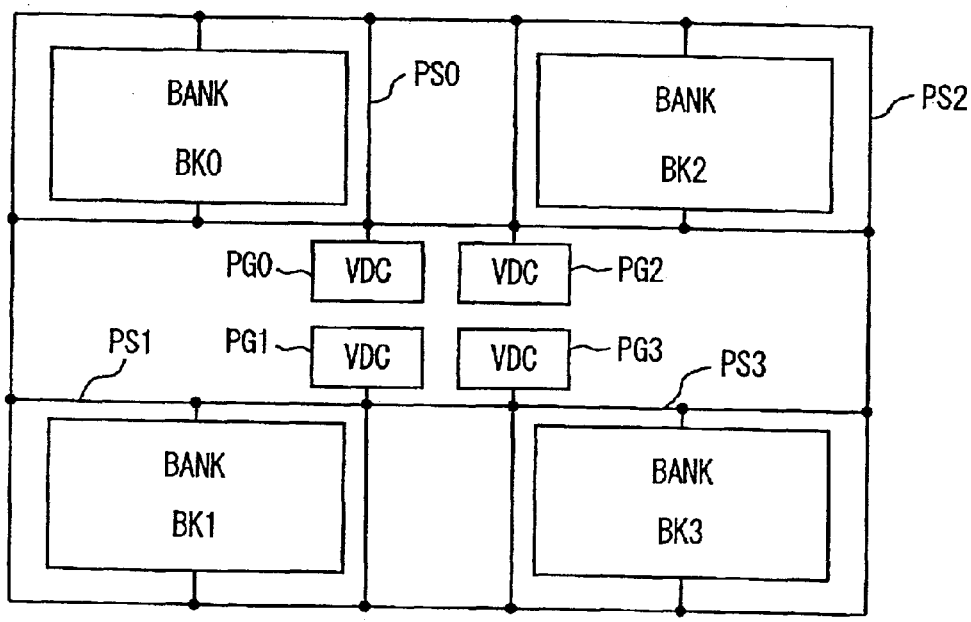
FIG. 47 is a representation schematically showing a configuration of a power supply circuit of a semiconductor memory device according to a tenth embodiment of the present invention.

FIG. 47 is a diagram schematically showing a configuration of a power supply of a semiconductor memory device according to a tenth embodiment of the present invention. In FIG. 47, internal power supply circuits (VDC) PG0 to PG3 are provided correspondingly to banks BK0 to BK3. Internal power supply circuits (VDC) each down convert an external power supply voltage to generate power supply voltages used internally, such as a peripheral power supply voltage and a memory power supply voltage. Internal power supply circuits PG0 to PG3 are coupled to power supply lines PS0 to PS3 disposed corresponding to respective banks BK0 to BK3 to transmit internal power supply voltages generated. Internal power supply lines PS0 to PS3 are interconnected to each other.

Internal power supply circuits are provided corresponding to respective banks BK0 to BK3. When a bank is operated, by operating the nearest internal power supply circuit (VDC), a current is supplied in response to variation in an internal power supply voltage at high speed to suppress variation in the internal power supply voltage (the array power supply voltage or the peripheral power supply voltage). Furthermore, by interconnecting power supply lines PS0 to PS3 to each other, a relative parasitic capacitance of power supply lines is increased, thereby enabling stable supply of a power supply voltage.

Figure 48:
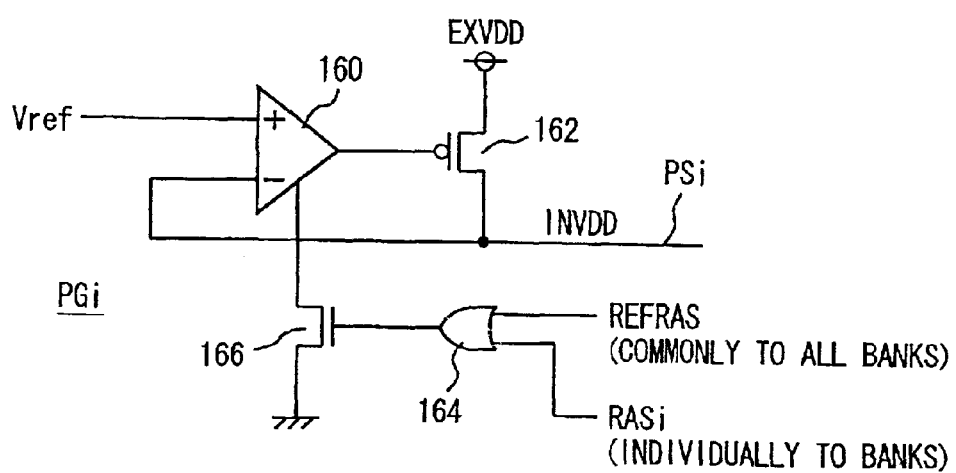
FIG. 48 is a diagram showing an example of a configuration of an internal power supply circuit (VDC) shown in FIG. 47.

FIG. 48 is a diagram showing an example of a configuration of internal power supply circuit (VDC) PG0 to PG3 shown in FIG. 47. FIG. 48 shows representatively a configuration of one internal power supply circuit (VDC) PGi because the internal power supply circuits are the same in configuration. In FIG. 48, internal power supply circuit PGi includes: a comparison circuit 160 for comparing internal power supply voltage INVDD on internal power supply line PSi with a reference voltage VREF when activated; a current drive transistor 162 for supplying a current to internal power supply line PSi from an external power supply node receiving external power supply voltage EXVDD according to an output signal of comparison circuit 160; an OR circuit 164 receiving refresh activation signal REFRAS and an array activation signal RASi; and a current source transistor 166 rendered conductive, when an output signal of OR circuit 164 is at H level, to form a current path for comparison circuit 160. Current drive transistor 162 is constituted of a P channel MOS transistor and current source transistor 166 is constituted of an N channel MOS transistor.

Refresh activation signal REFRAS is a signal to be activated commonly for all the banks in execution of refresh and refresh is executed on selected memory blocks while refresh activation signal REFRAS is active. Specifically, a period of time when a word line is selected in refresh is determined by refresh activation signal REFRAS. On the other hand, array activation signal RASi is a signal to be generated through combination of a bank specifying signal and an externally applied active command instructing array activation and activated for each respective bank. That is, in the normal access mode, array activation signal RASi is activated for a bank specified by an external address signal.

Therefore, in the refresh mode, an output signal of OR circuit 164 attains H level for all of the banks and all of internal power supply circuits (VDC) PG0 to PG3 provided to all of the banks are activated to operate. Therefore, even when banks located at diagonal positions are selected among banks BK0 to MK3 for refreshing, a refresh operation can be executed with stable supply of power supply voltage.

On the other hand, by operating only internal power supply circuit (VDC) provided for a selected bank in the normal access mode, a stable power supply voltage is supplied to a selected bank. In addition, supply of power supply voltage to non-selected banks is ceased, and a current consumption can be reduced.

It should be noted that in the power supply configuration shown in FIG. 47, power supply lines may be arranged on memory arrays of banks BK0 to BK3 in a meshed shape. Furthermore, while internal power supply circuits (VDC) are shown being concentrated in the central region between banks BK0 to BK3, internal power supply circuits (VDC) may be dispersed correspondingly to respective banks BK0 to BK3.

Furthermore, internal power supply circuits PG0 to PG3 each may be configured to level-shift internal power supply voltage INVDD for comparison with reference voltage Vref.

As described above, according to the tenth embodiment of the present invention, internal power supply circuits are disposed corresponding to the respective banks and in the refresh mode, all of the internal power supply circuits are operated, and refresh operation can be performed stably.

It should be noted that in the auto-refresh mode in the normal mode, since refresh is executed on all of the banks, refresh activation signal REFRAS is also activated in the auto-refresh mode to operate all internal power supply power circuits (VDC) PG0 to PG3 provided corresponding to the respective banks.

[Configuration of Internal Control Signal Generation Section]

Figure 49:
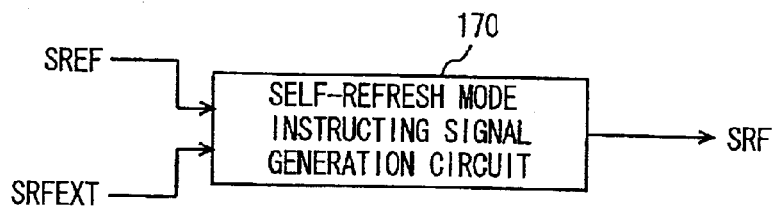
FIG. 49 is a diagram schematically showing a configuration of a self-refresh mode instructing signal generation section in the tenth embodiment of the present invention.

FIG. 49 is a diagram schematically showing a configuration of a section generating self-refresh mode instructing signal SRF. In FIG. 49, a self-refresh mode instructing signal generation section 170 receives external self-refresh entry command SREF to activate self-refresh mode instructing signal SRF and deactivates self-refresh mode instructing signal SRF in response to self-refresh exit command SRFEXT. Self-refresh mode instructing signal generation circuit 170 is provided in the central control circuit shown in FIG. 1A or 1B and constituted of, for example, a set/reset flip-flop. When self-refresh entry command SREF is applied, self-refresh mode instructing signal SRF is activated and when self-refresh exit command SRFEXT instructing completion of the self refresh mode is applied, self-refresh mode instructing signal SRF is deactivated.

Self-refresh mode instructing signal generation circuit 170 corresponds to command decode circuit 20 shown in FIG. 2.

Figure 50:
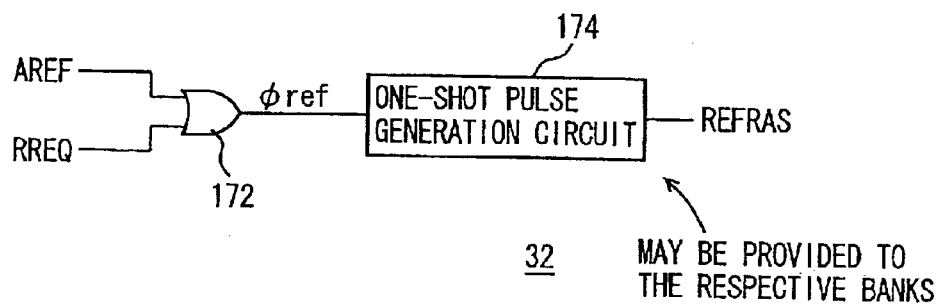
FIG. 50 is a diagram schematically showing a configuration of a refresh activation signal generation section in the tenth embodiment of the present invention.

FIG. 50 is a diagram schematically showing a configuration of refresh activation circuit 32 (see FIG. 7) generating refresh activation signal REFRAS. In FIG. 50, refresh activation circuit 32 includes: an OR circuit 172 receiving auto refresh command AREF and refresh request RREQ; and a one-shot pulse generation circuit 174 outputting a one-shot pulse signal as refresh activation signal REFRAS according to an output signal φref of OR circuit 172. A time width of refresh activation signal REFRAS outputted by one-shot pulse generation circuit 174 is predetermined.

One-shot pulse generation circuit 174 may be provided commonly to all of banks BK0 to BK3, or alternatively, may be disposed corresponding to each of banks BK0 to BK3.

Figure 51:
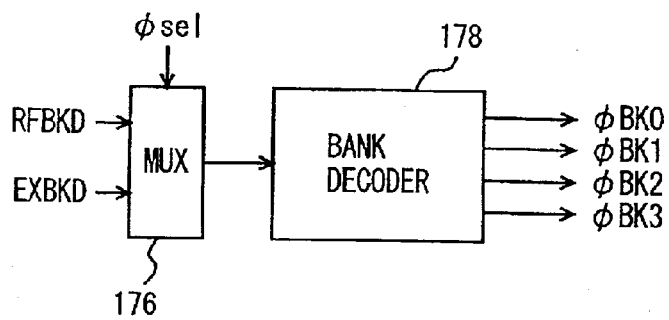
FIG. 51 is a diagram schematically showing an example of a configuration of a bank specifying signal generation section in the tenth embodiment of the present invention.

FIG. 51 is a diagram schematically showing a configuration of a section generating a bank specifying signal. In FIG. 50, a bank specifying signal generation section includes: a multiplexer (MUX) 176 for selecting one of refresh bank address signal RFBKD and external bank address signal EXBKD according to a select signal φSEL; and a bank decoder 178 for decoding a bank address signal from multiplexer 176 to activate selectively bank specifying signals φBK0 to φBK3 in accordance with the result of decoding. Bank specifying signals φBK0 to φBK3 specify respective banks BK0 to BK3. Select signal φSEL is activated in the auto-refresh mode and the self-refresh mode and causes multiplexer 176 to select refresh bank address signal RFBKD when activated. In the normal mode of data accessing, one bank is designated in accordance with the external bank address signal, while in the refresh mode, the refresh bank address signal is degenerated and a predetermined number of banks are designated.

Bank decoder 178 is disposed in the central control circuit shown in FIG. 1A or 1B.

Figure 52:
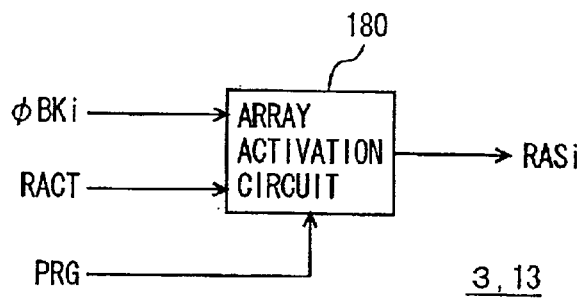
FIG. 52 is a diagram schematically showing a configuration of an array activation signal generation section in the tenth embodiment of the present invention.

FIG. 52 is a diagram schematically showing a configuration of a section generating an array activation signal activating a row select operation in each bank. In FIG. 52, an array activation circuit 180 activates a corresponding array activation signal RASi when bank specifying signal φBki and row active command RACT instructing row selection are applied, and deactivates array activation signal RASi when bank specifying signal φBki and a precharge command PRG instructing completion of row select operation are applied.

Array activation circuit 180 may be provided in the central control circuit to individually transmit array activation signals RASi to the respective banks. Furthermore, alternatively, array activation circuits 180 may be provided in each bank control circuit provided corresponding to each bank. Specifically, a configuration may be employed in which row active instructing signal RACT instructing row activation and precharge command PRG instructing completion of a row selection are applied commonly to all the banks and activation/deactivation of a corresponding array activation signal RSi is performed according to bank specifying signal φBKi in each bank control circuit.

A row select operation is started internally according to array activation signal RASi (in the normal operation mode).

Figure 53:
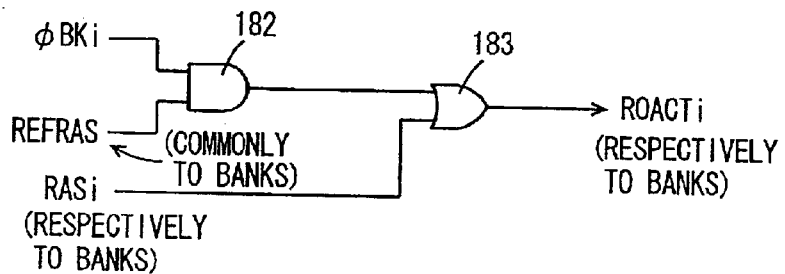
FIG. 53 is a diagram schematically showing an example of the configuration of an array activation signal generation section in the tenth embodiment of the present invention.

FIG. 53 is a diagram schematically showing a configuration of an array activation signal generation section provided in each bank control circuit. In FIG. 53, the array activation signal generation section includes: an AND circuit 182 receiving bank specifying signal φBKi and refresh activation signal REFRAS; and an OR circuit 183 receiving array activation signal RASi and an output signal of AND circuit 182 to generate array activation signal ROACTi.

In the refresh mode, when refresh activation signal REFRAS and bank specifying signal φBki both attain an active state, an output signal of AND circuit 182 attains an active state and row array activation signal ROACTi is activated in a corresponding bank.

On the other hand, in the normal operation mode in which an external access is made, array activation signal ROACTi is activated according to normal array activation signal RASi.

Bank specifying signal φBki is kept in a latch state in a period when refresh activation signal REFRAS is at H level.

Furthermore, instead of the configuration shown in FIG. 53, a configuration may be employed in which one-shot pulse generation circuit 174 shown in FIG. 50 is provided in each bank control circuit and refresh activation signal REFRAS is generated according to bank specifying signal φBki in each bank control circuit.

Figure 54:
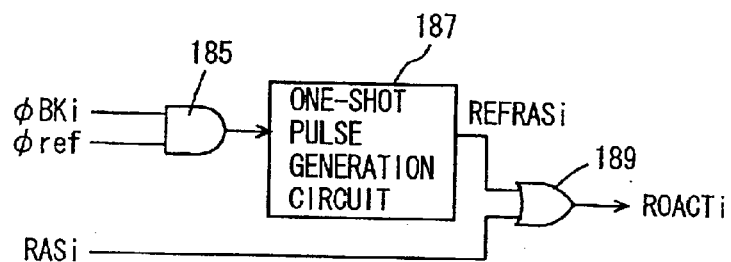
FIG. 54 is a diagram schematically showing another configuration of the array activation signal generation section in the tenth embodiment of the present invention.

Specifically, as shown in FIG. 54, a one-shot pulse signal is generated by one-shot pulse generation circuit 187 according to an output signal of AND circuit 185 receiving bank specifying signal φBki and refresh instructing signal φREF. Refresh activation signal RFRAS for a bank is generated from one-shot pulse generation circuit 187. Array activation signal ROCTi for a corresponding bank is generated by OR circuit 180 receiving bank refresh activation signal RFRASi and normal array activation signal RASi.

The configuration shown in FIG. 54 is provided in each of bank control circuits provided corresponding to the respective banks. By use of the configuration shown in FIG. 54, too, a refresh operation can be selectively performed in each bank according to bank specifying signal φBki.

Figure 55:
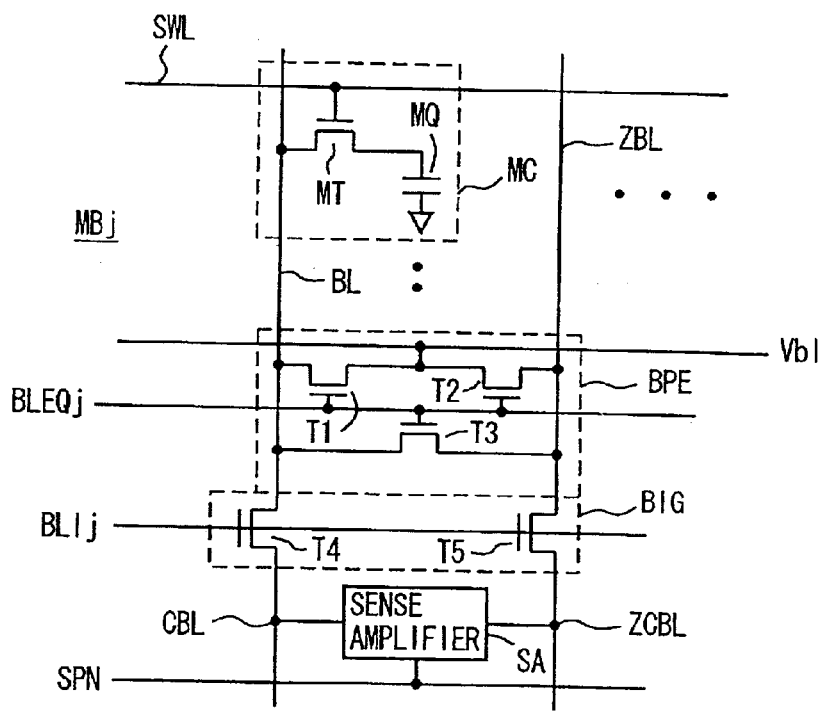
FIG. 55 is a diagram schematically showing a configuration of an array section of a semiconductor memory device according to the tenth embodiment of the present invention.

FIG. 55 is a diagram showing a configuration of a memory block. Schematically shown in FIG. 55 is a configuration of a section corresponding to memory cells on one column of memory block MBa. In FIG. 55, a memory block MBj includes memory cells MC arranged in a matrix. A pair of bit lines BL and ZBL is disposed corresponding to each column of memory cells MC and a subword line SWL is disposed corresponding to each row of memory cells. FIG. 55 representatively shows memory cell MC disposed at the intersection between subword line SWL and bit line BL Memory cell MC includes a capacitor MQ for storing information, and an access transistor MT coupling memory capacitor MQ to bit line BL in response to a signal potential on subword line SWL. Access transistor MT is constituted of an N channel MOS transistor.

Further, to bit lines BL and ZBL, there are provided: a bit line precharge/equalize circuit BPE precharging bit lines BL and ZBL to a prescribed potential Vb1 level when a bit line equalize instructing signal BLEQj is activated; and a bit line isolation gate BIG coupling bit lines BL and ZBL to common bit lines CBL and ZCBL according to a bit line isolation instructing signal BLIj.

Bit line precharge/equalize circuit BPE includes: N channel MOS transistors T1 and T2 rendered conductive, when bit line equalize instructing signal BLEQa is at H level, to transmit a precharge voltage Vb1 to bit lines BL and ZBL; and an N channel MOS transistor T3 rendered conductive, in response to H level of bit line equalize instructing signal BLEQa, to electrically short circuit bit lines BL and ZBL.

Bit line isolation gate BIG includes N channel MOS transistors T4 and T5 connecting bit lines BL and ZBL to respective common bit lines CBL and ZCBL while bit line isolation signal BLIj is at H level.

Common bit lines CBL and ZCBL are coupled to bit lines of an adjacent memory block MB(j+1) not shown through a bit line isolation gate (not shown). A sense amplifier SA is provided to common bit lines CBL and ZCBL and is activated, in response to a sense amplifier activation signal SPN, to differentially amplify and latches potentials on common bit lines CBL and ZCBL.

When memory block MBj is selected, bit line equalize instructing signal BLEQj attains an inactive state to deactivate bit line precharge/equalize circuit BPE, and bit lines BL and ZBL are kept in a floating state at precharge voltage level Vb1. Then, subword line SWL is driven to a selected state, and access transistor MT is made conductive and transmits electric charges stored in memory capacitor MQ onto bit line BL. Bit line isolation gate BIG is in a conductive state to couple bit lines BL and ZBL to common bit lines CBL and ZCBL. When storage data of memory cell MC read out onto bit line BL is transmitted onto common bit line CBL, sense amplifier activation signal SPN is activated and sense amplifier SA differentially amplifies voltages on common bit lines CBL and ZCBL.

Here, since a memory cell is not connected to bit line ZBL, bit line ZBL and common bit line ZCBL maintain precharge voltage Vb1 level.

After a sense operation by sense amplifier SA is completed, a column select operation is performed and write/read of data is performed on a selected memory cell.

Figure 56:
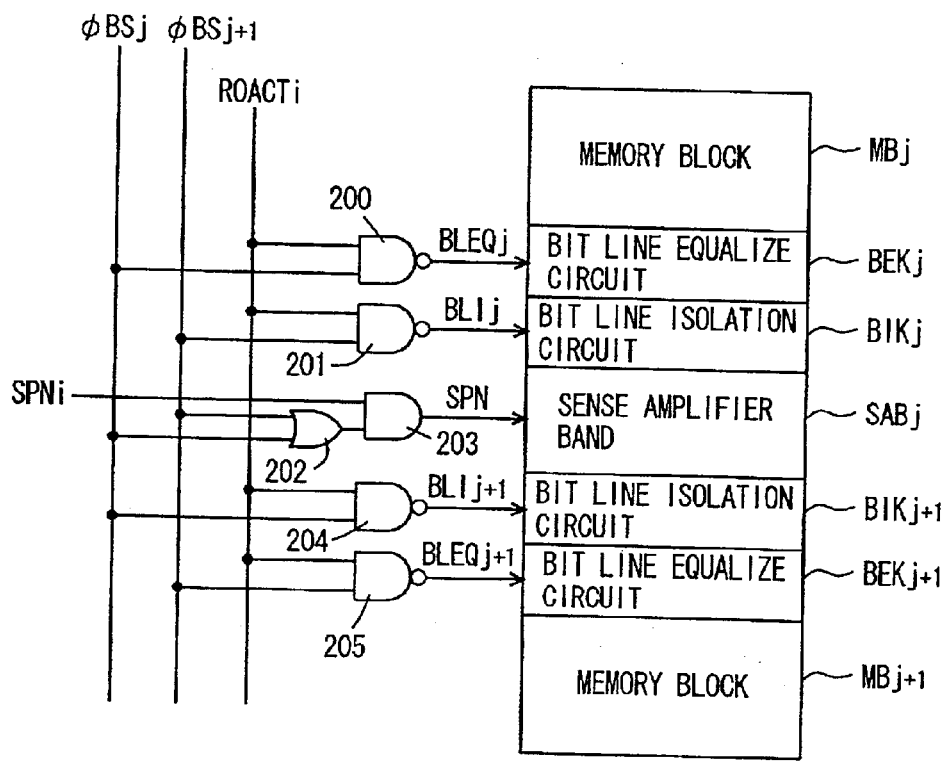
FIG. 56 is a diagram schematically showing an example of a configuration of a bit line peripheral circuit and a local control circuit combined in the tenth embodiment of the present invention.

FIG. 56 is a diagram schematically showing a configuration of a section related to two memory blocks MBj and MBj+1 in one bank. In FIG. 56, a bit line equalize circuit BEKj and bit line isolation circuit BIKj are provided between memory block MBj and a sense amplifier band SABj. Bit line equalize circuit BEKj includes bit line precharge/equalize circuit BPE shown in FIG. 55 and bit line isolation circuit BIKj includes bit line isolation gate BIG shown in FIG. 55. Sense amplifier band SABj includes a sense amplifier SA shown in FIG. 55. Sense amplifiers SA are arranged at alternate columns in sense amplifier band SABj. Therefore, bit line precharge/equalize circuits BPE are also arranged at alternate columns in bit line equalize circuit BEKj and bit line isolation gates BIG are also arranged at alternate columns in bit line equalize circuit BEKj. That is, there is employed an alternate arrangement shared sense amplifier configuration.

Bit line isolation circuit BIKj+1 and bit line equalize circuit BEKj+1 are disposed between sense amplifier band SABj and memory block MBj+1. Bit line isolation circuit BIKj+1 includes a bit line isolation gate for isolating a bit line pair of memory block MBj+1 from a sense amplifier of sense amplifier band SABj. Bit line isolation circuit BEKj+1 includes a bit line precharge/equalize circuit for precharging and equalizing a bit line pair of memory block MBj+1.

Local row control circuits are provided corresponding to the sense amplifier bands for controlling bit line peripheral circuitry on a memory block basis.

Local row control circuit includes: an AND circuit 200 receiving array activation signal ROACTi and memory block specifying signal φBSj to generate bit line equalize instructing signal BLEQj and apply it to bit line equalize circuit BEKj; a NAND circuit 201 receiving array activation signal ROACTi and memory block specifying signal BSj+1 to generate bit line isolation instructing signal BLIj and apply it to bit line isolation circuit BIKj; an OR circuit 202 receiving memory block specifying signal φBSj+1; an AND circuit 203 receiving an output signal of OR circuit 202 and main sense amplifier activation signal SPNi to generate sense amplifier activation signal SPN and apply it to sense amplifier band SABj; a NAMD circuit 204 receiving memory block specifying signal φBSj and array activation signal ROACTi to generate bit line isolation instructing signal BLIj+1 and apply it to bit line isolation circuit BIKj+1; and a NAND circuit 205 receiving memory block specifying signal φBSj+1 and array activation signal ROACTi to generate bit line equalize instructing signal BLEQj+1 and apply it to bit line equalize circuit BEKj+1.

AND circuits 200, 201, 204 and 205 all have a level conversion function and each convert a signal of an amplitude of the peripheral power supply voltage level to a signal of amplitude of a high voltage level. With the bit line isolation signal at a high voltage, a threshold voltage loss in bit line isolation gate BIG is prevented and bit lines BL and ZBL are connected to a corresponding sense amplifier circuit through low resistance. Furthermore, in bit line precharge/equalize circuit as well, resistance values of precharging/equalizing MOS transistors are reduced to drive bit lines BL and ZBL to an intermediate voltage at high speed.

Memory block specifying signal φBSj indicates that memory block MBj has been specified and memory block specifying signal φBSj+1 indicates that memory block MBj+1 has been selected.

In the configuration of a local row control circuit shown in FIG. 56, array activation signal ROACTi is at L level in the standby state, and bit line equalize instructing signals BLEQj and BLEQj+1 and bit line isolation instructing signals BLIj and BLIj+1 are at H level of a high voltage level. Therefore, columns of memory blocks MBj and MBj+1 are precharged and equalized to precharge voltage Vb1 level by bit line precharge/equalize circuit BPE shown in FIG. 55. In bit line isolation circuits BIKj and BIKj–1, bit line isolation gate BIG is conductive and bit lines of memory blocks MBj and MBj+1 are coupled to corresponding sense amplifiers of sense amplifier band SABj+1.

When array activation signal ROACTi is activated, NAND circuits 200, 201, 204 and 205 operate as inverters. When memory block MBj is selected, memory block specifying signal φBSj goes to H level, while memory block specifying signal φBSj+1 maintains the L level. Therefore, bit line equalize instructing signal BLEQj from NAND circuit 200 goes to L level and bit line equalize circuit BEKj ceases a bit line precharge/equalize operation on memory block MBj. On the other hand, bit line isolation instructing signal BLIj maintains the H level and bit line isolation circuit BIKj is conductive since memory block specifying signal φBSj+1 is at L level.

Since memory block specifying signal φBSj is at H level, bit line isolation signal BLIj+1 goes to L level, bit line isolation circuit BIKj+1 enters a non-conductive state to isolate sense amplifier band SABj from memory block MBj+1. Since bit line equalize instructing signal BLEQj+1 from NAND circuit 205 maintains the H level, a bit line precharge/equalize operation by bit line equalize circuit BELj+1 is performed in memory block MBj+1.

When a prescribed time elapses, main sense amplifier activation signal SPNi attains an active state at H level. Responsively, sense amplifier activation signal SPN from AND circuit 203 goes to H level to start a sense operation by sense amplifier SA included in sense amplifier band SABj. Sense amplifier SA includes P channel MOS transistors and N channel MOS transistors. Therefore, sense amplifier activation signal SPN includes a P sense amplifier activation signal for driving a P sense amplifier constituted of P channel MOS transistors, and an N sense amplifier activation signal for activating an N sense amplifier constituted of N channel MOS transistors. Both sense amplifier activation signals each assume opposite logical levels in respective states of activation and deactivation. While both sense amplifier activation signals are individually generated in a local row control circuit, one sense amplifier activation signal SPN is shown representatively in FIG. 56. Sense amplifier activation signal SPN shown in FIG. 56 corresponds to the N sense amplifier activation signal and an inverted signal thereof corresponds to the P sense amplifier activation signal.

When memory blocks MBj and MBj+1 are both in a non-selected state, memory block specifying signals φBSj and φBSj+1 are both at L level and therefore, memory blocks MBj and MBj+1 are coupled to sense amplifier band SABj through respective bit line isolation circuits BIKj and BIKj+1, as in the standby state. Bit line equalize circuits BEKj and BEKj+1 are in an active state and precharge/equalize operations on memory blocks MBj and MBj+1 are continued.

Figure 57:
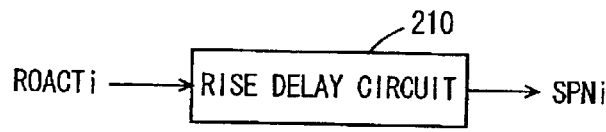
FIG. 57 is a diagram showing an example of a configuration of a main sense amplifier activation signal generation section shown in FIG. 56.

FIG. 57 is a diagram showing a configuration of a section generating main sense amplifier activation signal SPNi shown in FIG. 56. In FIG. 57, the sense amplifier activation signal generation section includes a rise delay circuit 210 for delaying a rise of array activation signal ROACTi by a prescribed time. Sense amplifier activation signal SPNi is generated by rise delay circuit 210 and transmitted commonly to memory blocks of a corresponding bank BKi.

Figure 58:
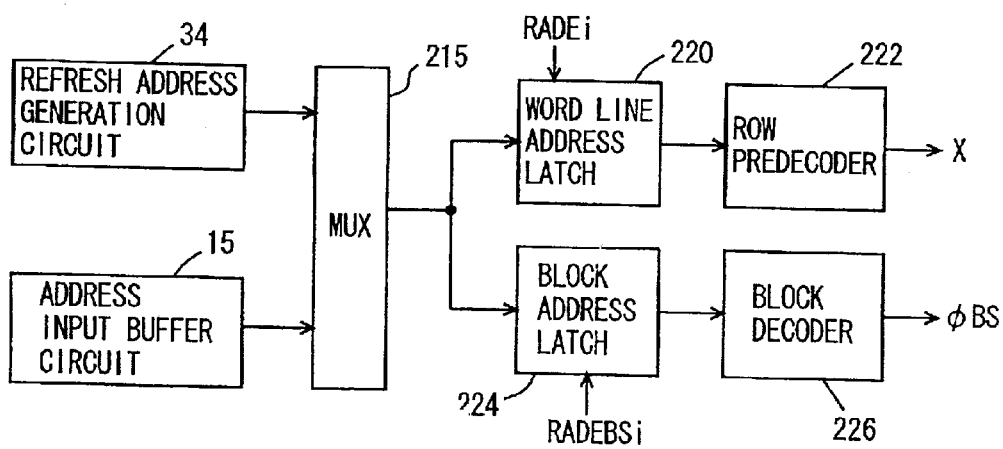
FIG. 58 is a block diagram schematically showing a configuration of an internal address signal generation section in the tenth embodiment of the present invention.

FIG. 58 is a block diagram schematically showing a configuration of an address generation section of each bank. One of internal addresses from a refresh address generation circuit 34 and an address input buffer circuit 15 is selected by a multiplexer (MUX) 215 and applied to each bank. FIG. 58 shows representatively a configuration of an address generation section of one bank. In FIG. 58, the address generation section includes: a word line address latch 220 latching a word line address applied from multiplexer 215 according to a row address enable signal RADEi; a row predecoder 222 predecoding an address signal latched by word line address latch 220 to generate a row predecode signal X; a block address latch 224 latching an internal block address applied from multiplexer 215 according to a block address latch enable signal RADEBSi; and a block decoder 226 decoding a block address signal latched to block address latch 224 to generate block specifying signal φBS.

By providing word line address latch 220 and block address latch 224 correspondingly to each bank, address designation can be performed in each bank independently from the other bank(s).

Figure 59:
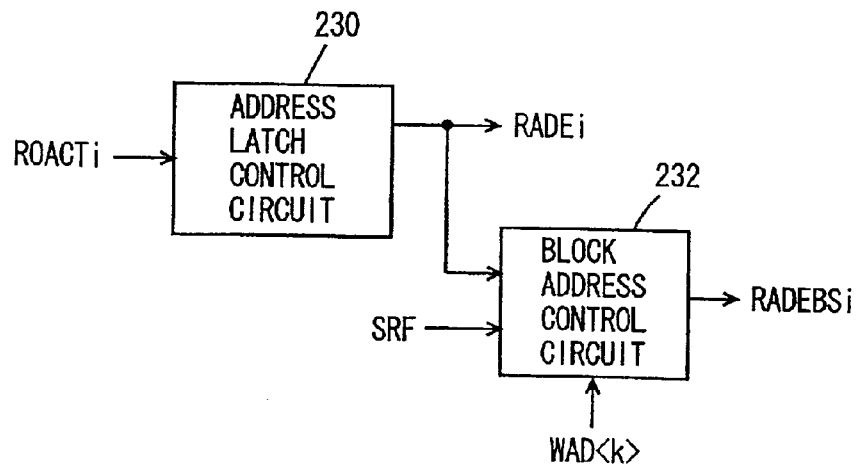
FIG. 59 is a block diagram schematically showing a configuration of an address latch control signal generation section in the tenth embodiment of the present invention.

FIG. 59 is a block diagram schematically showing a configuration of a row address control section for generating row address enable signal RADEi and row address latch enable signal RADEBSi shown in FIG. 58. The configuration shown in FIG. 59 is also provided in a bank control circuit provided for each bank. In FIG. 59, the address control circuit includes: an address latch control circuit 230 generating row address enable signal RADEi in response to array activation signal ROACTi; and a block address control circuit 232 generating block address enable signal RABEBSi according to address enable signal RADEi, self-refresh mode instructing signal SRF and a specific refresh address counter bit RQ <k> (a word line address signal bit WAD <k>).

Row address enable signal RABEi is generated appropriately depending on a configuration of an address latch. Specifically, a word line address latch may be configured such that row address enable signal RABEi is generated in a one-shot pulse form in response to activation of array activation signal RACTi, and during the generation of the one-shot pulse the address latch circuit takes in an applied address. Alternatively, another configuration may also be employed in which while array activation signal ROACTi is inactive, row address enable signal RADEi is also in an inactive state, and the address latch is in a through state in this state, and the address latch enters a latch state in response to activation of array activation signal ROACTi to latch an address signal taken in the through state.

Block address control circuit 232 sets block address enable signal RADEBSi in a latch state over a plurality of refresh cycles in the self-refresh mode. When a plurality of refresh cycles are completed, block address enable signal RADEBSi is set to a reset state temporarily. Therefore, block address latch 224 stays in a latch state over a plurality of refresh cycles in the self-refresh mode with a block address kept unchanged. At this time, block decoder 226 is not reset either and a selected block specifying signal is held in a selected state over the plurality of cycles.

Figure 60:
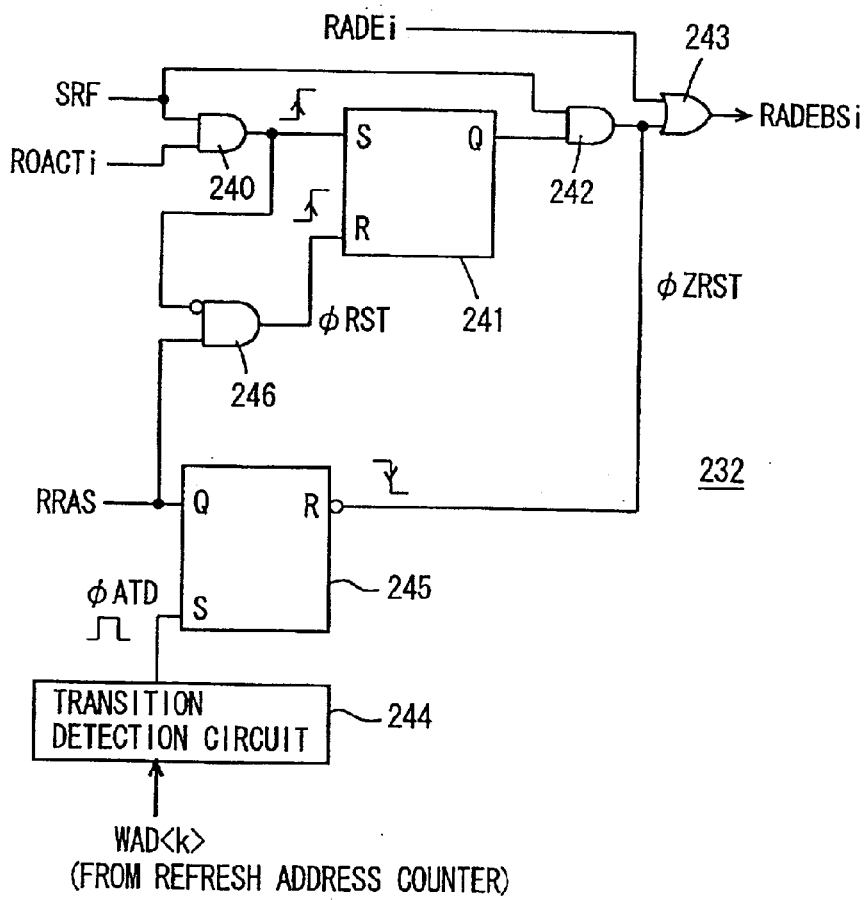
FIG. 60 is a block diagram showing an example of a configuration of a block address control circuit shown in FIG. 59.

FIG. 60 is a block diagram showing an example of a configuration of block address control circuit 232 shown in FIG. 59. In FIG. 60, block address control circuit 232 includes: an AND circuit 240 receiving self-refresh mode instructing signal SRF and array activation signal ROACTi; a set/reset flip-flop 241 set in response to a rise of an output signal of AND circuit 240; an AND circuit 242 receiving self-refresh mode instructing signal SRF and an output signal from the output Q of set/reset flip-flop 241; an OR circuit 243 receiving an output signal of AND circuit 242 and row address enable signal RADEi to generate block address enable signal RADEBSi; a transition detection circuit 244 detecting a transition in a specific bit WAD <k> of a word line address from a refresh address counter; a flip-flop 245 set in response to output signal φATD of change detection circuit 244 and reset in response to a rise of an output signal from AND circuit 240; and a gate circuit 246 generating reset signal φRST resetting set/reset flip-flop 241 in response to a signal φRSTF from the output Q of flip-flop 245 and an output signal of AND circuit 240.

Gate circuit 246 raises its output signal φRST to H level when an output signal of AND circuit 240 is at L level and output signal φRSTF of flip-flop 245 is at H level. Set/reset flip-flop 241 is reset in response to a rise of reset signal φRST.

Figure 61:
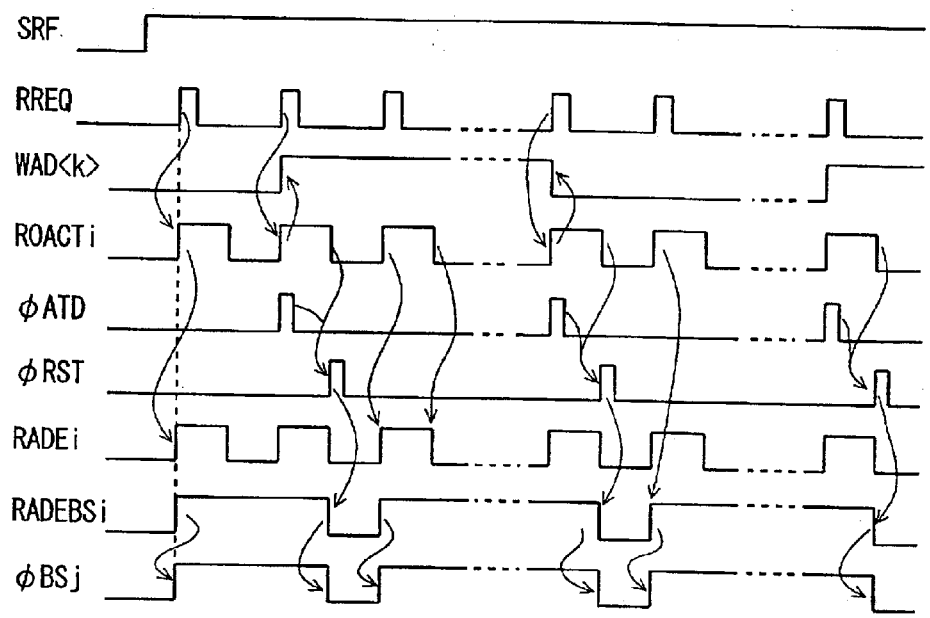
FIG. 61 is a timing chart showing operation of the block address control circuit shown in FIG. 60.

Now, description will be given of operation of block address control circuit 232 shown in FIG. 60 with reference to a timing chart shown in FIG. 61.

In the self-refresh mode, self-refresh mode instructing signal SRF is held at H level. When refresh request RREQ is generated, refresh array activation signal RRAS (REFRAS) is generated according to refresh request PREQ, and in response, array activation signal ROACTi goes to H level and is kept at H level for a prescribed period. Row address enable signal RADEi is activated in response to activation of array activation signal ROACTi to latch a row address. In block address control circuit 232, set/reset flip-flop 241 is set in response to a rise of array activation signal ROACTi and responsively, block address enable signal RADEDSi rises to H level.

In the next cycle, when specific word line address bit WAD <k> changes according to refresh request RREQ, transition detection signal φATT is generated by transition detection circuit 244 to set set/reset flip-flop 245. At this time, array activation signal ROACTi is at H level and reset signal φRST is not generated or activated and row address enable signal RADE <i> is again activated according to array activation signal ROACTi. On the other hand, block address enable signal RADEBSi maintains the active state and block address latch 224 shown in FIG. 58 is in a latch state. In this state, block decoder 226 is not reset either and block specifying signal φBSj maintains an active state at H level together.

When array activation signal ROACTi is deactivated, reset signal φRST goes to H level, set/reset flip-flop 241 is reset and block address enable signal RADEBSi is reset to L level. In response to this, block specifying signal φBSj is also driven to a non-selected state.

When array activation signal ROACTi rises to H level according to refresh request RREQ, row address enable signal RABEi and block address enable signal RADEBSi are both driven to an active state. When array activation signal ROACTi is deactivated, row address enable signal RADEi is deactivated, word line latch 220 shown in FIG. 58 enters a reset state and row predecoder 222 enters a reset state as well. On the other hand, block address enable signal RADEBSi maintains its set state because of no transition of refresh word line address bit WAD <k>. When block address enable signal RADEBSi is reset, set/reset flip-flop 245 is reset again.

When refresh request RREQ is repeatedly issued and refresh address bit WAD <k> changes, in response to this transition, transition detection signal φATD is generated from transition detection circuit 244 to set set/reset flip-flop 245. When array activation signal ROACTi is deactivated, reset signal φRST from a gate circuit 246 is activated and in response, set/reset flip-flop 241 is reset and block address enable signal RADEBSi is also reset. In response, block specifying signal φBSj is also deactivated. Subsequently, block address enable signal RADBSi is reset together with memory block specifying signal φBSj after a refresh cycle is completed in response to a transition in specific refresh address signal bit WAD <k>.

Where refresh is repeatedly executed on one memory block in the self-refresh mode, block specifying signal φBSj for a selected block is maintained in a selected state till a prescribed number of word lines are selected and refresh is executed on these selected word lines. Therefore, the number of times of operation of circuits related to block specifying signal φBS can be reduced, and current consumption can be reduced.

When refresh on one memory block is over and refresh is executed on another memory block, word line address bit values of a refresh address counter are always updated to initial values. Therefore, a transition in refresh address can be detected when memory block is changed over even if a specific word line address WAB <k> is employed. Specifically, specific word line address signal bit WAD <k> is at "1" and changes to "0" when a memory block is changed over. Therefore, in execution of refresh on another memory block, block address decode enable signal RADEBSi is temporarily set in a reset state, and a block specifying signal for the next memory block can be activated reliably.

As described above, according to the tenth embodiment of the present invention, in the self-refresh mode, a refresh operation is performed such that a block address specifying a memory block is held over a plurality of refresh cycles. Thus, the number of times of operation of a section generating a memory block specifying signal can be reduced to decrease current consumption.

Eleventh Embodiment

Figure 62:
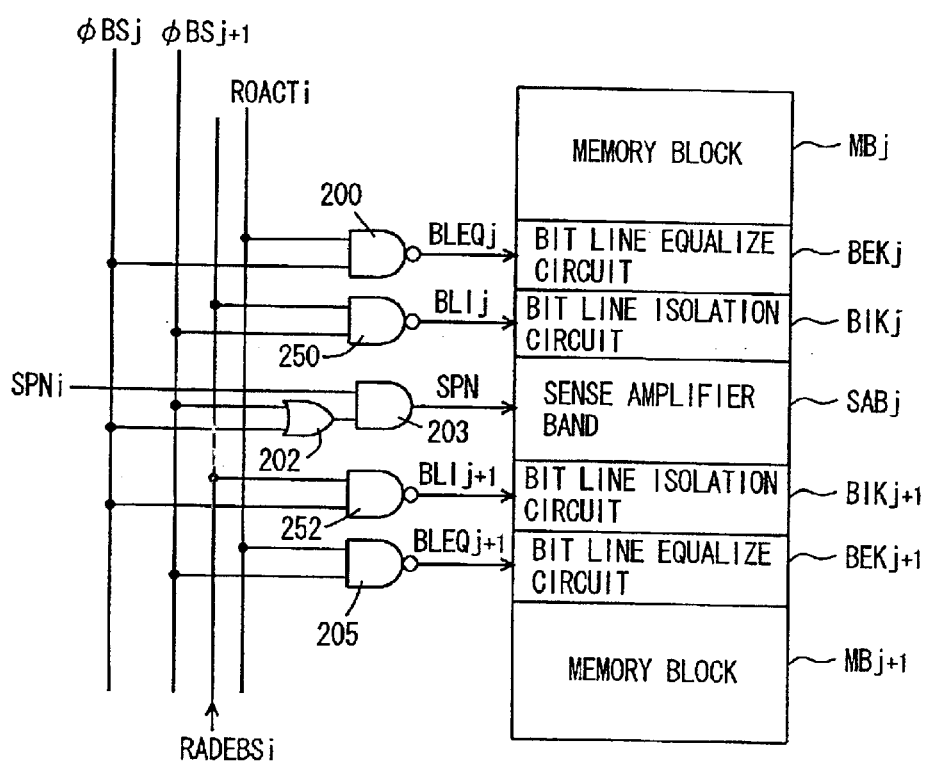
FIG. 62 is a diagram showing an example of a configuration of a local control circuit of a semiconductor memory device according to an eleventh embodiment of the present invention.

FIG. 62 is a diagram showing a configuration of a main section of a semiconductor memory device according to an eleventh embodiment of the present invention. The configuration shown in FIG. 62 is different from the configuration shown in FIG. 56 in the following point. That is, a NAND circuit 250 generating bit line isolation instructing signal BLIj for bit line isolation circuit BIKj receives block address enable signal RDEBSi and memory block specifying signal φBSj+1. NAND circuit 252 generating bit line isolation instructing signal BLIj+1 for bit line isolation circuit BIKj+1 receives block address enable signal RADEBSi and memory block specifying signal φBSj. The other part of the configuration shown in FIG. 62 is the same as that of the configuration shown in FIG. 56, corresponding constituents are attached by the same reference numerals and description thereof is omitted.

Block address enable signal RADEBSi is generated from OR circuit 243 shown in FIG. 60. Therefore, in the self-refresh mode, row address enable signal RADEBSi is held in an active state (at H level) over a plurality of refresh cycles. Hence, bit line isolation circuits BIKj and BIKj+1 maintain a conductive state over a plurality of refresh cycles, thereby enabling reduction in current consumption in NAND circuits 250 and 252 generating bit line isolation instructing signals BLIj and BLIj+1. Particularly, NAND circuits 250 and 252 have a level conversion function and use a boosted voltage higher than an normal power supply voltage. Therefore, by reducing the number of times of charging/discharging of bit line isolation instructing signals BLIj and BLIj+1, current consumption can be reduced more, compared with that in an operation of a circuit using the normal power supply voltage.

As described above, according to the eleventh embodiment of the present invention, in the self-refresh mode, a state of bit line isolation instructing signal is maintained over a plurality of refresh cycles, thereby enabling reduction in current consumption in the self-refresh mode.

Meanwhile, NAND circuits 250 and 252 may be provided with a signal obtained by performing an OR operation on array activation signal ROACTi and an output signal of AND circuit 242 shown in FIG. 60. In the normal operation mode, bit line isolation instructing signals BLIj and BLIj+1 are activated/deactivated according to array activation signal ROACTi, while in the self-refresh mode, bit line isolation instructing signals BLIj and BLIj+1 are controlled according to row block address enable signal RADEBSi.

[Twelfth Embodiment]

Figure 63:
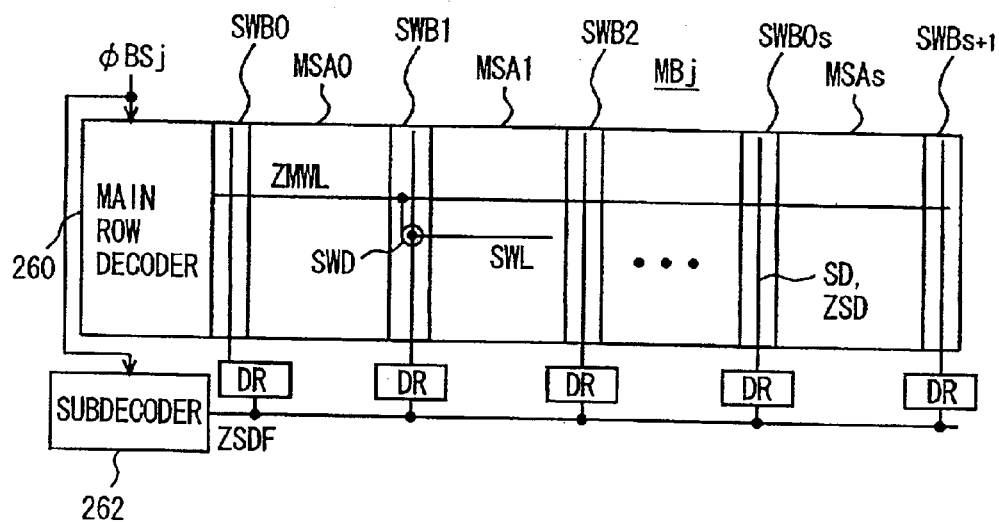
FIG. 63 is a representation schematically showing a configuration of a memory block of a semiconductor memory device according to a twelfth embodiment of the present invention.

FIG. 63 is a diagram showing an example of a configuration of memory block MBj according to a twelfth embodiment of the present invention. In FIG. 63, memory block MBj is divided into a plurality of memory subarray MSA0 to MSAs. Memory cells are arranged in rows and columns in each of memory subarrays MSA0 to MSAs. In each of memory subarrays MSA0 to MSAS, subword lines SWL are disposed corresponding to respective memory cell rows. Memory cells on a row are connected to a corresponding subword line SWL.

A main word line ZMWL transmitting a main word line select signal from a main decoder 160 is provided commonly to memory subarrays MSA0 to MSAs. Main word line ZMWL only transmits a main word line select signal and has no memory cell connected thereto. A main decoder 260 is activated when block specifying signal φBSj is active and decodes a received predecode signal to drive a main word line corresponding to a row specified according to an address to a selected state (at L level).

Subword driver bands SWB0 to SWBs+1 are disposed in regions between memory subarrays MSA0 to MSAs and at the outsides of memory subarrays MSA0 and MSAs. Subword drivers SWD are disposed in each of subword driver bands SWB0 to SWBs+1. In each of memory subarrays MSA0 to MSAs, a prescribed number of subword lines SWL are provided to one main word line ZMWL. A subdecoder 262 is provided for specifying one subword line among subword lines provided corresponding to one main word line.

Subdecoder 262 is disposed corresponding to a sense amplifier band and generates a subdecode fast signal SDF to transmit subdecode fast signal SDF commonly to memory subarrays MSA0 to MSAs of memory subblock MBj.

Drivers DR generating complementary subdecode signals SD and ZSD from subdecode fast signal SDF are disposed corresponding to respective subword driver bands SEB0 to SWBs.

Subword driver SWD drives a corresponding subword line SWL to a selected state (at H level) according to subdecode signals SD and ZSD transmitted from a corresponding driver DR and a signal ZMWL on a corresponding main word line. Subdecoder 262 is activated when memory block specifying signal φBSj is activated and generates subdecode fast signal SDF according to received predecode signal.

Figure 64:
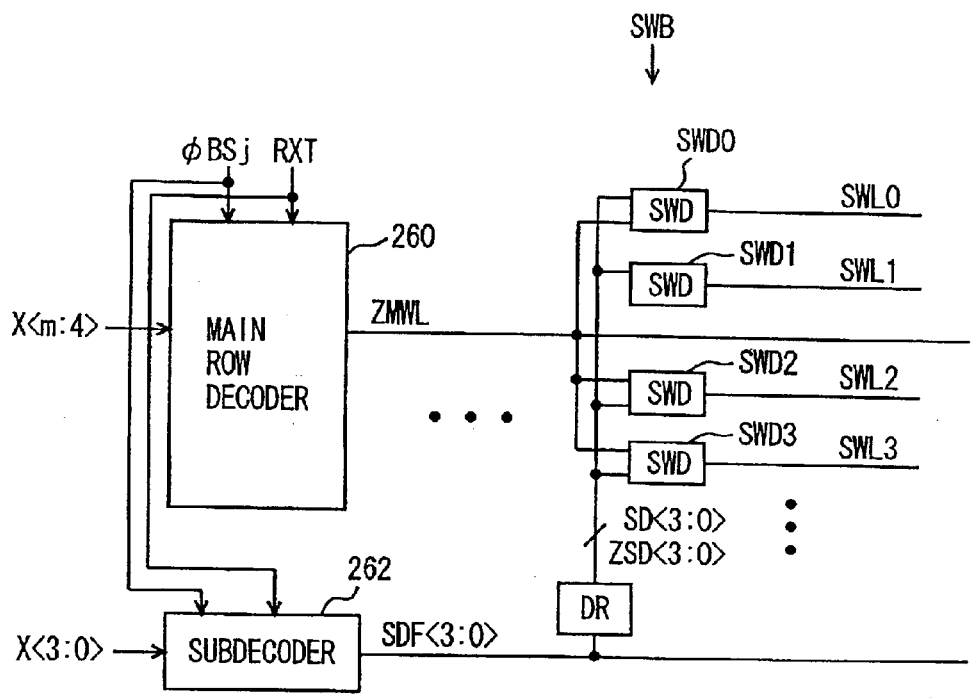
FIG. 64 is a block diagram schematically showing a configuration of a memory sub-array shown in FIG. 63.

FIG. 64 is a diagram showing of an example of a configuration of a subword driver band. In FIG. 64, a main row decoder 260 decodes a predecode signal X<m:4> and transmits a main word line select signal onto main word line ZMWL. A word line drive timing signal RXT is applied to row decoder 260. An activation timing of a selected main word line is determined by word line drive timing signal RXT.

In FIG. 64, 4 subword lines SWL0 to SWL3 are provided to one main word line ZMWL. Subword drivers SWD0 to SWD3 are provided corresponding to respective subword lines SWL0 to SWL3.

Subdecoder 262 level-converts predecode signal X <3:0> generated by decoding a 2 bit word line address to generate 4 bit subdecode fast signal <3:0> in accordance with a word line drive timing signal. Driver DR provided to subword driver band SWD generates complementary subdecode signals SD <3:0> and ZSD <3:0> from subdecode fast signal SDF <3:0>at a high voltage level transmitted from subdecoder 262. Four bits subdecode signals SD <3:0> are applied to respective subword drivers SWD0 to SWD3 and complementary subdecode signal ZSD <3:0> are also applied to respective subword drivers SWD0 to SWD3.

One bit of subdecode fast signal ZSDF <3:0> is in a selected state and one of subword lines SWL0 to SWL3 is specified.

Figure 65:
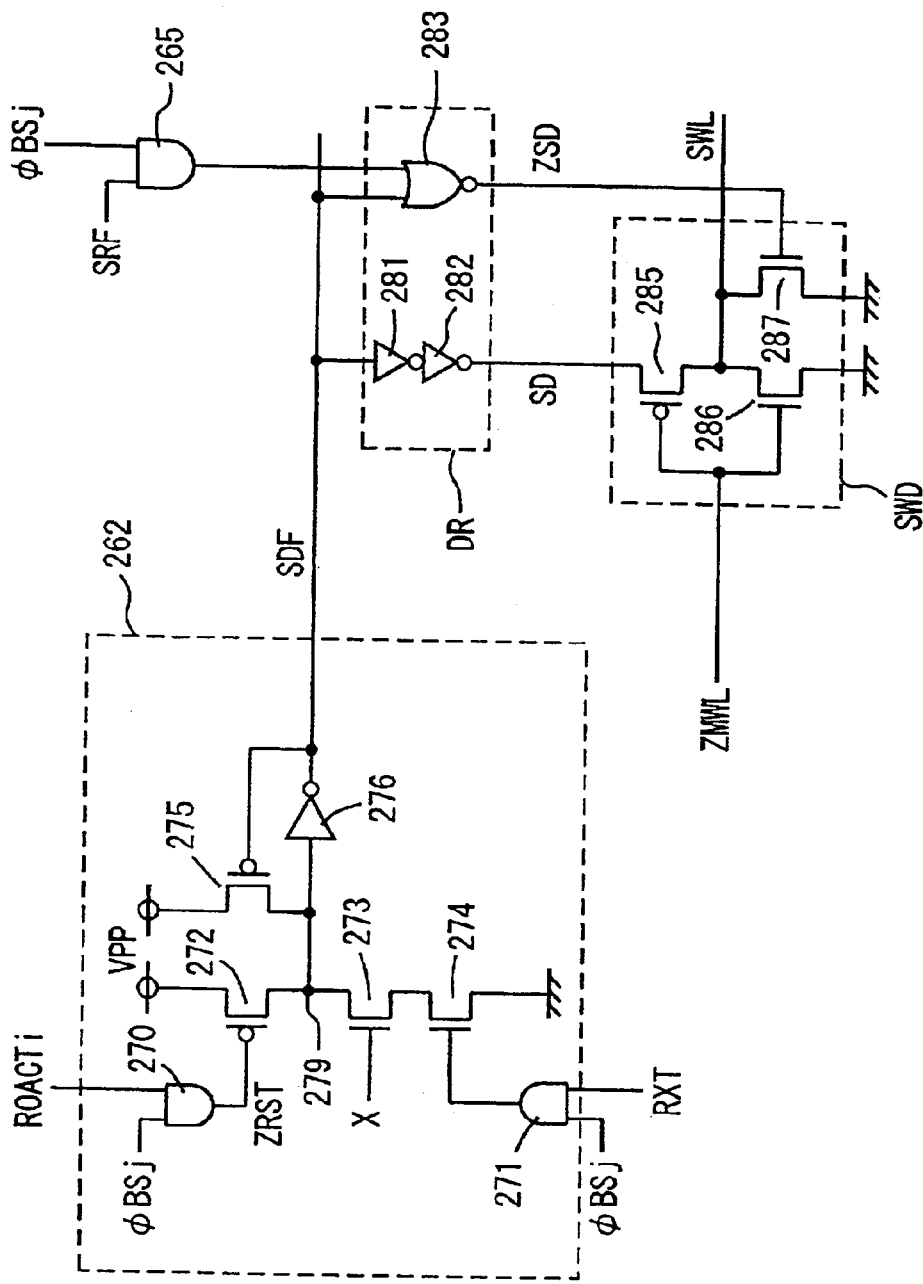
FIG. 65 is a diagram showing an example of configurations of a sub-decoder, a driver and a sub-word driver according to the twelfth embodiment of the present invention.

FIG. 65 is a diagram showing an example of a configuration of sub-decoder 262, driver DR and sub-word driver SWD shown in FIG. 60 combined. In FIG. 65, subdecoder 262 includes: an AND circuit 270 receiving array activation signal ROACTi and memory block specifying signal BSj; an AND circuit 271 receiving memory block specifying signal φBSj and word line drive timing signal RXT; a P channel MOS transistor 272 coupling an internal node 279 to a high power supply voltage node according to output signal ZRST of AND circuit 270: N channel MOS transistors 273 and 274, connected in series between node 279 and a ground node, and receiving predecode signal X (one of X <3:0>) and an output signal of AND circuit 271 at their respective gates; an inverter 276 inverting a signal on internal node 279 to generate subdecode fast signal SDF; and a P channel MOS transistor 275 rendered conductive and holding internal node 279 at a high voltage level VPP while an output signal of inverter 276 is at L level. Inverter 276 receives high voltage VPP as one operation power supply voltage.

In the configuration of subdecoder 262 shown in FIG. 65, memory block specifying signal φBSj is the same as the memory block specifying signal described above with reference to FIGS. 60 to 63 and maintained in a selected state over a plurality of refresh cycles in the self-refresh mode. On the other hand, array activation signal ROACTi is deactivated in each refresh cycle and word line drive timing signal RXT is also activated/deactivated according to array activation signal ROACTi. That is, while array activation signal ROACTi is in the standby state at L level, output signal ZRST of AND circuit 270 is at L level and internal node 279 is precharged to high voltage level VPP.

When a word line select operation starts, output signal ZRST of AND circuit 270 goes to H level according to array activation signal ROACTi and memory block specifying signal φBSj in a selected memory block, and P channel MOS transistor 272 is made non-conductive and ceases a precharge operation on internal node 279. When word line drive timing signal RXT is activated then, internal node 279 is set to precharge voltage level or ground voltage level according to predecode signal X. When internal node 279 is driven to ground voltage level, subdecode fast signal SDF goes to H level of a selected state. On the other hand, when predecode signal X is at L level and internal node 279 maintains its precharged state, output signal of internal node 276 is at L level to cause P channel MOS transistor 275 to enter an on state and maintain internal node 279 at high voltage VPP level. In this state, subdecode fast signal SDF is at L level in a non-selected state.

Driver DR disposed in a subword driver band includes: an inverter 281 inverting subdecode fast signal SDF; an inverter 282 receiving a output signal of inverter 281 to generate subdecode signal SD; and an NOR circuit 283 receiving subdecode fast signal SDF and an output signal of an AND gate receiving memory block specifying signal φBSj and self-refresh mode instructing signal SRF and generating a complementary subdecode signal ZSD.

Inverter 281 and 282 receives high voltage VPP as an operation power supply voltage and NOR circuit 283 receives array power supply voltage as an operation power supply voltage.

Subword driver SWD includes: a P channel MOS transistor 285 rendered conductive, when main word line select signal on main word line ZMWL is at L level and subdecode signal SD is at H, level to transmit subdecode signal SD onto subword line SWL; an N channel MOS transistor 286 rendered conductive, when the signal on main word line ZMWL is at H level, to discharge subword line SWL to ground voltage level; and an N channel MOD transistor 287 rendered conductive, when subdecode signal ZSD is at H level, to discharge subword line SWL to ground voltage level.

In the normal mode, self-refresh mode instructing signal SRF is at L level, an output signal of AND circuit 265 is at L level and NOR circuit 283 operates as an inverter in driver DR. In this state, array activation signal ROACTi is at L level in the standby state and reset signal ZRSD is at L level, and internal node 279 is precharged to high voltage VPP level by MOS transistor 272. Therefore, subdecode fast signal SDF is at L level, and in response, subdecode signal SD is at L level while complementary subdecode signal is at H level. A signal potential on main word line ZMWL is also at H level, and subword line SWL is held at ground voltage level by MOS transistors 286 and 287.

When array activation signal ROACTi rises to H level in the normal mode, block signal φBSj also rises to H level and reset signal ZRST goes to L level, and a precharge operation on internal node 279 performed by MOS transistor 272 is completed.

Then, when predecode signal X is made definite and word line drive timing signal XT is activated, MOS transistor 274 is made conductive and a potential level of internal node 279 attains a signal voltage level determined by predecode signal X. When predecode signal X is at H level, internal node 279 goes to ground voltage level, and in response, subdecode fast signal SDF goes to H level while complementary subdecode signal ZSD goes to L level. Therefore, when main word line ZMWL is in a selected state and at L level, subdecode signal SD at high voltage VPP level is transmitted to subword line SWL. MOS transistors 286 and 287 are in a non-conductive state in this state.

On the other hand, while predecode signal X is at L level, internal node 279 maintains its precharge voltage level and subdecode fast signal SDF maintains its L level. In this situation, internal node 279 is held at high voltage VPP level by MOS transistor 275. Subdecode signal SD is at L level while complementary subdecode signal ZSD is at H level. When main word line ZMWL is selected, MOS transistor 286 enters a non-conductive state, and on the other hand, P channel MOS transistor 285 has the gate voltage and source voltage at the same voltage level and enters a non-conductive state. In this situation, MOS transistor 287 is in a conductive state, to hold subword line SWL at ground voltage level reliably. That is, MOS transistor 287 prevents subword line SWL from entering a floating state when MOS transistors 285 and 286 both enter a non-conductive state.

On the other hand, when signal potential of main word line ZMWL is at H level, MOS transistor 285 is in an off state regardless of a logical level of subdecode signal SD, and subword line SWL is held at ground voltage level by MOS transistor 286.

In the self-refresh mode, self-refresh mode instructing signal SRF goes to H level. Operation of subdecoder 262 in the standby state is the same as that in the normal mode. Array activation signal ROACTi and word line drive timing signal RXT are activated/deactivated in each refresh cycle. On the other hand, when memory block specifying signal φBSj is at H level in the standby state, an output signal of AND circuit 265 is at H level and complementary subdecode signal ZSD outputted by NOR circuit 283 is at L level. Therefore, MOS transistor 287 maintains the off state.

When refresh cycles starts in the self-refresh mode, subdecode fast signal SDF changes according to predecode signal X, and subdecode signal SD is driven to H level or L level. However, complementary subdecode signal ZSD maintains the L level since the output signal of AND circuit 265 is at H level.

When block address latch enable signal RADEBSi is deactivated in the self-refresh mode, memory block specifying signal φBSj is forced temporarily into an inactive state. In response, the output signal of AND circuit 265 goes to L level. Subdecode fast signal SDF is at L level in this situation (because of the standby state) and therefore, complementary subdecode signal ZSD outputted by NOR circuit 283 goes to H level to cause subword line SWL to be driven to ground voltage level.

Therefore, in the self-refresh mode, while subdecode fast signal SDF changes according to predecode signal X in the standby state and refresh cycles, subdecode signal ZSD outputted by NOR circuit 283 driving many subword drivers are fixed at L level over a plurality of refresh cycles. For this reason, a charging/discharging current on a signal line driving subdecode signal ZSD can be reduced. In this case, subdecoder 262 simply drives driver DR and therefore, a load thereon is smaller and a charging/discharging current is smaller, compared with that in a case in which a subword drivers are actually driven. Hence, by holding complementary subdecode signal ZSD at L level over a plurality of refresh cycles, a current consumption can be reduced in the self-refresh mode.

MOS transistor 287 is used only for preventing subword line SWL from entering a floating state when MOS transistors 285 and 287 are both enter a non-conductive state. Consequently, even when subword line SWL is held in a non-selected state over a plurality of refresh cycles, a rise in voltage level thereof would be small (a refresh interval is sufficiently long, and a time width of refresh is shorter, compared with that in an normal access), which causes no problem. Refreshing of stored data on memory cells can be performed correctly.

In the above configuration, subdecoder 262 generates subdecode fast signal SDF and transmits subdecode fast signal SDF to the drivers disposed in each of subword driver bands through a sense amplifier band. However, in a configuration in which a subdecoder generates complementary subdecode fast signals SDF and ZSDF, and transmits these generated signals through a sense amplifier band, a following modification may be employed. A NAND circuit is provided to the subdecoder in place of AND circuit 265 shown in FIG. 65, an AND circuit receives complementary subdecode signal ZSDF and an output signal of the NAND circuit, and an output signal of the AND circuit is transmitted to each subword driver band through a sense amplifier band.

The configuration of a subword decoder is provided by way of example and another configuration can be employed. A requirement is only such that a complementary subdecode signal is held in a reset state over a plurality of refresh cycles.

As described above, according to the twelfth embodiment of the present invention, a configuration is employed in which complementary subdecode signal ZSD is reset over a plurality of refresh cycles in the self-refresh mode, and current consumption in the self-refresh mode can be reduced.

[Thirteenth Embodiment]

Figure 66:
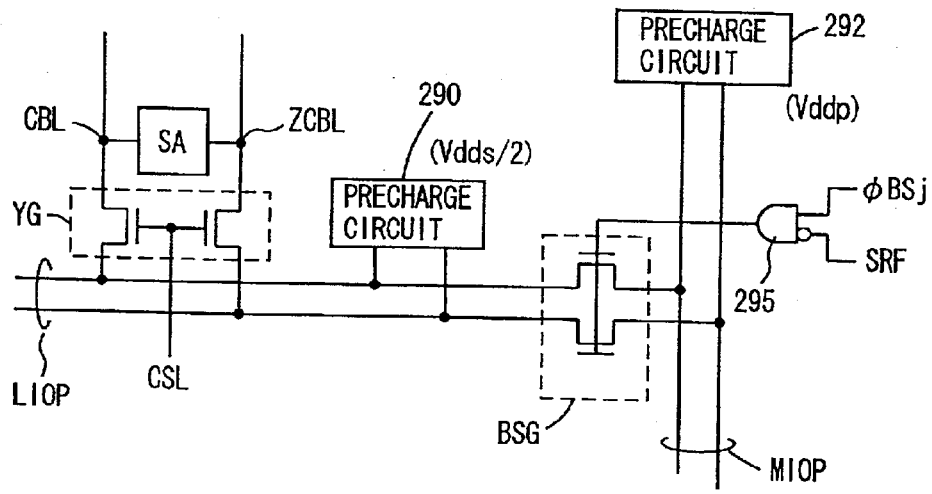
FIG. 66 is a diagram showing a configuration of a main part of a semiconductor memory device according to a thirteenth embodiment of the present invention.

FIG. 66 is a diagram schematically showing a configuration of a main portion of a semiconductor memory device according to a thirteenth embodiment of the present invention. In FIG. 66, a local IO line pair LIOP is provided corresponding to a memory block or a memory subarray. Local IO line pair LIOP is coupled to a main IO line pair MIOP through a block select gate BSG. Main IO line pair MIOP may be provided commonly to memory subarrays disposed in alignment in the column direction or to memory blocks in one bank. That is, main IO line pair MIOP may be arranged extending on a subword driver band in the column direction, or alternatively, provided, commonly to memory blocks, extending in the column direction outside the memory array region. Arrangement of main IO line pairs MIOP is different according to whether local OP line pairs LIOP are provided on a memory subarray basis or on a memory block basis.

Local IO pair LIOP is coupled to a sense amplifier SA of a corresponding memory block through column select gate YG. Column select gate YG is rendered conductive according to column select signal CSL and couples common bit lines CBL and ZCBL of corresponding sense amplifier SA to local IO line pair LIOP when made conductive. A local column select signal CSL extends in a different direction according to a configuration of a column decoder performing a column selection. A column select signal SCL may be provided extending commonly to a plurality of memory block across a memory array, or alternatively, a local column select line may be provided along the row direction in each sense amplifier band while a main column select line extends in the column direction outside a memory array.

A precharge circuit 290 is provided to local IO line pair LIOP. Precharge circuit 290, when activated, precharges each local IO line of local IO line pair LIOP to a voltage Vdds/2 level equal to half an array power supply voltage Vdds. Precharge voltage Vdds/2 of precharge circuit 290 is at the same voltage level as bit line precharge voltage Vb1. A precharge circuit 292 is also provided to main IO line pair MIOP. Precharge circuit 292, when activate, precharges main IO lines of main IO line pair MIOP to a voltage level of a peripheral power supply voltage Vddp.

Local IO line pair LIOP is precharged to a voltage level of an intermediate voltage Vdds/2 for the following reason. A precharge voltage on common bit lines CBL and ZCBL and a precharge voltage on each local IO line of local IO line pair are made equal in voltage level to each other. Consequently, even when a column of a non-selected memory block (or a memory subarray) is selected and a corresponding bit line pair is coupled to a corresponding local IO line pair, variation in voltage level on bit lines BL and ZBL (CBL and ZCBL) can be suppressed.

On the other hand, main 10 line pair MIOP is required to transmit a signal change to a preamplifier at an end of main IO line pair MIOP at high speed and a main amplifier uses peripheral power supply voltage Vddp as an operating power supply voltage. A precharge voltage on each main IO line of main IO line pair MIOP is set to peripheral power supply voltage Vddp according to the operating power supply voltage of the preamplifier.

A gate circuit 295 receiving memory block specifying signal φBSj and self-refresh mode instructing signal SRF is provided to block select gate BSG. Gate circuit 295 selectively set block select gate BSG in a conductive state according to block specifying signal φBSj when self-refresh mode instructing signal SRF is at L level. In the self-refresh mode, gate circuit 295 transmits a signal at L level all the times to set block select gate BSG in a non-conductive state normally. Accordingly, local IO line pair LIOP and main IO line pair are prevented from being connected to each other to cause a current to flow between precharge circuits 290 and 292 in the self-refresh mode.

Precharge circuits 290 and 292 are generally deactivated in column access, and in the self-refresh mode of merely performing a row selection, precharge circuits 290 and 292 maintain an active state. In the self-refresh mode, block select gate BSG is set in a non-selected state all the times to isolate local IO line pair LIOP from main IO line pair MIOP, thereby enabling a current from flowing between precharge circuits 290 and 292 reliably to reduce current consumption.

In the auto-refresh mode as well, the block select gate may be set in a non-conductive state. That is, in refresh activation, gate circuit 295 outputs a signal at L level to set block select gate BSG in a non-conductive state.

Furthermore, a column select operation activation signal may be applied to gate circuit 295 instead of self-refresh instructing signal SRF. In column access operation, that is, when one of a write command instructing data write and a read command instructing data read is applied, the column select operation activation signal is activated. Therefore, in a refresh mode, no column select operation is performed, and the column select signal maintains the non-selected state to enable the block select gate to maintain the non-conductive state. Since when local IO line pair has to be connected to main IO line pair is in a case of column access, no adverse influence is exerted on an normal operation.

As described above, according to the thirteenth embodiment of the present invention, in the self-refresh mode, local IO line pair and main IO line pair are isolated from each other, and therefore, a current can be prevented from flowing from main IO line pair to local IO line pair to reduce current consumption.

[Fourteenth Embodiment]

Figure 67:
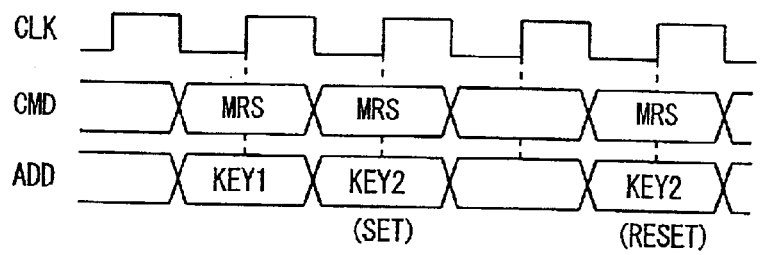
FIG. 67 is a timing chart representing a mode register setting operation in a fourteenth embodiment of the present invention.
Figure 68:
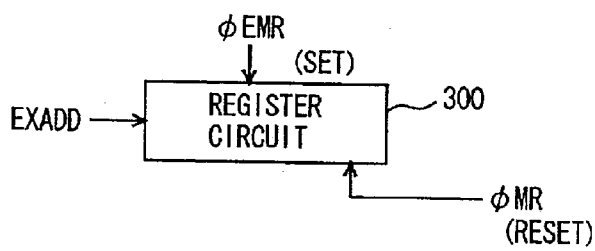
FIG. 68 is a diagram schematically showing a configuration of a register circuit for the address sequence shown in FIG. 67.

FIG. 67 is a timing chart schematically showing a sequence of application of a mode resister set command according to a fourteenth embodiment of the present invention. In FIG. 67, for the purpose of data setting to a mode register, there are used mode register set command MRS and extended mode register set command EMRS. A key KEY indicating contents of an operation is set by a specific bit of address ADD to set operation manner of a semiconductor memory device, such as a self-refresh cycle and other conditions.

Where operation modes or contents of operation, different from each other, are set with the extended mode register set command and the mode register set command, when extended mode register set command EMRS is applied, set mode instructing signal φEMR is activated and responsively, a register circuit 300 as shown in FIG. 68 takes in a prescribed external address signal EXADD for storage as an address key KEY2. The details of operation are set according to key KEY2. Then, by providing mode register set command MRS, register circuit 300 is reset and returns to the initial state regardless of the current contents of key KEY2 at that time, for example. Where contents of register circuit 300 is updated in this operation sequence, extended mode register set command ERMS is again applied and if a different key KEY 3 is applied as an address key at that time, the details of operation can be updated.

In a mode register setting operation shown in FIG. 67, the contents KEY2 set by extended mode register set command EMRS is reset by mode register command MRS. In this case, address key KEY is indicated as being KEY2. However, contents of address key KEY may be any. That is, when a mode register to be used by mode register set command MRS and extended mode register set command is determined, a mode register set command is simply used as a reset instruction in the circuit configuration shown in FIG. 68.

Alternatively, a configuration may be employed in which address key KEY of mode register set command MRS is set to resetting data and data set by extended mode register set command is reset according to the resetting data. When register circuits specified by mode register set command MRS and extended mode register set command EMRS, respectively, are different from each other, no rewriting of data set in the register circuit can be performed. In order to enable rewriting in this case, it is required to apply the extended register set command again to set the corresponding register circuit of interest into a state capable of taking in an external signal.

[Modification]

Figure 69:
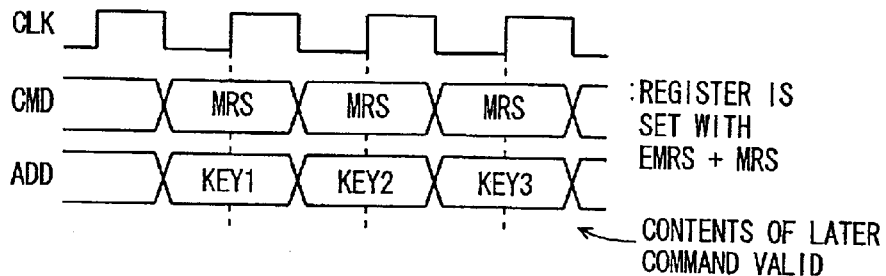
FIG. 69 is a timing chart representing another example of the mode register setting operation of the fourteenth embodiment of the present invention.

FIG. 69 is a timing chart showing a sequence of a mode register set operation according to the fourteenth embodiment of the present invention. In FIG. 69, when mode register set command MRS and extended mode register set command EMRS are applied, contents of a command applied later is dealt with as being valid and details of operation thereof are set. Therefore, in FIG. 69, keys KEY1, KEY2 and KEY3 are dealt with as being valid and details of operation specified by KEY3 finally become a valid state.

In the operation sequence shown in FIG. 69, when mode register set command MRS and extended mode register set command EMRS specify the same contents of operation with each other (for example, when a self-refresh cycle is set to that for a memory block refresh region), details of operation of a command applied later, which is set as being valid, are overwritten by the contents of the later, valid command. This is implemented readily by the configuration in which whenever mode register set command MRS and extended mode register set command EMRS are applied to corresponding register circuit 300, the register circuit is placed in a set state to take in an external address signal bit or data.

Here, mode register set command MRS and extended mode register set command EMRS are different from each other in logic level of specific address signal bits (for example, AD9 and AD10), in addition to control signal used as a command CMD. Details of operation are set according to address key KEY. However, the details of operation may be set, for example using data bits.

The configuration for achieving the above can be readily achieved with the following implementation. When extended mode register set command EMRS and mode register set command MRS specify the same details of operation with each other, for example, a signal obtained by performing an OR operation on signals instructing extended mode register set command EMRS and mode register set command MRS is applied to register circuit 300 to place register circuit 300 into a set state.

As described above, according the fourteenth embodiment of the present invention, when details of operation set by the extended mode register set command is reset by the mode register set command. When the commands specifying the same details of operation are used, a command applied later is dealt with as being valid. Thus, necessary details of operation can be set readily. Especially even if extended mode register set command EMRS and mode register set command MRS are used and when the commands can specify the same details of operation, any of the commands can be used. Therefore, a load on control in setting details of operation is reduced. The same command as a mode register command specifying different contents of operation can be used.

When details of operation that cannot be specified by the mode register set command is set by an extended mode register set command, the mode register set command can reset the mode register, and setting of wrong details of operation can be prevented from occurring. For example, a default value can be used for the reset value, thereby enabling prevention of a malfunction.

[Other Embodiments]

In the above description, a clock synchronous semiconductor memory device is discussed. However, operation in the self-refresh mode is not limited to the clock synchronous semiconductor memory device, but the present invention can be applied to any of semiconductor memory devices, as far as the memory device has a multi-bank configuration, and allows the block division activation in each of banks.

As described above, according to the present invention, in the low power consumption mode, details of operation are set in a mode register and a current consuming condition in the self-refresh mode can be set to a value corresponding to a use condition, enabling implementation of a semiconductor memory device operating with a low current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory array having a plurality of memory cells;
    refresh circuitry for refreshing storage data of a memory cell in said memory array;
    a register circuit for storing data setting at least one of a refresh period and a refresh region of said memory array, said register circuit storing externally applied refresh specifying data in response to an externally applied register set instruction signal; and
    refresh execution control circuitry for generating, in refresh execution, a refresh address specifying a memory cell to be refreshed in said memory array, and supplying said refresh address to and activating said refresh circuitry, according to data stored in said register circuit, wherein
    said refresh specifying data comprises region specifying data specifying a refresh target region of said memory array to be refreshed, and
    said refresh execution control circuitry includes:
        a counter for generating a counter address in a refresh operation mode of performing the refresh; and
        a circuit for modifying the counter address in accordance with the region specifying data to change the counter address into an address in said refresh target region to generate said refresh address.

2. The semiconductor memory device according to claim 1, wherein said refresh execution control circuitry comprises a refresh period adjustment circuit for setting said refresh period according to said region specifying data.

3. The semiconductor memory device according to claim 2, wherein said refresh period adjustment circuit comprises:
    an oscillation circuit having an operating frequency determined according to said region specifying data; and
    a circuit for counting an oscillation signal outputted from said oscillation circuit to generate a refresh request requesting refresh of data in said memory array.

4. The semiconductor memory device according to claim 1, wherein
    said register circuit stores the data indicating the refresh region, and
    said refresh execution control circuitry comprises:
        a refresh period program circuit storing data indicating a period at which refresh of stored data in a memory cell of said memory array by means of a fuse programming, said refresh period program circuit being activated in a self-refresh mode, for outputting the programmed refresh period data; and
        a refresh request generation circuit for outputting a refresh request requesting execution of refresh according to the stored, programmed refresh period data.

5. The semiconductor memory device according to claim 1, wherein the refresh specifying data comprises data indicating a temperature compensated, refresh period at which refresh is performed.

6. The semiconductor memory device according to claim 1, wherein said memory array comprises a plurality of memory blocks each having a plurality of memory cells, and said refresh execution control circuitry comprises:
a refresh address generation circuit for generating the refresh address specifying a memory cell in said memory array; and
a refresh block address holding circuit for setting a refresh block address, specifying a memory block to be refreshed in said a plurality of memory blocks, included in the refresh address generated by said refresh address generation circuit in a state of designating a same memory block over a plurality of refresh cycles in a self-refresh mode.

7. The semiconductor memory device according to claim 1, wherein said memory array is divided into a plurality of memory subblocks each having a plurality of memory cells arranged in rows and columns, the memory subblocks aligned in a row direction constituting a row block, and said semiconductor memory device further comprises:
a plurality of subword lines, provided corresponding to the respective memory cell rows of each of said memory subblocks, each having memory cells on a corresponding row connected, and said refresh execution control circuitry includes:
a count circuit for performing a count operation to determine the number of times of refresh in a self-refresh mode;
a circuit for generating subdecode signals specifying a subword line in the subword lines according to said refresh address; and
a subword line reset circuit for activating a subdecode signal specifying a non-selected subword line in said subdecode signals according to a count outputted from said count circuit to drive a corresponding non-selected subword line to a reset state.

8. The semiconductor memory device according to claim 7, further comprising:
sense amplifier circuits, each disposed between adjacent row blocks of said row blocks, each for sensing and amplifying data in memory cells of a corresponding row block when activated; and
a plurality of bit line isolation circuit, disposed between the respective row blocks and corresponding sense amplifier circuits, each for electrically connecting a corresponding row block to a corresponding sense amplifier circuit when made conductive, and said refresh execution control circuitry further includes,
a refresh bit line resetting circuit for driving the bit line isolation circuits to a reset state according to the count outputted from said count circuit to turn a bit line isolation circuit in a non-conductive state into a conductive state.

9. The semiconductor memory device according to claim 8, wherein said memory array is divided into a plurality of banks activated independently of each other, and said refresh bit line resetting circuit and said subword line resetting circuit are provided corresponding to each respective bank.

10. The semiconductor memory device according to claim 1, wherein said refresh execution control circuitry comprises:

a refresh address generation circuit for generating the refresh address specifying a memory cell to be refreshed in said memory array; and
a refresh region fixing circuit for fixing in logic level a prescribed address bit of said refresh address in a self-refresh mode.

11. The semiconductor memory device according to claim 1, wherein said memory array is divided into a plurality of memory subblocks each having a plurality of memory cells arranged in rows and columns, the memory subblocks aligned in a column direction constitute a column block, and the memory subblocks aligned in a row direction constitute a row block, and said semiconductor memory device further comprises:
a plurality of local data lines, provided corresponding to the respective memory subblocks, each electrically coupled to a selected column Of a corresponding column block;
a plurality of main data lines, provided corresponding to the column blocks, each electrically coupled to a selected memory subblock of a corresponding column block; and
a block select circuit for coupling, in accordance with a row block specifying signal, a local data line provided corresponding to a memory subblock of a corresponding row block to a corresponding main data line in an normal operation mode, and for isolating, in a self-refresh mode, said local data line from the corresponding main data line.

12. The semiconductor memory device according to claim 1, wherein said register circuit storing data setting a 4 K refresh cycle scheme set as a default data value to an 8 K refresh cycle scheme in application of a mode register set command.

13. The semiconductor memory device according to claim 1, wherein the stored data in said register circuit is reset according to external data in response to application of a second mode register set command.

14. The semiconductor memory device according to claim 1, wherein said register circuit makes the stored data set therein later valid.

15. A semiconductor memory device comprising:
a plurality of banks, each having a plurality of memory cells arranged in rows and columns, driven to a selected state independently of each other;
refresh address generation circuitry for generating a refresh address for refreshing memory cells of said plurality of banks in a refresh operation, said refresh address generation circuitry including a circuit for generating a refresh bank address specifying a bank of said plurality of banks, said refresh bank address specifying a part of said plurality of banks in a low power consumption mode, and specifying all the banks in a mode different from said low power consumption mode; and
refresh execution control circuitry for executing refresh on a memory cell of a bank specified by the refresh address from said refresh address generation circuitry.

16. The semiconductor memory device according to claim 15, wherein said a plurality of banks are arranged in alignment along a first direction and a second direction perpendicular to said first direction and said refresh address simultaneously selects banks adjacent in a direction different from the first and second directions in said low power consumption mode.

17. The semiconductor memory device according to claim 15, wherein each bank includes a plurality of memory blocks each having the memory cells arranged in rows and columns, and said refresh execution control circuitry comprises a circuit, provided corresponding at least to each group of banks selected simultaneously, for driving a selected memory block to a non-selected state in a corresponding bank according to a count of an address counter, included in said refresh address generation circuitry, generating said refresh address.

18. The semiconductor memory device according to claim 15, wherein said refresh execution control circuitry comprises:

a control circuit for generating a refresh control signal for activating an operation of refreshing memory cell data in the refresh mode; and a refresh circuit for refreshing memory cell data of a selected bank in response to said refresh control signal, said refresh control signal being held in an inactive state in a normal operation mode other than said refresh mode.

19. The semiconductor memory device according to claim 15, further comprising a plurality of internal voltage generation circuits, provided corresponding to the respective banks, each generating an internal power supply voltage from an external power supply voltage onto a corresponding internal power supply line when activated, the internal power supply line provided for each respective bank being interconnected together to be provided commonly to said plurality of banks, wherein said refresh execution control circuitry activates all the internal power supply voltage generation circuits in the refresh mode of operation.

* * * * *